(12) United States Patent
Shimizu et al.

(10) Patent No.: US 7,405,803 B2
(45) Date of Patent: Jul. 29, 2008

(54) IMAGE FORMING STATE ADJUSTING SYSTEM, EXPOSURE METHOD AND EXPOSURE APPARATUS, AND PROGRAM AND INFORMATION STORAGE MEDIUM

(75) Inventors: Yasuo Shimizu, Yokohama (JP); Shigeru Hirukawa, Kita-ku (JP); Kousuke Suzuki, Saitama (JP); Tomoyuki Matsuyama, Kita-Katsushika-gun (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/736,177

(22) Filed: Apr. 17, 2007

(65) Prior Publication Data
US 2007/0188727 A1 Aug. 16, 2007

Related U.S. Application Data

(60) Division of application No. 10/901,209, filed on Jul. 29, 2004, now Pat. No. 7,230,682, which is a continuation of application No. PCT/JP03/00833, filed on Jan. 29, 2003.

(30) Foreign Application Priority Data

Jan. 29, 2002 (JP) ............................. 2002-020712
May 31, 2002 (JP) ............................. 2002-158954

(51) Int. Cl.
*G03B 27/32* (2006.01)
*G03B 27/68* (2006.01)

(52) U.S. Cl. .......................................... 355/52; 355/77
(58) Field of Classification Search .................. 355/52, 355/53, 67, 77
See application file for complete search history.

(56) References Cited

U.S. PATENT DOCUMENTS

| 4,786,166 A | 11/1988 | Kroko |
| 4,920,505 A | 4/1990 | Suzuki |
| 5,321,493 A | 6/1994 | Kamon |

(Continued)

FOREIGN PATENT DOCUMENTS

DE 198 20 785 10/1999

(Continued)

OTHER PUBLICATIONS

Patent Abstracts of Japan, JP 2001-289735, Oct. 19, 2001.

(Continued)

*Primary Examiner*—Rodney E Fuller
(74) *Attorney, Agent, or Firm*—Oblon, Spivak, McClelland, Maier & Neustadt, P.C.

(57) ABSTRACT

A second communications server obtains adjustment information of an adjustment unit in an exposure apparatus and information related to image forming quality (such as wavefront aberration) of a projection optical system under an exposure condition that serves as a reference, via a first communications server, and then calculates an optimal adjustment amount of the adjustment unit under a target exposure condition based on the information. In addition, the second communications server obtains adjustment information of the adjustment and actual measurement data of image forming quality of the projection optical system via the first communications server, and then calculates the optimal adjustment amount of the adjustment unit under the target exposure condition based on the information. And, the second communications server controls the adjustment unit in the exposure apparatus via the first communications server, based on the calculations results.

28 Claims, 22 Drawing Sheets

U.S. PATENT DOCUMENTS

| | | | |
|---|---|---|---|
| 5,420,436 | A | 5/1995 | Seya et al. |
| 5,424,552 | A | 6/1995 | Tsuji et al. |
| 5,754,299 | A | 5/1998 | Sugaya et al. |
| 5,807,647 | A | 9/1998 | Hashimoto |
| 5,898,501 | A | 4/1999 | Suzuki et al. |
| 5,978,085 | A | 11/1999 | Smith et al. |
| 6,078,554 | A | 6/2000 | Ootaki et al. |
| 6,100,978 | A | 8/2000 | Naulleau et al. |
| 6,118,535 | A | 9/2000 | Goldberg et al. |
| 6,245,470 | B1 | 6/2001 | Kamon |
| 6,248,486 | B1 | 6/2001 | Dirksen et al. |
| 6,268,903 | B1 | 7/2001 | Chiba et al. |
| 6,329,112 | B1 | 12/2001 | Fukuda et al. |
| 6,459,480 | B1 | 10/2002 | Kye |
| 6,570,143 | B1 | 5/2003 | Neil et al. |
| 6,646,729 | B2 | 11/2003 | Van Der Laan et al. |
| 6,961,115 | B2 | 11/2005 | Hamatani et al. |
| 7,088,426 | B2 | 8/2006 | Hirukawa et al. |
| 7,102,731 | B2 | 9/2006 | Hirukawa et al. |
| 2002/0001071 | A1 | 1/2002 | Nomura et al. |
| 2002/0008869 | A1 | 1/2002 | Van Der Laan et al. |
| 2002/0036758 | A1 | 3/2002 | Maria de Mol et al. |
| 2002/0191165 | A1 | 12/2002 | Baselmans et al. |
| 2004/0059444 | A1 | 3/2004 | Tsukakoshi |

FOREIGN PATENT DOCUMENTS

| | | |
|---|---|---|
| EP | 0 267 721 | 5/1988 |
| EP | 0 338 200 | 10/1989 |
| EP | 1 079 223 | 2/2001 |
| EP | 1 128 217 | 8/2001 |
| EP | 1 160 626 | 12/2001 |
| EP | 1 355 140 | 10/2003 |
| EP | 1 359 608 | 11/2003 |
| JP | 5-296879 | 11/1993 |
| JP | 6-235619 | 8/1994 |
| JP | 10-154657 | 6/1998 |
| JP | 11-118613 | 4/1999 |
| JP | 11-176744 | 7/1999 |
| JP | 11-233424 | 8/1999 |
| JP | 2000-47103 | 2/2000 |
| JP | 2000-121491 | 4/2000 |
| JP | 2000-146757 | 5/2000 |
| JP | 2000-266640 | 9/2000 |
| JP | 2000-331923 | 11/2000 |
| JP | 2001-230193 | 8/2001 |
| JP | 2002-324752 | 11/2002 |
| WO | WO99/60361 | 11/1999 |
| WO | WO 00/31592 | 6/2000 |
| WO | WO 00/55890 | 9/2000 |
| WO | WO00/55890 | 9/2000 |
| WO | WO 02/50506 | 6/2002 |

OTHER PUBLICATIONS

Donis G. Flagello, et al., "The influence of lens aberrations in lithography", Microlithography world, 1998, pp. 11-20.

Kenneth A. Goldberg, et al., "High-Accuracy Interferometry of Extreme Ultraviolet Lithographic Optical Systems", J. Vac. Sci. Technol., vol. 16, No. 6, XP-000931349, Nov./Dec. 1998, pp. 3435-3439.

Donis G. Flagello, et al., "Towards a Comprehensive Control of Full-Field Image Quality in Optical Photolithography", SPIE Microlithography Seminar, Mar. 1997, pp. 1-14.

Marco Moers, et al. "Application of the Aberration Ring Test (Artemis) to Determine Lens Quality and Predict Its Lithographic Performance", Proceedings of SPIE vol. 4346, Feb. 27-Mar. 2, 2001, pp. 1379-1387, XP008025416.

U.S. Appl. No. 11/736,134, filed Apr. 17, 2007, Shimizu, et al.

IMAGE FORMING STATE ADJUSTING SYSTEM, EXPOSURE METHOD AND EXPOSURE APPARATUS, AND PROGRAM AND INFORMATION STORAGE MEDIUM

CROSS-REFERENCE TO RELATED APPLICATIONS

This application is a divisional of U.S. application Ser. No. 10/901,209 filed Jul. 29, 2004 now U.S. Pat. No. 7,230,682, which is a continuation of International Application PCT/JP2003/000833 with an international filing date of Jan. 29, 2003, which was not published in English. The entire contents of those applications are hereby incorporated herein by reference.

BACKGROUND OF THE INVENTION

1. Field of the Invention

The present invention relates to image forming state adjusting systems, exposure methods and exposure apparatus, and programs and information storage mediums, and more particularly, to an image forming state adjusting system that optimizes the image forming state of a pattern by a projection optical system used in an exposure apparatus, an exposure method and an exposure apparatus that can actually achieve the optimization of the image forming state, and a program that makes a computer execute optimizing the image forming state of the pattern in the exposure apparatus and an information storage medium in which the program is stored.

2. Description of the Related Art

Conventionally, when manufacturing devices such as semiconductors, liquid crystal displays, or the like in a photolithographic process, projection exposure apparatus such as a reduction projection exposure apparatus based on a step-and-repeat method (a so-called stepper) and a scanning projection exposure apparatus based on a step-and-scan method (a so-called scanning stepper) have been used. Such exposure apparatus transfer a pattern of a photomask or a reticle (hereinafter generally referred to as a 'reticle') onto a substrate such as a wafer or a glass plate on which a photosensitive agent such as a photoresist is coated, via a projection optical system.

When manufacturing devices such as a semiconductor, because different circuit patterns have to be formed overlaid on the substrate in multiple layers, it is important to accurately overlay the pattern formed on the reticle and the pattern already formed on each shot area on the wafer. In order to perform such overlay with good accuracy, it is absolutely necessary for the image forming quality of the projection optical system to be adjusted to a desired state (for example, a magnification error of a transferred image of a reticle pattern to a shot area (pattern) on a substrate is corrected). Even in the case of transferring a reticle pattern of the first layer to each shot area on the substrate, the image forming quality of the projection optical system is preferably adjusted so that the reticle pattern of the second layer and onward is transferred with good precision on each shot area.

As a premise for adjusting the image forming quality (one of the optical properties) of the projection optical system, the image forming quality has to be accurately measured (or detected). As a measuring method of the image forming quality, a method in which the image forming quality, or to be more specific, Seidel's five aberrations (distortion, spherical aberration, astigmatism, field curvature and coma) is calculated (hereinafter referred to as 'exposing method'), is mainly used. In this exposing method, exposure is performed using a measurement reticle on which a predetermined measurement pattern is formed, then the transferred image obtained by developing the substrate where the image of the measurement pattern is projected and formed, such as the resist image, is measured, and then the image forming quality is calculated based on the measurement results. Besides such a method, a method in which the above-mentioned five aberrations are calculated without actually performing exposure (hereinafter referred to as an 'aerial image measurement method') is also used. In this method, a measurement reticle is illuminated with an illumination light, and aerial images (projected images) of measurement patterns formed by the projection optical system are measured, and then the above five aberrations calculated based on the measurement results.

However, with the above exposing method or aerial image measurement method, in order to obtain all five aberrations, the measurement has to be repeated separately, using the appropriate pattern for each measurement. Furthermore, depending on the type and amount of the aberration to be measured, the order in which the measurement is performed has to be considered, in order to accurately adjust the projection optical system. For example, when coma is large, the image of the pattern is not resolved, therefore, when aberration such as distortion, spherical aberration, astigmatism are measured in this state, accurate data cannot be obtained. Accordingly, distortion or the like has to be measured, after the coma has been reduced to a certain level.

In addition, due to higher integration of semiconductor devices or the like in recent years, circuit patterns are becoming finer, which makes correction of only the Seidel's five aberrations insufficient, and requirements are pressing for an overall adjustment, including the higher order of aberrations, in the image forming quality of the projection optical system. In order to perform such overall adjustment in the image forming quality, a light-ray-trace computation has to be performed using data (such as curvature, refractive index, and thickness) of individual lens elements composing the projection optical system, to identify the lens element that requires adjustment and to calculate its adjustment amount.

However, because data of individual lens elements are confidential for the exposure apparatus maker, it is usually difficult for a service technician repairing or adjusting the exposure apparatus or a user to obtain such data. In addition, since the light-ray-trace computation requires an enormous amount of time, it is not realistic for the service technician to perform the computation on site.

In addition, to adjust the image forming quality or the image forming state of the projection optical system, for example, an image forming quality adjustment mechanism or the like that adjusts the position and the inclination of the optical elements such as lens elements making up the projection optical system is used. However, the image forming quality changes depending on exposure conditions such as illumination conditions (such as illumination σ), N.A. (numerical aperture) of the projection optical system, and the pattern to be used. Accordingly, the optimal adjustment position of each optical element by the image forming quality adjustment mechanism under a certain exposure condition may not necessarily be the optimal adjustment position under other exposure conditions.

Against such background, a new system was expected that could smoothly calculate adjustment position of each optical element by the image forming quality adjustment mechanism that brings out the optimal image forming quality under any exposure condition, such as the combination of N.A. of the projection optical system, illumination σ, and the subject pattern.

SUMMARY OF THE INVENTION

The present invention has been made under such circumstances, and has as its first object to provide an image forming state optimizing system that can smoothly optimize the forming state of a projected image of a pattern on an object under any targeted exposure conditions.

The second object of the present invention is to provide an exposure method and an exposure apparatus that can optimize the forming state of a projected image of a pattern on an object and transfer the pattern with good accuracy onto the object under any targeted exposure conditions.

In addition, the third object of the present invention is to provide a program that makes a computer structuring a part of a control system of the exposure apparatus execute a process of smoothly optimizing the forming state of a projected image of a pattern on an object, and to provide an information storage unit.

According to a first aspect of the present invention, there is provided a first image forming state adjusting system used in an exposure apparatus, which forms a projected image of a predetermined pattern on an object using a projection optical system, the system being a system that optimizes a forming state of the projected image on the object, comprising: an adjustment unit that adjusts a forming state of the projected image on the object; and a computer that connects to the exposure apparatus via a communication channel and calculates an optimal adjustment amount of the adjustment unit under a target exposure condition, using adjustment information of the adjustment unit and information related to image forming quality of the projection optical system under a predetermined exposure condition.

In this description, 'exposure condition' refers to conditions related to exposure that are decided by combining illumination conditions (such as illumination σ (coherence factor), annular ratio, or dose distribution on a pupil plane of an illumination optical system), numerical aperture (N.A.) of the projection optical system, and the type of pattern (such as, whether the pattern is an extracted pattern or a residual pattern, a dense pattern or an isolated pattern; in the case of a line-and-space pattern, its pitch, line width, and duty ratio, and in the case of an isolated pattern, its line width. Or, in the case of contact holes, its longitudinal length, its lateral length, and the length between the hole patterns (such as its pitch), or whether the pattern is a phase shift pattern or not, or whether the projection optical system has a pupil filter or not.)

According to this system, the computer calculates the optimal adjustment amount of the adjustment unit under the target exposure condition using adjustment information of the adjustment unit and information related to image forming quality of the projection optical system under a predetermined exposure condition. That is, because the relation between the adjustment information of the adjustment unit and the information related to image forming quality of the projection optical system (aberration) under a predetermined exposure condition is well known, the optimal adjustment amount of the image forming quality of the projection optical system under the predetermined exposure condition can be easily found. Accordingly, the optimal adjustment amount under the target exposure condition that is calculated using such adjustment information of the adjustment unit and information related to image forming quality of the projection optical system under the predetermined exposure condition is highly precise. Therefore, by adjusting the adjustment unit based on the adjustment amount, the forming state of the projected image of the pattern on the object under any target exposure condition can be smoothly optimized.

In this case, for example, the predetermined exposure condition can be at least one reference exposure condition. In such a case, as the predetermined exposure condition, at least one reference exposure condition can be decided whose adjustment amount for optimally adjusting the image forming quality of the projection optical system is obtained in advance. And, when the optimal adjustment amount under the target exposure condition is calculated using the adjustment information of the adjustment unit and information related to image forming quality of the projection optical system under such reference exposure condition, the calculated optimal adjustment amount is highly precise.

In this case, the information related to image forming quality may include various kinds of information so long as it is a base for calculating the optimal adjustment amount of the adjustment unit under the target exposure condition, as is with the adjustment information. For example, the information related to image forming quality can include information on wavefront aberration of the projection optical system that has been adjusted under the reference exposure condition. Or, the information related to image forming quality can include information on a stand-alone wavefront aberration of the projection optical system and image forming quality of the projection optical system under the reference exposure condition. In the latter case, given that the deviation between the wavefront aberration of the projection optical system itself (for example, before the projection optical system is assembled into the exposure apparatus) (stand-alone wavefront aberration) and the wavefront aberration of the projection optical system in an on-body state (that is, after the projection optical system is assembled into the exposure apparatus) after adjustment under the reference exposure condition corresponds to the deviation of the adjustment amount of the adjustment unit, a correction amount of the adjustment amount can be calculated based on the deviation from an ideal state of image forming quality, and based on such correction amount, the correction amount of the wavefront aberration can be obtained. Then, based on the correction amount of the wavefront aberration, the stand-alone wavefront aberration, and information on wavefront aberration variation values of the adjustment unit, which is a positional reference of the adjustment unit under the reference exposure condition, the wavefront aberration of the projection optical system after adjustment under the reference exposure condition can be obtained.

With the first image forming state adjusting system in the present invention, the information related to image forming quality of the projection optical system can be information on a difference between image forming quality of the projection optical system under the reference exposure condition and a predetermined target value of the image forming quality, and the adjustment information of the adjustment unit can be information on an adjustment amount of the adjustment unit, and in this case, the computer can calculate the optimal adjustment amount using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

A predetermined target value of the image forming quality, in this case, includes the case when the target value of the image forming quality (such as aberration) is zero.

In this case, for example, the predetermined target value can be a target value of image forming quality in at least one evaluation point of the projection optical system that has been input externally. However, when the target value is not given in particular for the predetermined target value, it can be set to zero.

In this case, the target value of image forming quality can be a target value of image forming quality at a chosen representative point. Or, the target value of image forming quality can be a target value of image forming quality whose target value of a coefficient is converted, the target value of the coefficient being set by decomposing the image forming quality of the projection optical system into components by an aberration decomposition method and improving a faulty component based on a decomposition coefficient obtained by the decomposition.

With the image forming state adjusting system in the present invention, for the computer to calculate the optimal adjustment amount, the relation expression can be an equation that includes a weighting function to perform weighting on any terms in the terms of the Zernike polynomial.

In this case, the computer can show image forming quality of the projection optical system under the reference exposure condition in different colors on screen with a permissible value as a boundary, and also show a screen for setting the weighting. Or, the weighting can be set high in the image forming quality of the projection optical system under the reference exposure condition where the image forming quality exceeds a permissible value.

With the first image forming state adjusting system in the present invention, when the information related to image forming quality of the projection optical system is the information on the difference between the image forming quality of the projection optical system under the reference condition and the predetermined target value of the image forming quality, and the computer calculates the optimal adjustment amount using the relation expression, the computer can make the Zernike Sensitivity Chart under the target exposure condition by interpolation calculation, based on Zernike Sensitivity Charts under a plurality of reference exposure conditions. In such a case, even in a case where the Zernike Sensitivity Chart under the target exposure condition is not prepared in advance, it can be smoothly obtained, for example, by interpolation calculation using the Zernike Sensitivity Charts under the plurality of reference exposure conditions.

With the first image forming state adjusting system in the present invention, the predetermined exposure condition can be the target exposure condition. In this case, the information related to image forming quality of the projection optical system can be actual measurement data of the image forming quality of the projection optical system under the target exposure condition. In such a case, the computer calculates the optimal adjustment amount under the target exposure condition based on the adjustment information of the adjustment unit and the actual measurement data of the image forming quality of the projection optical system. That is, the optimal adjustment amount of the adjustment unit under the target exposure condition is calculated based on the actual measurement data of the image forming quality of the projection optical system measured under the target exposure condition, which allows an accurate calculate of the adjustment amount. In this case, the adjustment amount calculated is equally or more accurate, compared with the adjustment amount calculated using the adjustment information of the adjustment unit and the information related to the image forming quality of the projection optical system under the reference exposure condition referred to earlier.

In this case, as the actual measurement data, any data can be used along with the adjustment information of the adjustment unit, as long as it can be a base for calculating the optimal adjustment amount of the adjustment unit under the target exposure condition. For example, the actual measurement data can include actual measurement data of any image forming quality under the target exposure condition. Or, the actual measurement data can include actual measurement data of wavefront aberration under the target exposure condition.

With the first image forming state adjusting system in the present invention, when the predetermined exposure condition is the target exposure condition, the information related to image forming quality of the projection optical system can be information on a difference between the image forming quality of the projection optical system under the target exposure condition and a predetermined target value of the image forming quality, and the adjustment information of the adjustment unit can be information on an adjustment amount of the adjustment unit, and in such a case the computer can calculate the optimal adjustment amount using a relation expression between the difference, a Zernike Sensitivity Chart that denotes a relation between image forming quality of the projection optical system under the target exposure condition and coefficients of each term in a Zernike polynomial, a wavefront aberration variation table made up of parameters that denotes a relation between adjustment of the adjustment unit and a change in wavefront aberration of the projection optical system, and the adjustment amount.

A predetermined target value of the image forming quality, in this case, includes the case when the target value of the image forming quality (such as aberration) is zero.

In this case, when the target value is not given in particular for the predetermined target value, it can be set to zero, however, the predetermined target value can also be a target value of image forming quality in at least one evaluation point of the projection optical system that has been input externally.

In this case, the target value of image forming quality can be a target value of image forming quality at a chosen representative point. Or, the target value of image forming quality can be a target value of image forming quality whose target value of a coefficient is converted, the target value of the coefficient being set by decomposing the image forming quality of the projection optical system into components by an aberration decomposition method and improving a faulty component based on a decomposition coefficient obtained by the decomposition.

With the first image forming state adjusting system in the present invention, when the information related to image forming quality of the projection optical system is information on a difference between image forming quality of the projection optical system under the target exposure condition and a predetermined target value of the image forming quality, and the adjustment information of the adjustment unit is information on an adjustment amount of the adjustment unit, the relation expression used by the computer in order to calculate the optimal adjustment amount can be an equation that includes a weighting function to perform weighting on any terms in the terms of the Zernike polynomial.

In this case, the computer can show image forming quality of the projection optical system under the target exposure condition in different colors on screen with a permissible value as a boundary, and also can show a screen for setting the weighting. Or, the weighting can be set high in the image forming quality of the projection optical system under the target exposure condition where the image forming quality exceeds a permissible value.

With the first image forming state adjusting system in the present invention, when the information related to image forming quality of the projection optical system is information on a difference between image forming quality of the projection optical system under the target exposure condition and a predetermined target value of the image forming quality, the adjustment information of the adjustment unit is information on an adjustment amount of the adjustment unit, and the computer uses the relation expression to calculate the optimal adjustment amount, the computer can make the Zernike Sensitivity Chart under the target exposure condition by interpolation calculation, based on Zernike Sensitivity Charts under a plurality of reference exposure conditions.

With the first image forming state adjusting system in the present invention, the computer preferably calculates the optimal adjustment amount further taking a restraint condition, which is decided by an adjustment amount limit of the adjustment unit, into consideration. In such a case, the adjustment unit can be adjusted without fail, according to the calculated restraint condition.

With the first image forming state adjusting system in the present invention, at least a part of a field of the projection optical system can be externally set as an optimizing field range in the computer. For example, in the case of a scanning exposure apparatus such as the so-called scanning stepper, there may be a case when the image forming quality or the transferred state of the pattern on the object does not have to be optimized in the entire field of the projection optical system. Or, in the case of a stepper, depending on the size of the mask that is used (pattern area), the image forming quality or the transferred state of the pattern on the object may not have to be optimized in the entire field of the projection optical system. In such cases, by externally setting the necessary range as the optimizing field, the time required for calculating the optimal adjustment amount can be reduced, compared with when the entire field of the projection optical system has been set as the optimizing field.

With the first image forming state adjusting system in the present invention, in the computer, from a first mode in which the optimal adjustment amount of the adjustment unit under the target exposure condition is calculated, based on adjustment information of the adjustment unit and the information related to image forming quality of the projection optical system under at least one reference exposure condition, a second mode in which the optimal adjustment amount of the adjustment unit under the target exposure condition is calculated, based on actual measurement data of the image forming quality of the projection optical system under the target exposure condition, and a third mode in which image forming quality of the projection optical system is calculated under an optional exposure condition in a state where the adjustment unit has been adjusted according to adjustment information, based on the adjustment information of the adjustment unit and information on wavefront aberration of the projection optical system under at least the one reference exposure condition, at least two modes can be set.

In the first image forming state adjusting system in the present invention, a worker can perform the adjustment of the adjustment unit by manual operation, however, the adjustment is not limited to this and the computer can control the adjustment unit based on the calculated adjustment amount.

According to a second aspect of the present invention, there is provided a second image forming state adjusting system used in an exposure apparatus, which forms a projected image of a predetermined pattern on an object using a projection optical system, the system being a system that optimizes a forming state of the projected image on the object, comprising: an adjustment unit that adjusts a forming state of the projected image on the object; and a computer that connects to the exposure apparatus via a communication channel and calculates image forming quality of the projection optical system under an optional exposure condition in a state where the adjustment unit has been adjusted according to adjustment information, based on the adjustment information of the adjustment unit and information on wavefront aberration of the projection optical system in a state where the adjustment unit has been adjusted according to the adjustment information.

According to this system, the computer that connects to the exposure apparatus via the communication channel calculates the image forming quality of the projection optical system under an optional exposure condition in a state where the adjustment unit has been adjusted according to adjustment information, based on the adjustment information of the adjustment unit and information on wavefront aberration of the projection optical system in a state where the adjustment unit has been adjusted according to the adjustment information. Accordingly, for example, by making the calculated results of the image forming quality show on the computer screen or on the display on the computer side connected to the computer, anyone can evaluate on screen whether the image forming quality of the projection optical system is satisfactory or not. In addition, with the second image forming state adjusting system in the present invention, the best exposure condition can be decided easily, by calculating and showing the image forming quality, with various exposure conditions set as the target exposure condition.

In this case, the optional exposure condition can be a condition that is decided according to a first information, which is related to a pattern subject to projection by the projection optical system, and a second information, which is related to projection conditions of the pattern.

In this case, the second information can include numerical aperture of the projection optical system and illumination conditions of the pattern.

With the second image forming state adjusting system in the present invention, the computer can calculate image forming quality of the projection optical system under the optional exposure condition based on information on the current wavefront aberration of the projection optical system, which is obtained based on adjustment information of the adjustment unit and information on wavefront aberration of the projection optical system under a reference exposure condition, and on a Zernike Sensitivity Chart, which denotes a relation between image forming quality of the projection optical system and coefficients of each term in a Zernike polynomial under the optional exposure condition.

With the second image forming state adjusting system in the present invention, the computer can make the Zernike Sensitivity Chart under the optional exposure condition by interpolation calculation, based on Zernike Sensitivity Charts under a plurality of reference exposure conditions.

The first and second exposure apparatus in the present invention can each use a communication channel of various types. For example, the communication channel can be a local area network, or it can include a public line. Or, the communication channel can include a radio link.

In each of the first and second image forming state adjusting systems in the present invention, the computer can be a computer used for controlling that controls each part making up the exposure apparatus.

According to a third aspect of the present invention, there is provided a first exposure method in which a predetermined pattern is transferred onto an object using a projection optical system, the method comprising: a calculating process in which an optimal adjustment amount of an adjustment unit under a target exposure condition is calculated, using adjustment information of the adjustment unit that adjusts a forming state of a projected image of the pattern by the projection optical system on the object and information related to image forming quality of the projection optical system under a predetermined exposure condition; and a transferring process in which the pattern is transferred onto the object using the projection optical system, in a state where the adjustment unit has been adjusted based on the calculated adjustment amount under the target exposure condition.

According to this method, the optimal adjustment amount of the adjustment unit under the target exposure condition is calculated, using the adjustment information of the adjustment unit and the information related to image forming quality of the projection optical system under a predetermined exposure condition, that is, under an exposure condition that has been decided in advance. That is, because the relation between the adjustment information of the adjustment unit and the information related to image forming quality of the projection optical system (aberration) under a predetermined exposure condition is well known, the optimal adjustment amount of the image forming quality of the projection optical system under the predetermined exposure condition can be easily found. Accordingly, the optimal adjustment amount under the target exposure condition that is calculated using such adjustment information of the adjustment unit and information related to image forming quality of the projection optical system under the predetermined exposure condition is highly precise.

And, in a state where the adjustment unit is adjusted based on the calculated adjustment amount under the target exposure condition, the pattern is transferred onto the object using the projection optical system. With this method, the forming state of the projected image of the pattern on the object is optimally adjusted under any target exposure condition, and the pattern can be transferred onto the object with good precision.

In this case, the information related to image forming quality of the projection optical system can be information on a difference between the image forming quality of the projection optical system under the reference exposure condition and a predetermined target value of the image forming quality, the adjustment information of the adjustment unit can be information on an adjustment amount of the adjustment unit, and in the calculating process, the optimal adjustment amount can be calculated using a relation expression between the difference, a Zernike Sensitivity Chart that denotes a relation between the image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

In the first exposure method in the present invention, the predetermined exposure condition can be the target exposure condition.

In this case, the information related to image forming quality of the projection optical system can be actual measurement data of the image forming quality of the projection optical system under the target exposure condition.

In this case, the actual measurement data can include actual measurement data of wavefront aberration under the target exposure condition.

In the first exposure method in the present invention, when the predetermined exposure condition is the target exposure condition, the information related to image forming quality of the projection optical system can be information on a difference between the image forming quality of the projection optical system under the target exposure condition and a predetermined target value of the image forming quality, the adjustment information of the adjustment unit can be information on an adjustment amount of the adjustment unit, and in the calculating process, the optimal adjustment amount can be calculated using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

In the first exposure method in the present invention, the relation expression used for calculating the optimal adjustment amount can be an equation that includes a weighting function to perform weighting on any terms in the terms of the Zernike polynomial.

According to a fourth aspect of the present invention, there is provided a second exposure method in which a pattern is transferred onto an object via a projection optical system, the method comprising: calculating image forming quality of the projection optical system under a plurality of exposure conditions that have different setting values, which are related to setting information being focused on among a plurality of setting information for the transfer, respectively, based on information related to wavefront aberration of the projection optical system and a Zernike Sensitivity Chart that denotes a relation between the image forming quality of the projection optical system and coefficients of each term in a Zernike polynomial; and deciding an exposure condition whose setting values related to the setting information being focused on are optimal, based on the image forming quality calculated for each of the exposure conditions.

According to this method, the image forming quality of the projection optical system is calculated under a plurality of exposure conditions that have different setting values, which are related to setting information being focused on among a plurality of setting information for the transfer, respectively, based on information related to wavefront aberration of the projection optical system and a Zernike Sensitivity Chart that denotes a relation between the image forming quality of the projection optical system and coefficients of each term in a Zernike polynomial, and the exposure condition whose setting values related to the setting information being focused on are optimal is decided, based on the image forming quality calculated for each of the exposure conditions. Accordingly, the best exposure condition can be easily set for each setting information, or for any number or types of setting information, using setting values that makes the image forming quality optimal, and the pattern can be transferred onto the object via the projection optical system with good precision.

In this case, when the plurality of setting information include information related to a pattern subject to projection by the projection optical system, an optimal setting value can be decided with the information related to a pattern serving as the setting information being focused on.

In the second exposure method in the present invention, when the plurality of setting information include a plurality of information related to projection conditions of a pattern subject to projection by the projection optical system, an optimal setting value can be decided with the one of the plurality of information related to projection conditions serving as the setting information being focused on.

In this case, the plurality of information related to projection conditions can include optical information of the projection optical system and that of an illumination optical system illuminating the pattern.

In this case, the optical information of the illumination optical system can include a plurality of information related to illumination conditions of the pattern.

In the second exposure method in the present invention, the image forming quality can be calculated, each by using a Zernike Sensitivity Chart that is different in at least a part of the plurality of exposure conditions.

In this case, at least one of the plurality of exposure conditions can have its corresponding Zernike Sensitivity Chart made by interpolation calculation, based on Zernike Sensitivity Charts corresponding to other exposure conditions in the plurality of exposure conditions.

In the second exposure method in the present invention, an optimal adjustment amount of the adjustment unit can be decided under an exposure condition whose setting values related to the setting information being focused on is optimal, based on a wavefront aberration variation table that denotes a relation between adjustment of a forming state of a projected image of the pattern by the projection optical system on the object by the adjustment unit and a change in wavefront aberration of the projection optical system, and the Zernike Sensitivity Chart.

In this case, when the pattern is transferred onto the object under the exposure condition whose setting values related to the setting information being focused on is optimal, at least one optical element of the projection optical system can be adjusted according to the optimal adjustment amount. Or, the optimal adjustment amount can be calculated using a weighting function that performs weighting on at least one term of the Zernike polynomial. Or, the image forming quality can be calculated, each by using a Zernike Sensitivity Chart that is different in at least a part of the plurality of exposure conditions. In this case, at least one of the plurality of exposure conditions can have its corresponding Zernike Sensitivity Chart made by interpolation calculation, based on Zernike Sensitivity Charts corresponding to other exposure conditions in the plurality of exposure conditions.

According to a fifth aspect of the present invention, there is provided a third exposure method in which a pattern is transferred onto an object via a projection optical system wherein an optimal adjustment amount of an adjustment unit under an exposure condition whose image forming quality of the projection optical system is optimal is decided, based on information related to wavefront aberration of the projection optical system, a Zernike Sensitivity Chart that denotes a relation between the image forming quality of the projection optical system and coefficients of each term in a Zernike polynomial, and a wavefront aberration variation table that denotes a relation between adjustment by the adjustment unit of a forming state of a pattern image via the projection optical system on the object and a change in wavefront aberration of the projection optical system.

According to this method, the optimal adjustment amount of an adjustment unit under an exposure condition whose image forming quality of the projection optical system is optimal is decided, based on information related to wavefront aberration of the projection optical system, a Zernike Sensitivity Chart that denotes a relation between the image forming quality of the projection optical system and coefficients of each term in a Zernike polynomial, and a wavefront aberration variation table that denotes a relation between adjustment by the adjustment unit of a forming state of a pattern image via the projection optical system on the object and a change in wavefront aberration of the projection optical system. Therefore, the optimal adjustment amount of the adjustment unit under the exposure condition whose the image forming quality is optimal can be set according to the information related to the known wavefront aberration of the projection optical system and information related to the pattern, and by adjusting the adjustment unit using the decided adjustment value and performing exposure, the pattern can be transferred onto the object via the projection optical system with good precision.

In this case, when the pattern is transferred onto the object under the exposure condition whose image forming quality is optimal, at least one optical element of the projection optical system can be adjusted according to the optimal adjustment amount. Or, the optimal adjustment amount can be calculated using a weighting function that performs weighting on at least one term of the Zernike polynomial.

In the third exposure method in the present invention, the optimal adjustment amount of the adjustment unit that makes image forming quality of the projection optical system optimal can be decided under each of a plurality of exposure conditions that have a different setting value in at least one setting information among a plurality of setting information for the transfer.

In this case, the optimal adjustment amount can be calculated, each by using a Zernike Sensitivity Chart that is different in at least a part of the plurality of exposure conditions.

In this case, at least one of the plurality of exposure conditions can have its corresponding Zernike Sensitivity Chart made by interpolation calculation, based on Zernike Sensitivity Charts corresponding to other exposure conditions in the plurality of exposure conditions. Or, when the plurality of setting information include information related to a pattern subject to projection by the projection optical system, the optimal adjustment amount of the adjustment unit that makes image forming quality of the projection optical system optimal can be decided under each of a plurality of exposure conditions whose the pattern is different.

Or, the plurality of setting information can include projection information related to projection conditions of a pattern subject to projection by the projection optical system, and the optimal adjustment amount of the adjustment unit that makes image forming quality of the projection optical system optimal can be decided under each of a plurality of exposure conditions whose setting values related to the projection information are different.

In this case, the information related to the projection conditions can include optical information of the projection optical system and that of an illumination optical system that illuminates the pattern, and the optimal adjustment amount of the adjustment unit that makes image forming quality of the projection optical system optimal can be decided under each of a plurality of exposure conditions whose setting values related to at least one of the two optical information of the projection optical system are different.

In this case, the optical information of the illumination optical system can include a plurality of illumination information related to illumination conditions of the pattern, and the optimal adjustment amount of the adjustment unit that makes image forming quality of the projection optical system optimal can be decided under each of a plurality of exposure conditions whose setting values related to at least one illumination information in the plurality of illumination information are different.

According to a sixth aspect of the present invention, there is provided a first exposure apparatus that transfers a pattern on an object via a projection optical system, the apparatus comprising: a setting unit that sets an exposure condition whose setting values are variable in at least one setting information among a plurality of setting information related to projection conditions of a pattern subject to projection by the projection optical system; and a calculating unit that calculates image forming quality of the projection optical system under a plurality of exposure conditions that have different setting values, which are related to setting information being focused on among a plurality of setting information, respectively, based on information related to wavefront aberration of the projection optical system and a Zernike Sensitivity Chart that denotes a relation between image forming quality of the projection optical system and coefficients of each term in a Zernike polynomial, and decides an exposure condition whose setting values related to the setting information being focused on are optimal, based on the image forming quality calculated for each of the exposure conditions.

With this apparatus, the setting unit sets an exposure condition whose setting values are variable in at least one setting information among a plurality of setting information related to projection conditions of a pattern subject to projection by the projection optical system. And, the calculating unit calculates image forming quality of the projection optical system under a plurality of exposure conditions that have different setting values, which are related to setting information being focused on among a plurality of setting information, respectively, based on information related to wavefront aberration of the projection optical system and a Zernike Sensitivity Chart that denotes a relation between image forming quality of the projection optical system and coefficients of each term in a Zernike polynomial, and decides the exposure condition whose setting values related to the setting information being focused on are optimal, based on the image forming quality calculated for each of the exposure conditions. Accordingly, the best exposure condition can be easily set for each setting information, or for any number or types of setting information, using setting values that makes the image forming quality optimal, and the pattern can be transferred onto the object via the projection optical system with good precision.

In this case, the image forming quality can be calculated, each by using a Zernike Sensitivity Chart that is different in at least a part of the plurality of exposure conditions.

In this case, at least one of the plurality of exposure conditions can have its corresponding Zernike Sensitivity Chart made by interpolation calculation, based on Zernike Sensitivity Charts corresponding to other exposure conditions in the plurality of exposure conditions.

With the first exposure apparatus in the present invention, the exposure apparatus can further comprise: an adjustment unit that adjusts a forming state of a projected image on the object by the projection optical system, wherein the exposure apparatus can decide an optimal adjustment amount of the adjustment unit under an exposure condition whose setting values related to the setting information being focused on are optimal, based on a wavefront aberration variation table that denotes a relation between adjustment by the adjustment unit and a change in wavefront aberration of the projection optical system, and the Zernike Sensitivity Chart.

In this case, when the pattern is transferred onto the object under the exposure condition whose setting values related to the setting information being focused on is optimal, at least one optical element of the projection optical system can be adjusted according to the optimal adjustment amount. Or, the optimal adjustment amount can be calculated using a weighting function that performs weighting on at least one term of the Zernike polynomial.

According to a seventh aspect of the present invention, there is provided a second exposure apparatus that transfers a pattern on an object via a projection optical system, the apparatus comprising: an adjustment unit that adjusts a forming state of a pattern image by the projection optical system on the object; a calculating unit that decides an optimal adjustment amount of the adjustment unit under an exposure condition whose image forming quality of the projection optical system is optimal, based on information related to wavefront aberration of the projection optical system, a Zernike Sensitivity Chart that denotes a relation between image forming quality of the projection optical system and coefficients of each term in a Zernike polynomial, and a wavefront aberration variation table that denotes a relation between adjustment by the adjustment unit and a change in wavefront aberration of the projection optical system.

With this apparatus, the calculating unit calculates the optical adjustment amount of the adjustment unit under an exposure condition whose image forming quality of the projection optical system is optimal, based on information related to wavefront aberration of the projection optical system, a Zernike Sensitivity Chart that denotes a relation between the image forming quality of the projection optical system and coefficients of each term in a Zernike polynomial, and a wavefront aberration variation table that denotes a relation between adjustment by the adjustment unit and a change in wavefront aberration of the projection optical system. Therefore, by providing the information related to wavefront aberration of the projection optical system and the information related to the pattern, the calculating unit decides the optimal adjustment amount of the adjustment unit under the exposure condition whose image forming quality of the projection optical system is optimal. Then, by performing exposure in a state where the adjustment unit is adjusted using the adjustment amount that has been decided, the pattern can be transferred onto the object with good accuracy via the projection optical system.

In this case, the optimal adjustment amount can be calculated using a weighting function that performs weighting on at least one term of the Zernike polynomial.

With the second exposure apparatus in the present invention, the optimal adjustment amount of the adjustment unit that makes image forming quality of the projection optical system optimal can be decided under each of a plurality of exposure conditions that have a different setting value in at least one setting information among a plurality of setting information for the transfer.

In this case, the optimal adjustment amount can be decided, each by using a Zernike Sensitivity Chart that is different in at least a part of the plurality of exposure conditions.

In this case, at least one of the plurality of exposure conditions can have its corresponding Zernike Sensitivity Chart made by interpolation calculation, based on Zernike Sensitivity Charts corresponding to other exposure conditions in the plurality of exposure conditions.

According to an eighth aspect of the present invention, there is provided a third exposure apparatus that transfers a pattern on an object via a projection optical system, the apparatus comprising: a setting unit that sets an exposure condition whose setting values are variable in at least one setting information among a plurality of setting information related to projection conditions of a pattern subject to projection by the projection optical system; and a calculating unit that uses a Zernike Sensitivity Chart, which is different in at least a part of a plurality of exposure conditions, and also makes at least one Zernike Sensitivity Chart different in at least a part of the plurality of exposure conditions by interpolation calculation based on a plurality of other Zernike Sensitivity Charts, on calculating image forming quality of the projection optical system under a plurality of exposure conditions that have different setting values, which are related to setting information being focused on among a plurality of setting information, respectively, based on information related to wavefront aberration of the projection optical system and a Zernike Sensitivity Chart that denotes a relation between image forming quality of the projection optical system and coefficients of each term in a Zernike polynomial.

With this apparatus, the setting unit sets an exposure condition whose setting values are variable in at least one setting information among a plurality of setting information related to projection conditions of a pattern subject to projection by the projection optical system. And, the calculating unit uses a Zernike Sensitivity Chart, which is different in at least a part of a plurality of exposure conditions, and also makes at least one Zernike Sensitivity Chart different in at least a part of the plurality of exposure conditions by interpolation calculation based on a plurality of other Zernike Sensitivity Charts, on calculating image forming quality of the projection optical system under a plurality of exposure conditions that have different setting values, which are related to setting information being focused on among a plurality of setting information, respectively, based on information related to wavefront aberration of the projection optical system and a Zernike Sensitivity Chart that denotes a relation between image forming quality of the projection optical system and coefficients of each term in a Zernike polynomial. Accordingly, even when the Zernike Sensitivity Chart is not prepared in advance under each of a plurality of exposure conditions, the Zernike Sensitivity Chart under the target exposure condition can be obtained by interpolation calculation based on a plurality of other Zernike Sensitivity Charts.

According to a ninth aspect of the present invention, there is provided a fourth exposure method in which a pattern is transferred onto an object via a projection optical system wherein a Zernike Sensitivity Chart, which is different in at least a part of a plurality of exposure conditions, is used, and also at least one Zernike Sensitivity Chart different in at least a part of the plurality of exposure conditions is made by interpolation calculation based on a plurality of other Zernike Sensitivity Charts, on calculating image forming quality of the projection optical system under a plurality of exposure conditions that have different setting values, which are related to setting information being focused on among a plurality of setting information related to projection conditions of a pattern subject to projection by the projection optical system, respectively, based on information related to wavefront aberration of the projection optical system and a Zernike Sensitivity Chart that denotes a relation between image forming quality of the projection optical system and coefficients of each term in a Zernike polynomial.

According to this method, even when the Zernike Sensitivity Chart is not prepared in advance under each of a plurality of exposure conditions, the Zernike Sensitivity Chart under the target exposure condition can be obtained by interpolation calculation based on a plurality of other Zernike Sensitivity Charts.

According to a tenth aspect of the present invention, there is provided a fourth exposure apparatus that irradiates an energy beam on a mask and transfers a pattern formed on the mask onto an object via a projection optical system, the apparatus comprising: an adjustment unit that adjusts a forming state of a projected image of the pattern on the object; and a processing unit that connects to the adjustment unit via a signal cable and calculates an optimal adjustment amount of the adjustment unit under a target exposure condition, based on adjustment information of the adjustment unit and information related to image forming quality of the projection optical system under a predetermined exposure condition, and controls the adjustment unit based on the calculated adjustment amount.

With this apparatus, the processing unit calculates the optimal adjustment amount of the adjustment unit under a target exposure condition, based on adjustment information of the adjustment unit and information related to image forming quality of the projection optical system under a predetermined exposure condition, and controls the adjustment unit based on the calculated adjustment amount. As is previously described, the relation between the adjustment information of the adjustment unit and the information related to image forming quality of the projection optical system (aberration) under a predetermined exposure condition is well known, therefore, the optimal adjustment amount that makes the image forming quality of the projection optical system optimal under the predetermined exposure condition can be easily found. Accordingly, the optimal adjustment amount under the target exposure condition that is calculated using the adjustment information of the adjustment unit and the information related to image forming quality of the projection optical system under a predetermined exposure condition is highly precise, and because the adjustment unit is adjusted based on the adjustment amount, the forming state of the projected image of the pattern on the object under any target exposure condition is substantially automatically optimized.

In this case, the predetermined exposure condition can be at least one reference exposure condition. In such a case, at least one reference exposure condition can be set as the predetermined exposure condition, in which the adjustment amount for optimally adjusting the image forming quality of the projection optical system is obtained in advance, and the optimal adjustment amount under the target exposure condition that is calculated based on the adjustment information of the adjustment unit and the information related to the image forming quality of the projection optical system under such reference exposure condition will have high precision.

In this case, the information related to image forming quality can include various types of information, so long as it is information that can be a base on calculating the optimal adjustment amount of the adjustment unit under the target exposure condition, along with the adjustment information of the adjustment unit. For example, the information related to image forming quality can include information on wavefront aberration of the projection optical system that has been adjusted under the reference exposure condition. Or, the information related to image forming quality can include information on a stand-alone wavefront aberration of the projection optical system and image forming quality of the projection optical system under the reference exposure condition.

With the fourth exposure apparatus in the present invention, when the predetermined exposure condition is an exposure condition that serves as at least one reference, the information related to image forming quality of the projection optical system can be information on a difference between image forming quality of the projection optical system under the reference exposure condition and a predetermined target value of the image forming quality, the adjustment information of the adjustment unit can be information on an adjustment amount of the adjustment unit, and the processing unit can calculate the optimal adjustment amount using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

With the fourth exposure apparatus in the present invention, the predetermined exposure condition can be the target exposure condition. In this case, the information related to image forming quality of the projection optical system can be actual measurement data of the image forming quality of the projection optical system under the target exposure condition. In such a case, the processing unit calculates the optimal adjustment amount of the adjustment unit under the target exposure condition, based on adjustment information of the adjustment unit and actual measurement data of the image forming quality of the projection optical system under the target exposure condition, and controls the adjustment unit based on the calculated adjustment amount. In this case, because the optimal adjustment amount of the adjustment unit under the target exposure condition is decided based on actual measurement data of the image forming quality of the projection optical system measured under the target exposure condition, the adjustment amount can be accurately calculated, and, since the adjustment unit is adjusted based on such adjustment amount, the forming state of the projected image of the pattern on the object under any target exposure condition can be substantially optimized automatically. The adjustment amount calculated in this case, is equal or more accurate, compared with the adjustment amount calculated using adjustment information of the adjustment unit and information related to image forming quality under the reference exposure condition, previously described.

In this case, as the actual measurement data, any data can be used as long as it can be a base for calculating the optimal adjustment amount of the adjustment unit under the target exposure condition, along with the adjustment information of the adjustment unit. For example, the actual measurement data can include actual measurement data of an optional image forming quality under the target exposure condition, or, the actual measurement data can include actual measurement data of wavefront aberration under the target exposure condition. In the latter case, the apparatus can further comprise a wavefront measuring instrument that measures wavefront aberration of the projection optical system.

In this case, the apparatus can further comprise: an object stage that holds the object; and a carriage system that loads and unloads the wavefront measuring instrument to the object stage.

With the fourth exposure apparatus in the present invention, when the predetermined exposure condition is the target exposure condition, the information related to image forming quality of the projection optical system can be information on a difference between image forming quality of the projection optical system under the target exposure condition and a predetermined target value of the image forming quality, the adjustment information of the adjustment unit can be information on an adjustment amount of the adjustment unit, and the processing unit can calculate the optimal adjustment amount using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

With the fourth exposure apparatus in the present invention, when the processing unit calculates the optimal adjustment amount using the relation expression, the predetermined target value can be a target value of image forming quality in at least one evaluation point of the projection optical system that has been input externally.

The target value of image forming quality can be a target value of image forming quality at a chosen representative point, or, the target value of image forming quality can be a target value of image forming quality whose target value of a coefficient is converted, the target value of the coefficient being set by decomposing the image forming quality of the projection optical system into components by an aberration decomposition method and improving a faulty component based on a decomposition coefficient obtained by the decomposition.

With the fourth exposure apparatus in the present invention, when the processing unit calculates the optimal adjustment amount using the relation expression, the relation expression can be an equation that includes a weighting function to perform weighting on any terms in the terms of the Zernike polynomial.

In this case, the processing unit can show image forming quality of the projection optical system under the predetermined exposure condition in different colors on screen with a permissible value as a boundary, and also can show a screen for setting the weighting.

With the fourth exposure apparatus in the present invention, when the processing unit calculates the optimal adjustment amount using the relation expression, the processing unit can make the Zernike Sensitivity Chart under the target exposure condition by interpolation calculation, based on Zernike Sensitivity Charts under a plurality of reference exposure conditions.

According to an eleventh aspect of the present invention, there is provided a fifth exposure apparatus that irradiates an energy beam on a mask and transfers a pattern formed on the mask onto an object via a projection optical system, the apparatus comprising: an adjustment unit that adjusts a forming state of a projected image on the object; and a processing unit that connects to the adjustment unit via a communication channel and calculates image forming quality of the projection optical system under an optional exposure condition in a state where the adjustment unit is adjusted according to adjustment information, based on the adjustment information of the adjustment unit and information on wavefront aberration of the projection optical system in a state where the adjustment unit is adjusted according to the adjustment information.

With this apparatus, the processing unit that connects to the adjustment unit via the communication channel calculates image forming quality of the projection optical system under an optional exposure condition in a state where the adjustment unit is adjusted according to adjustment information, based on the adjustment information of the adjustment unit and information on wavefront aberration of the projection optical system in a state where the adjustment unit is adjusted according to the adjustment information. Accordingly, for example, by making the calculated results of the image forming quality show on the computer screen or on the display on the computer side connected to the computer, anyone can evaluate on screen whether the image forming quality of the projection optical system is satisfactory or not. In addition, with the fifth exposure apparatus in the present invention, the best exposure condition can be decided easily, by calculating and showing the image forming quality, with various exposure conditions set as the target exposure condition.

In this case, the optional exposure condition can be a condition that is decided according to a first information, which is related to a pattern subject to projection by the projection optical system, and a second information, which is related to projection conditions of the pattern.

In this case, the second information can include numerical aperture of the projection optical system and illumination conditions of the pattern.

With the fifth exposure apparatus in the present invention, the processing unit can calculate image forming quality of the projection optical system under the optional exposure condition based on information on the current wavefront aberration of the projection optical system, which is obtained based on adjustment information of the adjustment unit and information on wavefront aberration of the projection optical system under a reference exposure condition, and on a Zernike Sensitivity Chart, which denotes a relation between image forming quality of the projection optical system and coefficients of each term in a Zernike polynomial under the optional exposure condition.

In this case, the processing unit can make the Zernike Sensitivity Chart under the optional exposure condition by interpolation calculation, based on Zernike Sensitivity Charts under a plurality of reference exposure conditions.

According to a twelfth aspect of the present invention, there is provided a first program that makes a computer, which makes up a part of a control system of an exposure apparatus that forms a projected image of a predetermined pattern on an object using a projection optical system and also comprises an adjustment unit to adjust a forming state of the projected image on the object, execute a predetermined process, the program making the computer execute a procedure of: calculating an optimal adjustment amount of the adjustment unit under a target exposure condition in response to input of adjustment information of the adjustment unit and information related to image forming quality of the projection optical system under a predetermined exposure condition, using the input information.

When the target exposure condition, and adjustment information on the adjustment unit and information related to image forming quality of the projection optical system are input into a computer that has the program installed, the computer calculates the optimal adjustment amount of the adjustment unit under the target exposure condition in response, using the input information. That is, the relation between adjustment information on the adjustment unit and information related to image forming quality of the projection optical system (aberration) under the predetermined exposure condition is well known, therefore, the optimal adjustment amount of the image forming quality of the projection optical system under the predetermined exposure condition can be easily found. Accordingly, the optimal adjustment amount under the target exposure condition that is calculated based on adjustment information of the adjustment unit and information related to image forming quality of the projection optical system under such predetermined exposure condition is highly precise. Therefore, by adjusting the adjustment unit based on the adjustment amount, the forming state of the projected image of the pattern on the object under any target exposure condition can be smoothly optimized. As is described, the first program in the present invention makes the computer execute a process of smoothly optimizing the image forming state of the pattern by the projection optical system, or to be more precise, makes the computer calculate the optimal adjustment amount under the target exposure condition.

In this case, the predetermined exposure condition can be at least one reference exposure condition. In such a case, at least one reference exposure condition whose optimal adjustment amount of the projection optical system is obtained in advance can be set as the predetermined exposure condition, and the optimal adjustment amount under the target exposure condition calculated based on adjustment information of the adjustment unit and information related to image forming quality of the projection optical system under such reference exposure condition is highly precise.

In this case, the information related to image forming quality only has to be information that can be a base for calculating the optimal adjustment amount of the adjustment unit under the target exposure condition, along with the adjustment information of the adjustment unit, and for example, the information related to image forming quality can include information on wavefront aberration of the projection optical system that has been adjusted under the reference exposure condition. Or, the information related to image forming quality can include information on a stand-alone wavefront aberration of the projection optical system and image forming quality of the projection optical system under the reference exposure condition.

In the first program of the present invention, when the predetermined exposure condition is at least one reference exposure condition, the information related to image forming quality of the projection optical system can be information on a difference between image forming quality of the projection optical system under the reference exposure condition and a predetermined target value of the image forming quality, the adjustment information of the adjustment unit can be information on an adjustment amount of the adjustment unit, and the program can make the computer calculate the optimal adjustment amount using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

In this case, the program can further make the computer execute a procedure of: showing a setting screen of the target value at each evaluation point within a field of the projection optical system. In such a case, the predetermined target vale can be a target value of image forming quality in at least one representative point set in response to the above showing of the setting screen.

In the first program in the present invention, when the information related to image forming quality of the projection optical system is information on a difference between image forming quality of the projection optical system under the reference exposure condition and a predetermined target value of the image forming quality, and the adjustment information of the adjustment unit is information on an adjustment amount of the adjustment unit, and the program makes the computer calculate the optimal adjustment amount using the relation expression, the program can further make the computer execute a procedure of: decomposing image forming quality of the projection optical system into components by an aberration the method and showing a setting screen of a target value along with the coefficients obtained by the decomposing; and converting the target value of a coefficient set in response to showing the setting screen into a target value of the image forming quality. In addition, in this case, the relation expression can be an equation that includes a weighting function to perform weighting on any terms in the terms of the Zernike polynomial.

In this case, the program can further make the computer execute a procedure of: showing image forming quality of the projection optical system under the reference exposure condition in different colors on screen with a permissible value of a boundary, and also shows a screen for setting the weighting.

In the first program in the present invention, when the predetermined exposure condition is at least one reference exposure condition, and the program makes the computer calculate the optimal adjustment amount using the relation expression, the program can further make the computer execute a procedure of: making the Zernike Sensitivity Chart under the target exposure condition by interpolation calculation, based on Zernike Sensitivity Charts under a plurality of reference exposure conditions.

In the first program in the present invention, when the predetermined exposure condition is at least one reference exposure condition, the program can further make the computer execute a procedure of: correcting the optimal adjustment amount taking a restraint condition, which is decided by an adjustment amount limit of the adjustment unit, into consideration.

In the first program in the present invention, the predetermined exposure condition can be the target exposure condition. In this case, the information related to image forming quality of the projection optical system can be actual measurement data of image forming quality of the projection optical system under the target exposure condition. In such a case, when adjustment information on the adjustment unit and the actual measurement data of image forming quality of the projection optical system under the target exposure condition are input into the computer, the computer calculates the optimal adjustment amount of the adjustment unit under the target exposure condition in response, using the input information. That is, because the optimal adjustment amount of the adjustment unit under the target exposure condition is calculated, based on the actual measurement data of image forming quality of the projection optical system measured under the target exposure condition, the adjustment amount can be accurately calculated. Therefore, by adjusting the adjustment unit based on the adjustment amount, the forming state of the projected image of the pattern on the object under any target exposure condition can be smoothly optimized. In this case, the calculated adjustment amount will be equally or more precise when compared with the adjustment amount calculated using adjustment information of the adjustment unit and information related to image forming quality of the projection optical system.

In this case, as the actual measurement data, any kind of data may be used, as long as it can be a base for calculating the optimal adjustment amount of the adjustment unit under the target exposure condition, along with the adjustment information of the adjustment unit. For example, the actual measurement data can include actual measurement data of an optional image forming quality under the target exposure condition. Or, the actual measurement data can include actual measurement data of wavefront aberration under the target exposure condition.

In the first program in the present invention, when the predetermined exposure condition is the target exposure condition, the information related to image forming quality of the projection optical system can be information on a difference between image forming quality of the projection optical system under the target exposure condition and a predetermined target value of the image forming quality, the adjustment information of the adjustment unit can be information on an adjustment amount of the adjustment unit, and the program can make the computer calculate the optimal adjustment amount using a relation expression between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount.

In this case, the program can further make the computer execute a procedure of: showing a setting screen of the target value at each evaluation point within a field of the projection optical system. In such a case, the predetermined target vale can be a target value of image forming quality in at least one representative point set in response to the above showing of the setting screen.

In the first program in the present invention, when the information related to image forming quality of the projection optical system is information on a difference between image forming quality of the projection optical system under the target exposure condition and a predetermined target value of the image forming quality, and the adjustment information of the adjustment unit is information on an adjustment amount of the adjustment unit, and the program makes the computer calculate the optimal adjustment amount using the relation expression, the program can make the computer calculate the optimal adjustment amount using the relation expression that denotes the relation between the difference, a Zernike Sensitivity Chart that denotes a relation between image forming quality of the projection optical system and coefficients of each term in a Zernike polynomial under the target exposure condition, a wavefront aberration variation table made up of parameters that denotes a relation between adjustment of the adjustment unit and a change in wavefront aberration of the projection optical system, and the adjustment amount. In addition, in this case, the relation expression can be an equation that includes a weighting function to perform weighting on any terms in the terms of the Zernike polynomial.

In this case, the program can further make the computer execute a procedure of: showing image forming quality of the projection optical system under the target exposure condition in different colors on screen with a permissible value as a boundary, and also shows a screen for setting the weighting.

In the first program in the present invention, when the predetermined exposure condition is the target exposure condition and the program makes the computer calculate the optimal adjustment amount using the relation expression, the program can further make the computer execute a procedure of: making the Zernike Sensitivity Chart under the target exposure condition by interpolation calculation, based on Zernike Sensitivity Charts under a plurality of reference exposure conditions.

In the first program in the present invention, when the predetermined exposure condition is the target exposure condition, the program can further make the computer execute a procedure of: correcting the optimal adjustment amount taking a restraint condition, which is decided by an adjustment amount limit of the adjustment unit, into consideration.

In the first program in the present invention, the program can further make the computer execute a procedure of: selectively setting a mode in response to mode selection instructions for at least two modes out of modes set in advance, the modes being a first mode in which the optimal adjustment amount of the adjustment unit under the target exposure condition is calculated, based on adjustment information of the adjustment unit and the information related to image forming quality of the projection optical system under at least one reference exposure condition, a second mode in which the optimal adjustment amount of the adjustment unit under the target exposure condition is calculated, based on actual measurement data of image forming quality of the projection optical system under the target exposure condition, and a third mode in which image forming quality of the projection optical system is calculated under an optional exposure condition in a state where the adjustment unit has been adjusted according to adjustment information, based on the adjustment information of the adjustment unit and information on wavefront aberration of the projection optical system under at least the one reference exposure condition.

In the first program in the present invention, the program can further make the computer execute a procedure of: controlling the adjustment unit based on the calculated adjustment amount.

According to a thirteenth aspect of the present invention, there is provided a second program that makes a computer, which makes up a part of a control system of an exposure apparatus that forms a projected image of a predetermined pattern on an object using a projection optical system and also comprises an adjustment unit to adjust a forming state of the projected image on the object, execute a predetermined process, the program making the computer execute a procedure of: calculating image forming quality of the projection optical system under an optional exposure condition in a state where the adjustment unit has been adjusted according to adjustment information using the adjustment information of the adjustment unit and information on wavefront aberration of the projection optical system under at least one reference exposure condition; and outputting results of the calculation.

When adjustment information on the adjustment unit and information on wavefront aberration of the projection optical system under at least one reference exposure condition are input into the computer that has the program installed, the computer calculates the image forming quality of the projection optical system under an optional exposure condition in a state where the adjustment unit has been adjusted according to the adjustment information in response, using the input information, and shows the calculation results on screen. Accordingly, anyone can easily evaluate on screen whether the image forming quality of the projection optical system is satisfactory or not, based on the calculation results of the output image forming quality. In addition, in the second program in the present invention, by inputting various exposure conditions as the target exposure condition and making the computer output the calculation results of image forming quality, the best exposure condition can be easily decided.

In this case, the optional exposure condition can be a condition that is decided according to a first information, which is related to a pattern subject to projection by the projection optical system, and a second information, which is related to projection conditions of the pattern.

In this case, the second information can include numerical aperture of the projection optical system and illumination conditions of the pattern.

In the second program in the present invention, the program can make the computer calculate image forming quality of the projection optical system under the optional exposure condition based on information on the current wavefront aberration of the projection optical system, which is obtained based on adjustment information of the adjustment unit and information on wavefront aberration of the projection optical system under a reference exposure condition, and on a Zernike Sensitivity Chart, which denotes a relation between image forming quality of the projection optical system and coefficients of each term in a Zernike polynomial under the optional exposure condition.

In the second program in the present invention, the program can further make the computer execute a procedure of: making the Zernike Sensitivity Chart under the optional exposure condition by interpolation calculation, based on Zernike Sensitivity Charts under a plurality of reference exposure conditions.

According to a fourteenth aspect of the present invention, there is provided a third program of a computer that makes an exposure apparatus, which transfers a pattern onto an object via a projection optical system, execute a predetermined process, the program making the computer execute a procedure of: calculating image forming quality of the projection optical system under a plurality of exposure conditions that have different setting values, which are related to setting information being focused on among a plurality of setting information for the transfer, respectively, in response to input of information related to wavefront aberration of the projection optical system and a Zernike Sensitivity Chart that denotes a relation between image forming quality of the projection optical system and coefficients of each term in a Zernike polynomial; and deciding an exposure condition whose setting values related to the setting information being focused on are optimal, based on the image forming quality calculated for each of the exposure conditions.

When information related to wavefront aberration of the projection optical system and the Zernike Sensitivity Chart that denotes a relation between image forming quality of the projection optical system and coefficients of each term in a Zernike polynomial are input into the computer that has the program installed, the computer calculates the image forming quality of the projection optical system under a plurality of exposure conditions that have different setting values, which are related to setting information being focused on among a plurality of setting information for the transfer, respectively, in response, and decides the exposure condition whose setting values related to the setting information being focused on are optimal, based on the image forming quality calculated for each of the exposure conditions. This allows the computer to execute the process of optimizing the forming state of the projected image of the pattern on the object smoothly.

According to a fifteenth aspect of the present invention, there is provided a fourth program of a computer that makes an exposure apparatus, which comprises an adjustment unit that adjusts a forming state of a projected image of a pattern on an object to transfer the pattern on the object via a projection optical system, execute a predetermined process, the program making the computer execute a procedure of: deciding an optimal adjustment amount of the adjustment unit under an exposure condition whose image forming quality of the projection optical system is optimal, in response to input of information related to wavefront aberration of the projection optical system, a Zernike Sensitivity Chart that denotes a relation between the image forming quality of the projection optical system and coefficients of each term in a Zernike polynomial, and a wavefront aberration variation table that denotes a relation between adjustment by the adjustment unit and a change in wavefront aberration of the projection optical system.

When information related to wavefront aberration of the projection optical system, the Zernike Sensitivity Chart that denotes a relation between image forming quality of the projection optical system and coefficients of each term in a Zernike polynomial, and the wavefront aberration variation table that denotes a relation between adjustment by the adjustment unit and a change in wavefront aberration of the projection optical system are input into the computer that has the program installed, the computer decides the optimal adjustment amount of the adjustment unit under an exposure condition whose image forming quality of the projection optical system is optimal. Accordingly, by adjusting the adjustment unit based on the adjustment amount that has been decided, the computer can execute the process of optimizing the forming state of the projected image of the pattern on the object smoothly.

According to a sixteenth aspect of the present invention, there is provided a fifth program of a computer that makes an exposure apparatus, which transfers a pattern onto an object via a projection optical system, execute a predetermined process, the program making the computer execute a procedure of: using a Zernike Sensitivity Chart, which is different in at least a part of a plurality of exposure conditions, and also making at least one Zernike Sensitivity Chart different in at least a part of the plurality of exposure conditions by interpolation calculation based on a plurality of other Zernike Sensitivity Charts, on calculating image forming quality of the projection optical system under a plurality of exposure conditions that have different setting values, which are related to setting information being focused on among a plurality of setting information related to projection conditions of a pattern subject to projection by the projection optical system, respectively, in response to input of information related to wavefront aberration of the projection optical system and a Zernike Sensitivity Chart that denotes a relation between image forming quality of the projection optical system and coefficients of each term in a Zernike polynomial.

When information related to wavefront aberration of the projection optical system and the Zernike Sensitivity Chart that denotes a relation between image forming quality of the projection optical system and coefficients of each term in a Zernike polynomial are input into the computer that has the program installed, the computer uses the Zernike Sensitivity Chart, which is different in at least a part of a plurality of exposure conditions, and also makes at least one Zernike Sensitivity Chart different in at least a part of the plurality of exposure conditions by interpolation calculation based on a plurality of other Zernike Sensitivity Charts, on calculating image forming quality of the projection optical system under a plurality of exposure conditions that have different setting values, which are related to setting information being focused on among a plurality of setting information related to projection conditions of a pattern subject to projection by the projection optical system, respectively, in response to the input of the above information. This allows the Zernike Sensitivity Chart under the target exposure condition to be obtained even when the Zernike Sensitivity Charts under the plurality of exposure condition are not prepared in advance, by interpolation calculation based on a plurality of other Zernike Sensitivity Charts. In addition, because the image forming quality of the projection optical system is calculated under each of the plurality of exposure condition using the Zernike Sensitivity Charts, the optimal exposure condition can be set, based on the calculation results.

The first to fifth program of the present invention can be a subject of marketing in a recorded state in an information storage medium. Accordingly, from a seventeenth aspect of the present invention, the first to fifth program can be an information storage medium that can be read by a computer.

According to an eighteenth aspect of the present invention, there is provided a making method of a projection optical system that projects a predetermined pattern on an object, the making method comprising: a process of assembling the projection optical system by assembling a plurality of optical elements into a barrel in a predetermined positional relationship; a process of measuring wavefront aberration of the projection optical system after its assembly; a process of adjusting the projection optical system so as to make the measured wavefront aberration optimal.

In this case, the making method further comprising: a process of obtaining information related to a surface shape of each of the optical elements in prior to the process of assembling, the process of assembling comprising: obtaining information related to spacing of optical surfaces of each of the optical elements being assembled; and the making method further comprising: a process of correcting a known optical basic data, based on the information related to a surface shape of each of the optical elements and the information related to spacing of optical surfaces of each of the optical elements, and reproducing optical data during a making process of the projection optical system that has been actually assembled, in prior to the process of adjusting the projection optical system; and a process of correcting an adjustment basic database that includes a wavefront aberration variation table, which denotes a relation based on designed values of the projection optical system between a unit drive amount of each of the optical elements in directions of a predetermined degree of freedom and an amount of change in a coefficient of each term in a Zernike polynomial calculated, based on the optical basic data, and in the process of adjusting the projection optical system, information on adjustment amount of each of the optical elements in directions of each degree of freedom is calculated using the database that has been corrected and measurement results of the wavefront aberration, and based on results of the calculation, at least one of the optical elements is driven in at least a direction of one degree of freedom.

According to a nineteenth aspect of the present invention, there is provided a making method of an exposure apparatus that transfers a predetermined pattern on an object via a projection optical system, the making method comprising: a process of making the projection optical system; a process of assembling the projection optical system that has been made into an exposure apparatus main body; a process of measuring wavefront aberration of the projection optical system in a state where the projection optical system has been assembled into the exposure apparatus main body; and a process of calculating information on adjustment amount of each of optical elements in directions of each degree of freedom using a database that includes a wavefront aberration variation table, which denotes a relation based on designed values of the projection optical system between a unit drive amount of each of the optical elements in directions of a predetermined degree of freedom and an amount of change in a coefficient of each term in a Zernike polynomial calculated, and the wavefront aberration that has been measured, and based on results of the calculation, at least one of the optical elements is driven in at least a direction of one degree of freedom.

According to a twentieth aspect of the present invention, there is provided an image forming quality measuring method of a projection optical system that projects a pattern on an object wherein a Zernike Sensitivity Chart, which is different in at least a part of a plurality of conditions, is used, and also at least one of the Zernike Sensitivity Chart which is different is made by interpolation calculation based on a plurality of other Zernike Sensitivity Charts, on calculating image forming quality of the projection optical system under a plurality of conditions that have different setting values, which are related to setting information being focused on among a plurality of setting information related to the projection, respectively, based on information related to wavefront aberration of the projection optical system and a Zernike Sensitivity Chart that denotes a relation between image forming quality of the projection optical system and coefficients of each term in a Zernike polynomial.

In this case, the plurality of setting information can include information related to projection conditions of a pattern subject to projection by the projection optical system.

In this case, the information related to the projection conditions includes optical information of the projection optical system and that of an illumination optical system illuminating the pattern.

In the image forming quality measuring method in the present invention, the plurality of setting information can include information related to a pattern subject to projection by the projection optical system.

In addition, in a lithographic process, by performing exposure using any one of the first to fourth exposure methods, the pattern can be formed with good accuracy on the object, which in turn allows highly integrated microdevices to be produced with good yield. Accordingly, further from another aspect, the present invention can also be referred to as a device manufacturing method that uses any one of the first to fourth methods in the present invention.

BRIEF DESCRIPTION OF THE DRAWINGS

In the accompanying drawings.

DETAILED DESCRIPTION OF THE PREFERRED EMBODIMENTS

Hereinafter, an embodiment of the present invention is described, referring to FIGS. 1 to 21.

Figure 1:
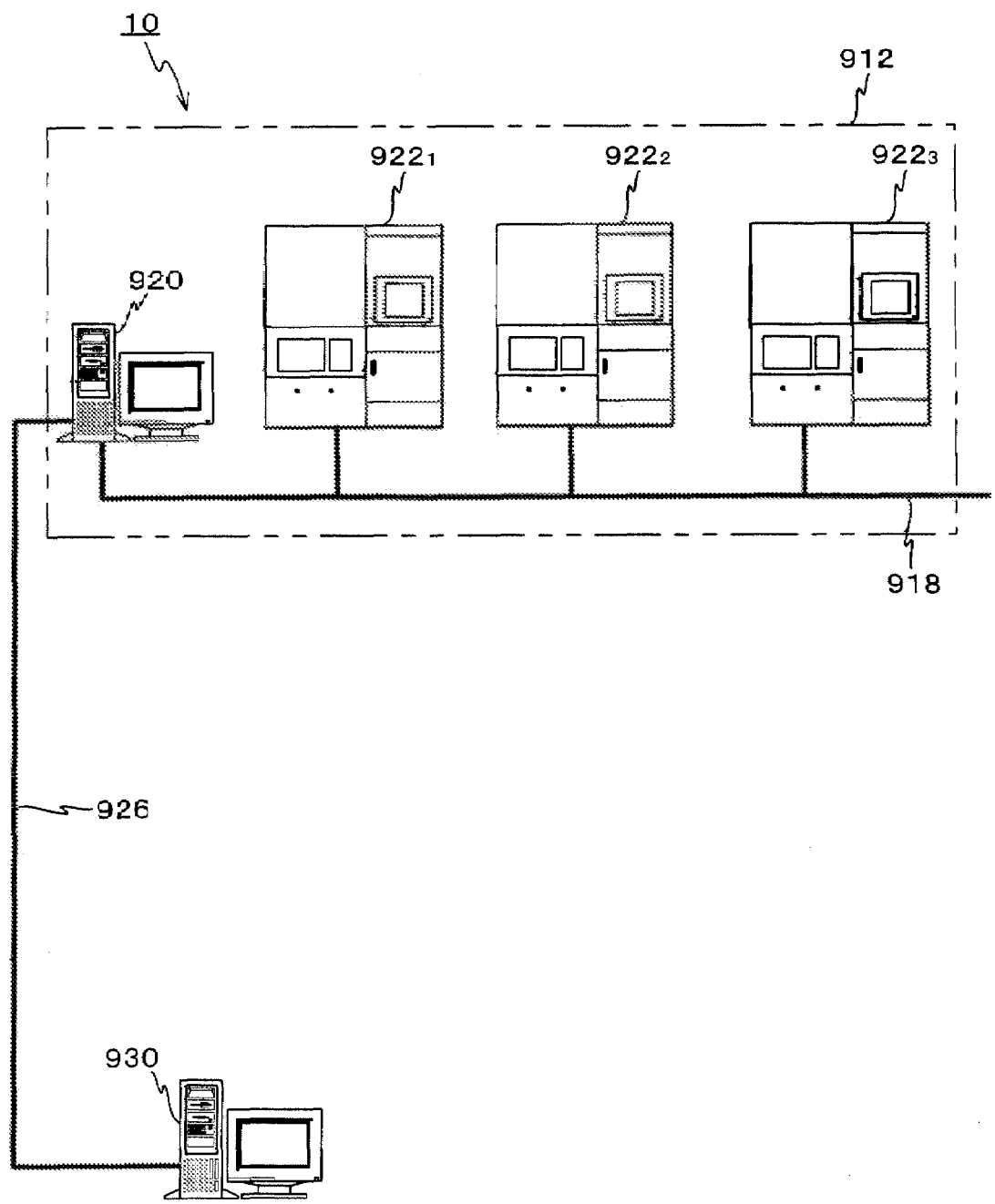
FIG. 1 is a view showing a configuration of a computer system related to an embodiment of the present invention.

FIG. 1 shows an entire configuration of a computer system serving as an image forming state adjusting system related to an embodiment of the present invention.

A computer system 10 shown in FIG. 1 is an intranet system built in a semiconductor factory of a device manufacturer (hereinafter referred to as 'manufacturer A' as appropriate) that uses equipment such as exposure apparatus for manufacturing devices. This computer system 10 comprises a lithographic system 912 arranged within a clean room that includes a first communications server 920, and a second communications server 930 connecting to the first communications server 920 structuring lithographic system 912 via a local area network (LAN) 926 serving as a communications channel.

Lithographic system 912 is made up including the first communications server 920, a first exposure apparatus $922_1$, a second exposure apparatus $922_2$, and a third exposure apparatus $922_3$ (hereinafter referred to as 'exposure apparatus 922' as appropriate) connecting reciprocally via a LAN 918.

Figure 2:
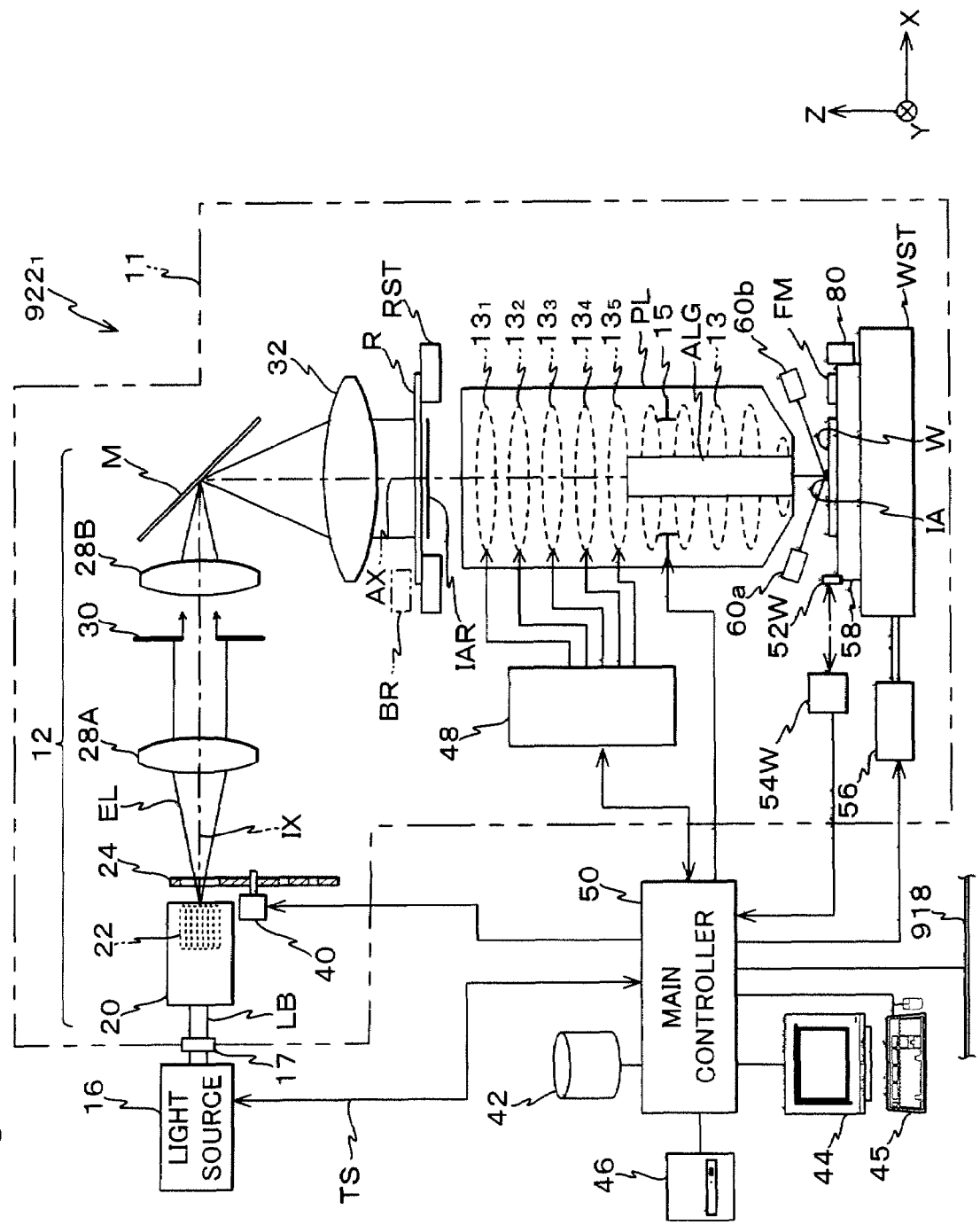
FIG. 2 is a view showing the entire configuration of a first exposure apparatus $922_1$ in FIG. 1.

FIG. 2 shows an entire structure of the first exposure apparatus $922_1$. Exposure apparatus $922_1$ is a reduction projection exposure apparatus based on a step-and-repeat method, using a pulsed laser light source as an exposure light source (hereinafter referred to as 'light source').

Exposure apparatus $922_1$ comprises the following parts: an illumination system composed of a light source 16 and an illumination optical system 12; a reticle stage RST serving as a mask stage that holds a reticle R as a mask illuminated by an exposure illumination light EL serving as an energy beam from the illumination system; a projection optical system PL that projects illumination light EL outgoing from reticle R on a wafer W (on an image plane) serving as an object; a wafer stage WST on which a Z tilt stage 58 serving as an object stage that holds wafer W is mounted; a control system for these parts, and the like.

As light source 16, in this case, a pulsed ultraviolet light source that emits a pulsed light in the vacuum ultraviolet region such as an $F_2$ laser (output wavelength 157 nm) or an ArF excimer laser (output wavelength 193 nm) is used. Incidentally, as light source 16, a light source that emits a pulsed light in the far ultraviolet region such as a KrF excimer laser (output wavelength 248 nm) or in the ultraviolet region may also be used.

In actual, light source 16 is arranged in a separate room, which is a service room having a lower degree of cleanliness than that of a clean room where a chamber 11 that houses the exposure apparatus main body composed of components of illumination optical system 12, reticle stage RST, projection optical system PL, wafer stage WST, and the like is arranged. Light source 16 connects to chamber 11 via a light transmitting optical system (not shown), which includes at least an optical system for optical axis adjustment called a beam matching unit in a part of its system. Light source 16 controls the on/off of the output of laser beam LB, the energy of laser beam LB per pulse, the oscillation frequency (the repetition frequency), the center wavelength and the spectral line half width (wavelength width), and the like by an internal controller, based on control information TS from a main controller 50.

Illumination optical system 12 comprises the following parts: a beam shaping illuminance unifying optical system 20, which includes a cylinder lens, a beam expander (none of which are shown), and an optical integrator (homogenizer) 22; an illumination system aperture stop plate 24; a first relay lens 28A; a second relay lens 28B; a reticle blind 30; an optical path bending mirror M; a condenser lens 32, and the like. As the optical integrator, a fly-eye lens, a rod integrator (an internal reflection type integrator), or a diffractive optical element can be used. In the embodiment, a fly-eye lens is used as optical integrator 22; therefore, hereinafter it will also be referred to as fly-eye lens 22.

Beam shaping illuminance unifying optical system 20 connects to a light transmitting optical system (not shown) via a light transmitting window 17 provided in chamber 11. Beam shaping illuminance unifying optical system 20 shapes the sectional shape of laser beam LB, which is the pulsed light emitted from light source 16 that enters beam shaping illuminance unifying optical system 20 via light transmitting window 17, using parts such as a cylinder lens or a beam expander. Then, when the laser beam enters beam shaping illuminance unifying optical system 20, fly-eye lens 22, which is located inside beam shaping illuminance unifying optical system 20 on the outgoing side, forms an area light source (a secondary light source), which is composed of multiple point sources on the focusing plane on the outgoing side of the laser beam arranged so that it substantially coincides with the pupil plane of illumination optical system 12, so as to illuminate reticle R with uniform distribution. Hereinafter, the laser beam outgoing from the secondary light source will be referred to as 'illumination light EL'.

In the vicinity of the focusing plane on the outgoing side of fly-eye lens 22 illumination system aperture stop plate 24 is disposed, made of a circular plate shaped member. In illumination system aperture stop plate 24, for example, the following aperture stops are formed spaced substantially apart at an equal angle: a conventional aperture stop made up of a circular aperture (conventional aperture); an aperture stop made up of small circular apertures to reduce a σ value, which is a coherence factor (small σ aperture); a ring shaped aperture stop for annular illumination (ring-shaped aperture); and a modified aperture stop made up of a plurality of apertures arranged eccentrically to a modified light source method (FIG. 1 shows only two types of apertures). Illumination system aperture stop plate 24 rotates by a drive unit 40 such as a motor or the like that operates under the control of main controller 50, so that an aperture stop is selectively set on the optical path of illumination light EL, and the shape of the light source plane in Koehler illumination is limited to shapes such as annular, small circles, large circle, or quadrupole.

Instead of, or combined with aperture stop plate 24, for example, an optical unit that includes at least one of a plurality of diffractive optical elements arranged switchable in the illumination optical system that disperse the illumination light in different areas on the pupil plane of the illumination optical system, a plurality of prisms (such as a cone prism or a polyhedral prism) that has at least one prism movable along an optical axis IX of the illumination optical system, that is, the spacing in the optical axis direction of the illumination optical system is variable, and a zoom optical system may be arranged in between light source 16 and optical integrator 22. And, by making the intensity distribution of the illumination light on the entering surface variable when optical integrator 22 is a fly-eye lens, or by making the angle of incidence of the illumination light to the entering surface variable when optical integrator 22 is an internal reflection type integrator, the light quantity distribution of the illumination light on the pupil plane of the illumination optical system (the size and shape of the secondary light source), that is, the light quantity loss due to change in illumination conditions of reticle R, is preferably suppressed. In the embodiment, a plurality of light source images (virtual images) formed by the internal reflection type integrator will also be referred to as the secondary light source.

On the optical path of illumination light EL outgoing from illumination system aperture stop plate 24, a relay optical system is arranged, composed of a first relay lens 28A and a second relay lens 28B with reticle blind 30 disposed in between. Reticle blind 30 is arranged on a surface conjugate to the pattern surface of reticle R, and a rectangular aperture is formed thereon that sets a rectangular shaped illumination area IAR on reticle R. As reticle blind 30, a movable blind whose aperture shape is variable is used, and its aperture is set by main controller 50, based on a blind setting information that is also called masking information.

On the optical path of illumination light EL in the rear of the second relay lens 28B, bending mirror M is disposed that reflects illumination light EL that has passed through the second relay lens 28B towards reticle R, and in the rear of mirror M on the optical path of illumination light EL, condenser lens 32 is disposed.

In the arrangement described so far, the entering surface of fly-eye lens 22, the disposal surface of reticle blind 30, and the pattern surface of reticle R are set optically conjugate with one another, while the light source plane formed on the focusing plane (the pupil plane of the illumination optical system) on the outgoing side of fly-eye lens 22 and the Fourier transform plane (outgoing pupil plane) of projection optical system PL are set optically conjugate, making up a Koehler illumination system.

The operation of the illumination system having such an arrangement will now be briefly described. With the system, laser beam LB, which is the pulsed light emitted from light source 16, enters fly-eye lens 22 after entering beam shaping illuminance unifying optical system 20 where its' sectional shape is shaped. With this operation, the secondary light source previously described is formed on the focusing plane on the outgoing side of the fly-eye lens 22.

After illumination light EL emitted from the above secondary light source passes through one of the apertures formed in illumination system aperture stop plate 24, it passes through the rectangular aperture of reticle blind 30 via the first relay lens 28A, and then passes through the second relay lens 28B. Then the optical path of illumination light EL is bent perpendicularly downward by mirror M, and illumination light EL then proceeds through condenser lens 32 and illuminates the rectangular illumination area IAR of reticle R held on reticle stage RST with uniform illuminance distribution.

On reticle stage RST, reticle R is mounted and held by suction via electrostatic chucking (or vacuum chucking) or the like (not shown). Reticle stage RST has a structure so that it can be finely driven (including rotation) within a horizontal plane (an XY plane) by a drive system (not shown). Incidentally, the position of reticle stage RST is measured at a predetermined resolution (for example, a resolution of approximately 0.5 to 1 nm) with a position detector such as a reticle laser interferometer (not shown), and the measurement results are supplied to main controller 50.

The material used for reticle R needs to be different depending on the light source that is used. That is, when an ArF excimer laser or a KrF excimer laser is used as the light source, materials such as synthetic quartz, fluoride crystal as in fluorite, or fluorine-doped quartz can be used, however, when an $F_2$ laser is used, the reticle has to be made of fluoride crystal such as fluorite, or fluorine-doped quartz.

Projection optical system PL is, for example, a double telecentric reduction system. The projection magnification of projection optical system PL is for example, ¼, ⅕, or ⅙. Therefore, when illumination area IAR on reticle R is illuminated with illumination light EL as is previously described, the pattern formed on reticle R is projected and transferred on a rectangular exposure area IA (normally coincides with the shot area) on wafer W whose surface is coated with a resist (photosensitive agent), as an image reduced by the projection magnification by projection optical system PL.

As is shown in FIG. 2, as projection optical system PL, a refraction system consisting only of a plurality of refraction optical elements (lens elements) 13, such as from 10 to 20 pieces, is used. Of the plurality of lens elements 13 that make up projection optical system PL (in this case, 5 lenses in order to simplify the description), lens elements $13_1$, $13_2$, $13_3$, $13_4$, and $13_5$ disposed on the object surface side (reticle R side) are movable lenses that can be moved from the outside by an image forming quality correction controller 48. Lens elements $13_1$ to $13_5$ are each held by the barrel via lens holders that have a double structure (not shown). These lens elements $13_1$ to $13_5$ are each held by inner lens holders, and these inner lens holders are supported by drive elements (not shown) such as piezo elements at three points in the gravitational direction with respect to outer lens holders. And, by independently adjusting the applied voltage to the drive elements, each of the lens elements $13_1$ to $13_5$ can be shifted along a Z-axis direction which is the optical axis direction of projection optical system PL, and the lens elements can be driven in a direction of inclination (that is, a rotational direction around the X-axis ($\theta$x) and a rotational direction around the Y-axis ($\theta$y)) with respect to an XY plane.

The barrel normally holds lens elements 13 besides those referred to above via lens holders. Optical elements other than lens elements $13_1$ to $13_5$ may be made drivable, such as the lenses disposed in the vicinity of the pupil plane of projection optical system PL, the lenses disposed on the image plane side, or an aberration correction plane (optical plate) that corrects the aberration of projection optical system PL, especially the non-rotational symmetric component. Furthermore, the degree of freedom (the movable direction) of such drivable optical elements is not limited to three, and may be one, two, or four and over.

In addition, a pupil aperture stop 15 that can continuously change the numerical aperture (N.A.) within a predetermined range is provided in the vicinity of the pupil plane of projection optical system PL. As pupil aperture stop 15, for example, the so-called iris diaphragm is used, which operates under the control of main controller 50.

When the ArF excimer laser beam or the KrF excimer laser beam is used as illumination light EL, synthetic quartz can also be used besides materials such as fluoride crystal as in fluorite, or fluorine-doped quartz can be used for each lens elements structuring projection optical system PL, however, when the $F_2$ laser is used, the reticle has to be made of fluoride crystal such as fluorite, or fluorine-doped quartz.

Wafer stage WST is driven freely within the XY two-dimensional plane by a wafer stage drive section 56 including a linear motor or the like. On Z tilt stage 58 mounted on wafer stage WST, wafer W is held by electrostatic suction (or vacuum chucking) or the like via a wafer holder (not shown).

In addition, Z tilt stage 58 is made so that the position in the XY direction on wafer stage WST is set and can also be moved along the Z-axis direction by a drive system (not shown) as well as being drivable (tiltable) in a direction of inclination (that is, the rotational direction around the X-axis ($\theta$x) and a rotational direction around the Y-axis ($\theta$y)) with respect to the XY plane. Such an arrangement sets the surface position of wafer W (the Z-axis position and the inclination with respect to the XY plane) held on Z tilt stage 58 at a desired state.

Furthermore, a movable mirror 52W is fixed on Z tilt stage 58, and the position of Z tilt stage 58 in the X-axis direction, the Y-axis direction, and the $\theta$z direction (the rotational direction around the Z-axis) is measured with a wafer laser interferometer 54W externally arranged. The positional information measured by interferometer 54W is sent to main controller 50, which controls wafer stage WST (and Z tilt stage 58) based on the measurement results via wafer stage drive section 56 (which includes both the drive system of wafer stage WST and the drive system of Z tilt stage 58). Incidentally, instead of providing movable mirror 52W, for example, the end surface (side surface) of Z tilt stage 58 polished into a reflection surface may be used.

In addition, on Z tilt stage 58, a fiducial mark plate FM is fixed on which reference marks such as reference marks for the so-called baseline measurement by the alignment system ALG (to be described later) are formed, so that its surface is substantially at the same height as the surface of wafer W.

In addition, on the side surface of Z tilt stage 58 on the +X side (on the right side within the page surface of FIG. 2), a wavefront aberration measuring instrument 80 is attached, serving as a detachable portable wavefront measuring unit.

Figure 3:
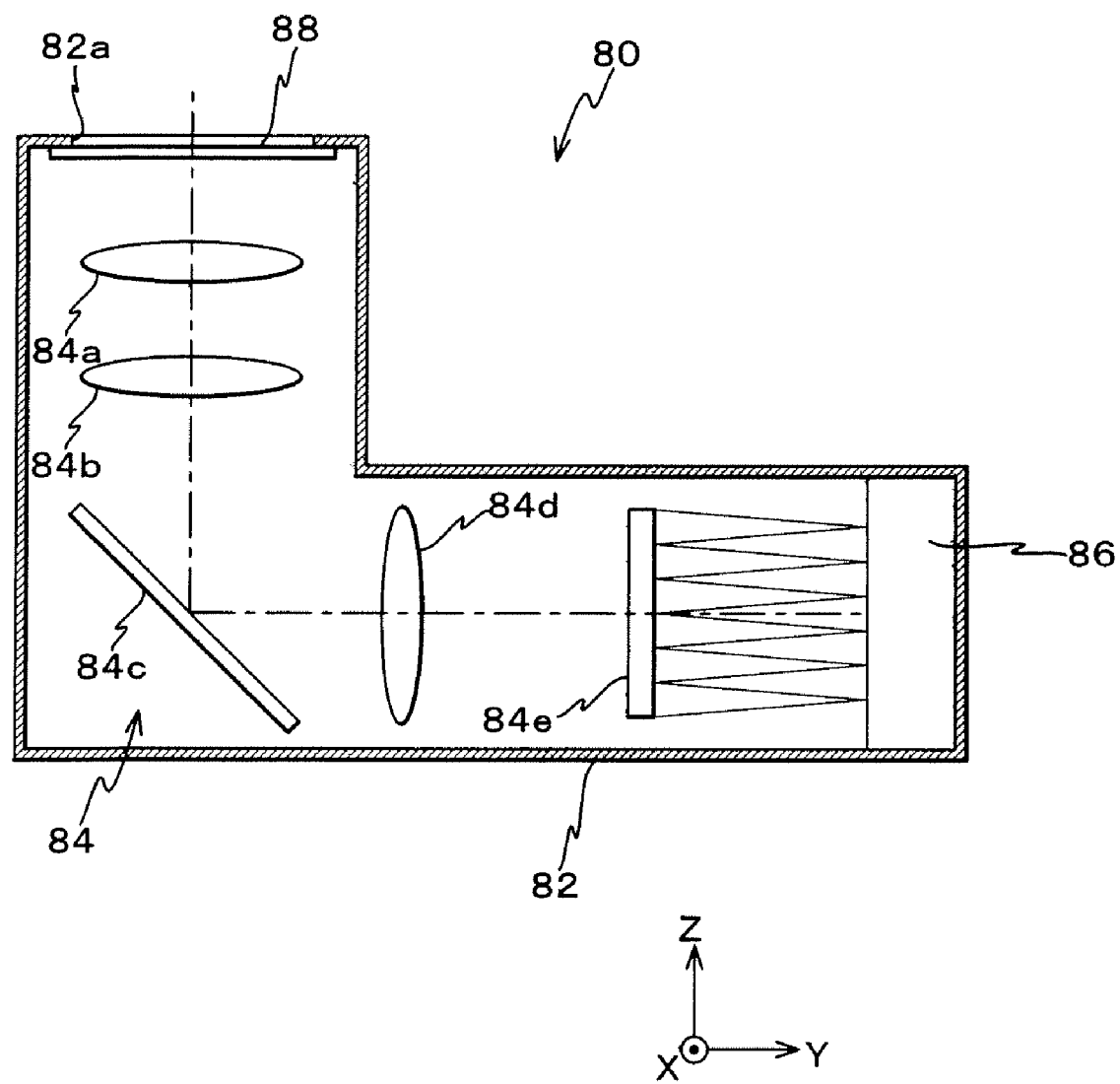
FIG. 3 is a sectional view of an example of a wavefront aberration measuring instrument.

As is shown in FIG. 3, wavefront aberration measuring instrument 80 comprises a hollow casing 82, a photodetection optical system 84 made up of a plurality of optical elements arranged at a predetermined positional relationship within casing 82, and a photodetection portion 86 disposed on the +Y end inside casing 82.

Casing 82 is made from a member that has an L-shaped section in the YZ plane and a space formed inside. The uppermost portion (the end portion in the +Z direction) has an opening 82a of a circular shape in a planar view (when viewed from above) so that the light from above casing 82 proceeds into the space inside. In addition, a cover glass 88 is provided to cover opening 82a from the inside of casing 82. On the upper surface of cover glass 88, a light shielding membrane that has a circular opening in the center is formed by vapor deposition of metal such as chrome, which shields unnecessary light from entering photodetection optical system 84 when the wavefront aberration of projection optical system PL is measured.

Photodetection optical system 84 is made up of an objective lens 84a, a relay lens 84b, and a deflecting mirror 84c, which are sequentially arranged from under cover glass 88 inside casing 82 in a downward direction, and a collimator lens 84d and a microlens array 84e, which are sequentially arranged on the +Y side of deflecting mirror 84c. Deflecting mirror 84c is provided having an inclination of 45°, and by deflecting mirror 84c, the optical path of the light entering the objective lens 84a from above in a downward vertical direction is deflected toward the collimator lens 84d. Each of the optical members that make up photodetection optical system 84 is fixed to the wall of casing 82 on the inner side, via holding members (not shown), respectively. Microlens array 84e has a plurality of small convex lenses (lens elements) that are arranged in an array shape on a plane perpendicular to the optical path.

Photodetection portion 86 is made up of parts like a photodetection element such as a two-dimensional CCD, and an electric circuit such as a charge transport controlling circuit. The photodetection element has an area large enough to receive all the beams that have entered objective lens 84a and are outgoing microlens array 84e. The measurement data of photodetection portion 86 is output to main controller 50 via a signal line (not shown) or by radio transmission.

Using the above wavefront aberration measuring instrument 80 allows the wavefront aberration of projection optical system PL to be measured on body. The measuring method of the wavefront aberration using wavefront aberration measuring instrument 80 will be described later in the description.

Referring back to FIG. 2, in exposure apparatus $922_1$ in the embodiment, a multiple point focus position detection system based on an oblique incident method (hereinafter simply referred to as a 'focus detection system') is provided. The system is made up of an irradiation system 60a, which has a light source whose on/off operation is controlled by main controller 50 and irradiates an imaging beam toward the image forming plane of projection optical system PL from an oblique direction against the optical axis AX for forming multiple pinholes or slit images, and a photodetection optical system 60b that receives the reflection beams of the imaging beam reflected off the surface of wafer W. As the focus detection system (60a and 60b), a unit having the same structure as the one disclosed in, for example, Japanese Patent Application No. H05-275313 and its corresponding U.S. Pat. No. 5,502,311, is used. As long as the national laws in designated states or elected states, to which this international application is applied, permit, the disclosures of the above publication and the above U.S. patent are incorporated herein by reference.

On exposure or the like, main controller 50 performs autofocusing (automatic focusing) and auto-leveling based on defocus signals such as S-curve signals from photodetection optical system 60b so that the defocus becomes zero by controlling the Z position and the inclination with respect to the XY plane of wafer W via wafer stage drive section 56. In addition, when wavefront aberration is measured in the manner that will be described later in the description, main controller 50 measures and aligns the Z position of wavefront aberration measuring instrument 80 using the focus detection system (60a and 60b). Upon this operation, the inclination of wavefront aberration measuring instrument 80 may also be measured if necessary.

Furthermore, exposure apparatus $922_1$ comprises alignment system ALG based on an off-axis method, which is used for measuring the alignment marks on wafer W held on wafer stage WST and the position of the reference marks formed on fiducial mark plate FM. As alignment system ALG, a sensor of an FIA (Field Image Alignment) system based on an image processing method is used that uses an image pickup device (such as a CCD) to pick up images of a subject mark on a photodetection surface formed by irradiating a broadband detection beam on the subject mark so that the mark will not be exposed and outputs the pick-up signals. Besides the sensor of the FIA system, a sensor that detects scattered light or diffracted light generated from a subject mark when the subject mark is irradiated with a coherent detection beam, or a sensor that a light of two diffracted lights (such as in the same order) generated from the subject mark and made to interfere with each other can be used independently, or in a combined arrangement.

Furthermore, although it is omitted in the drawings, in exposure apparatus $922_1$ in the embodiment, above reticle R, a pair of reticle alignment systems is provided, which is made up of a TTR (Through The Reticle) alignment optical system that uses light of the exposure wavelength in order to observe reticle marks formed on reticle R and the corresponding reference marks on the fiducial mark plate at the same time via projection optical system PL. In the embodiment, as wafer alignment system ALG and the reticle alignment system, units having the same structure as the ones disclosed in, for example, Japanese Patent Application Laid-open No. H06-97031 and its corresponding U.S. Pat. No. 6,198,527 are used. As long as the national laws in designated states or elected states, to which this international application is applied, permit, the disclosures of the above publication and the above U.S. patent are incorporated herein by reference.

In FIG. 2, the control system is mainly composed of main controller 50. Main controller 50 is made up of a so-called workstation (or microcomputer) comprising a CPU (Central Processing Unit), ROM (Read Only Memory), RAM (Random Access Memory), or the like, and controls the overall operation such as the stepping of wafer stage WST in between shots and the exposure timing so that exposure operations are appropriately performed.

In addition, for example, a storage unit 42 made up of a hard disk, an input unit 45 comprising a key board and a pointing-device such as a mouse, a display unit 44 such as a CRT display (or liquid-crystal display), and a drive unit 46 which is an information recording medium such as a CD (compact disc), a DVD (digital versatile disc), an MO (magneto-optical disc), or an FD (floppy disc) externally connects to main controller 50. Furthermore, LAN 918 referred to earlier also connects to main controller 50.

In storage unit 42, wavefront aberration measurement data of the stand-alone projection optical system PL (hereinafter referred to as a 'stand-alone wavefront aberration') is stored, which is measured at the making stage of the exposure apparatus before projection optical system PL is incorporated into the exposure apparatus main body, by for example, a wavefront aberration measuring unit called a PMI (Phase Measurement Interferometer).

In addition, in storage unit 42, data on wavefront aberration measured by wavefront aberration measuring instrument 80 or a wavefront aberration correction amount data (difference between the wavefront aberration and the stand-alone wavefront aberration), and information on the adjustment amount, that is, the positional information of each of movable lenses $13_1$ to $13_5$ in directions of three degrees of freedom, the positional information of wafer W in directions of three degrees of freedom, and the information on the wavelength of the illumination light is stored. The above data of wavefront aberration is measured in a state where the position of each of movable lenses $13_1$ to $13_5$ in directions of three degrees of freedom, the Z position and inclination of wafer W (Z tilt stage 58), and a wavelength λ of the illumination light are adjusted so that, for example, the forming state of an image on wafer W projected by projection optical system PL becomes optimal (such as, when the aberration is zero or under a permissible value) under a plurality of reference exposure conditions that will be described later. The reference exposure conditions, in this case, are ID controlled, each exposure condition serving as identifying information. Therefore, hereinafter, each of the reference exposure conditions will be referred to as reference ID. That is, in the storage unit, the information on adjustment amount of a plurality of reference IDs and the data on wavefront aberration or wavefront aberration correction amount is stored.

In the information storage medium (a CD-ROM in the following description for the sake of convenience) set in drive unit 46, a conversion program is stored for converting the positional deviation measured using wavefront aberration measuring instrument 80 into coefficients of the terms in the Zernike polynomial.

The second exposure apparatus $922_2$ and the third exposure apparatus $922_3$ have a structure similar to that of the above first exposure apparatus $922_1$.

Next, the measuring method of the wavefront aberration of the first to third exposure apparatus $922_1$ to $922_3$ performed during maintenance or the like will be described. In the following description, for the sake of simplicity, the aberration of photodetection optical system 84 in wavefront aberration measuring instrument 80 is to be small enough to be ignored.

As a premise, the conversion program stored in the CD-ROM set in drive unit 46 is to be installed into storage unit 42.

During normal exposure, because wavefront aberration measuring instrument 80 is detached from Z tilt stage 58, when the wavefront aberration measurement is performed the operator or the service technician or the like (hereinafter referred to as 'operator or the like' as appropriate) attaches wavefront aberration measuring instrument 80 onto the side surface of Z tilt stage 58. In this operation, wavefront aberration measuring instrument 80 is fixed onto a predetermined reference surface (in this case, the surface on the +X side) via a bolt or a magnet or the like, so that when the wavefront is measured, wavefront aberration measuring instrument 80 is within the movement strokes of wafer stage WST (Z tilt stage 58).

When the above attachment is completed, main controller 50 moves wafer stage WST via wafer stage drive section 56 so that wavefront aberration measuring instrument 80 is positioned under alignment system ALG, in response to a command to start measurement input by the operator or the like. Then, main controller 50 makes alignment system ALG detect the alignment marks provided in wavefront aberration measuring instrument 80 (not shown), and based on the detection results and the measurement values of laser interferometer 54W at that point, main controller 50 calculates the position coordinates of the alignment marks and obtains the accurate position of wavefront aberration measuring instrument 80. When the position of wavefront aberration measuring instrument 80 has been measured, then main controller 50 measures the wavefront aberration in the manner described below.

First of all, main controller 50 loads a measurement reticle (not shown)(hereinafter referred to as a 'pinhole reticle') on which pinhole patterns are formed onto reticle stage RST using a reticle loader (not shown). The pinhole reticle is a reticle on which pinholes (pinholes that become substantially ideal point light sources and generate spherical waves) are formed on its surface at a plurality of points in the same area as illumination area IAR.

In the pinhole reticle used in this case, by making the distribution of light from the pinhole patterns cover substantially the whole pupil plane, for example, by providing a diffusing surface on its upper surface, the wavefront aberration can be measured on the entire pupil plane of projection optical system PL. In the embodiment, since pupil aperture stop 15 is provided in the vicinity of the pupil plane of projection optical system PL, the wavefront aberration will actually be measured on the pupil plane set by pupil aperture stop 15.

After the pinhole reticle has been loaded, main controller 50 detects the reticle alignment marks formed on the pinhole reticle using the reticle alignment system, and based on the detection results, aligns the pinhole reticle at a predetermined position. With this operation, the center of the pinhole reticle substantially coincides with the optical axis of projection optical system PL.

Then, main controller 50 sends control information TS to light source 16 to start emission of laser beam LB. With this operation, illumination light EL from illumination optical system 12 irradiates the pinhole reticle. The lights outgoing from the plurality of pinholes of the pinhole reticle then condense on the image plane via projection optical system PL and form images of the pinholes on the image plane.

Next, main controller 50 moves wafer stage WST via wafer stage drive section 56 while monitoring the measurement values of wafer laser interferometer 54W, so that an image forming point where an image of a pinhole of the pinhole reticle (hereinafter referred to as the 'focused pinhole') is formed substantially coincides with the center of opening 82*a* in wavefront aberration measuring instrument 80. When performing such an operation, main controller 50 finely moves Z tilt stage 58 in the Z-axis direction via wafer stage drive section 56 based on the detection results of focus detection system (60*a* and 60*b*), so as to make the upper surface of cover glass 88 in wavefront aberration measuring instrument 80 coincide with the image plane where the pinhole image is formed. In this case, the angle of inclination of wafer stage WST is also adjusted if necessary. With the above operations, the imaging beams of the focused pinhole enters photodetection optical system 84 via the opening in the center of cover glass 88, and is received by the photodetection elements that make up photodetection portion 86.

More particularly, the focused pinhole on the pinhole reticle generates spherical waves, which become parallel beams that irradiate microlens array 84*e*, via projection optical system PL and objective lens 84*a*, relay lens 84*b*, mirror 84*c*, and collimator lens 84*d* that make up photodetection optical system 84 of wavefront aberration measuring instrument 80. When the parallel beams irradiate microlens array 84*e*, the pupil plane of projection optical system PL is relayed and divided by microlens array 84*e*. Each lens element of microlens array 84*e* condenses the lights (divided light) on the photodetection surface of the photodetection element, and the images of the pinhole are each formed on the photodetection surface.

Figure 4A:
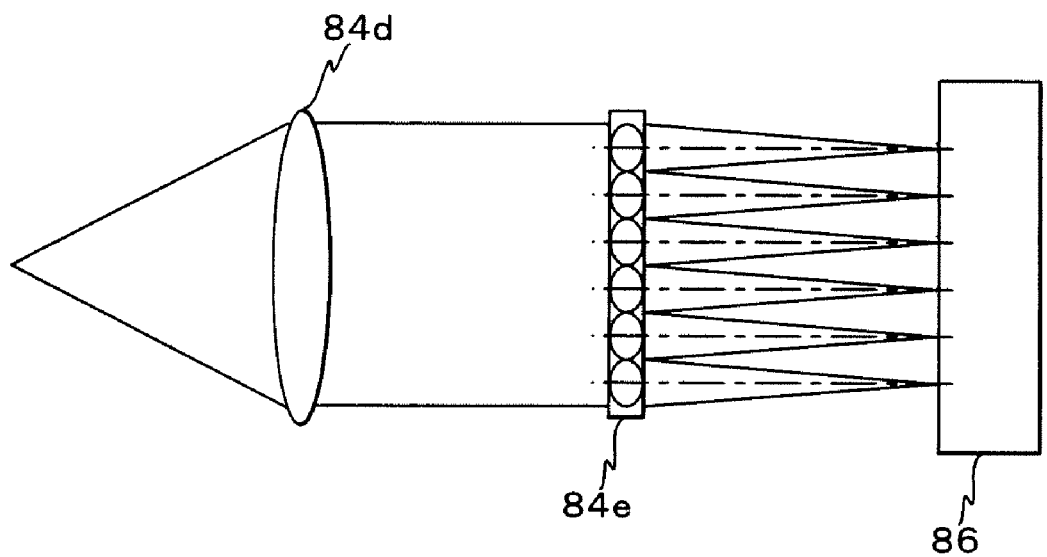
FIG. 4A is a view showing beams emitted from a microlens array when there is no aberration in an optical system.

In this case, when projection optical system PL is an ideal optical system that does not have any wavefront aberration, the wavefront in the pupil plane of projection optical system PL becomes an ideal shape (in this case, a planar surface), and as a consequence, the parallel beams entering microlens array 84*e* is supposed to be a plane wave that has an ideal wavefront. In this case, as is shown in FIG. 4A, a spot image (hereinafter also referred to as a 'spot') is formed at a position on the optical axis of each lens element that make up microlens array 84*e*.

Figure 4B:
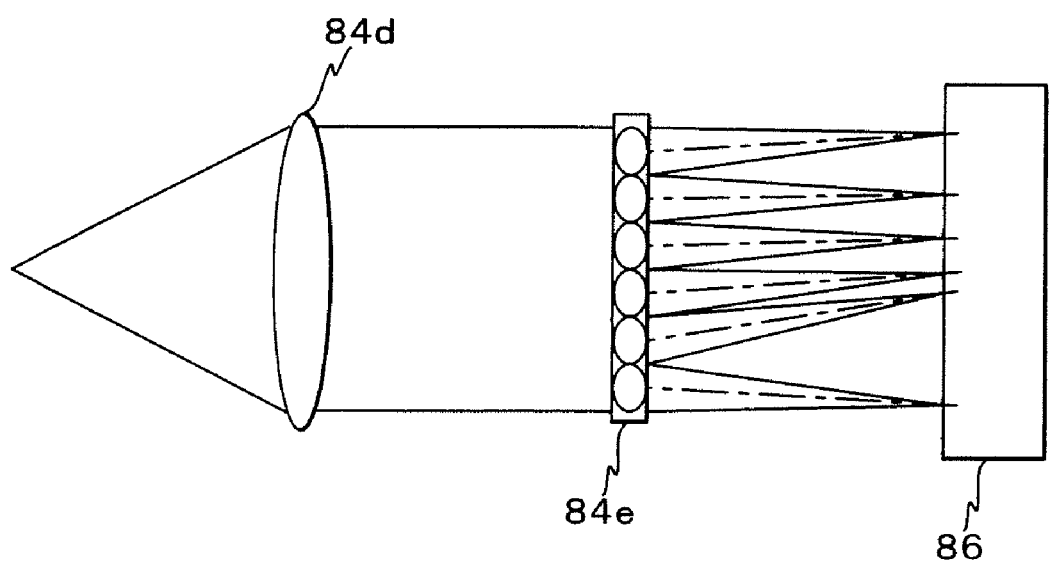
FIG. 4B is a view showing beams emitted from a microlens array when there is aberration in an optical system.

However, because projection optical system PL normally has wavefront aberration, the wavefront of the parallel beams incident on microlens array 84*e* deviates from the ideal wavefront, and corresponding to the deviation, that is, the inclination of the wavefront with respect to the ideal wavefront, the image forming position of each spot deviates from the position on the optical axis of each lens element of microlens array 84*e*, as is shown in FIG. 4B. In this case, the positional deviation of each spot from its reference point (the position on the optical axis of each lens element) corresponds to the inclination of the wavefront.

Then, the lights incident on each of the condensing points on the photodetection element making up photodetection portion 86 (beams of the spot images) are photoelectrically converted at the photodetection element, and the photoelectric conversion signals are sent to main controller 50 via the electric circuit. Based on the photodetection conversion signals, main controller 50 calculates the image forming position of each spot, and furthermore, calculates the positional deviation ($\Delta\xi$, $\Delta\eta$) using the calculation results and the positional data of the known reference points, and stores it in the RAM. During such operation, the measurement values of laser interferometer 54W at the above point (Xi, Yi) are sent to main controller 50.

When measurement of positional deviation of the spot images by wavefront aberration measuring instrument 80 at the image forming point of the focused pinhole image is completed in the manner described above, main controller 50 moves wafer stage WST so that the substantial center of opening 82a of wavefront aberration measuring instrument 80 coincides with the image forming point of the next pinhole image. When this movement is completed, main controller 50 makes light source 16 generate laser beam LB as is previously described, and similarly calculates the image forming position of each spot. Hereinafter, a similar measurement is sequentially performed at the image forming point of other pinhole images.

When all the necessary measurements have been completed in the manner described above, the data on positional deviation ($\Delta\xi$, $\Delta\eta$) of each pinhole image at the image forming point previously described and the coordinate data of each image forming point (the measurement values of laser interferometer 54W (Xi, Yi) when performing measurement the image forming point of each pinhole image) is stored in the RAM of main controller 50. During the above measurement, for example, the position and size of the illumination area on the reticle per pinhole can be changed using reticle blind 30, so that only the focused pinhole on the reticle, or only the area including the focused pinhole is illuminated by illumination light EL.

Next, main controller 50 loads the conversion program into the main memory. Then, according to the conversion program, main controller 50 calculates the wavefront (wavefront aberration) corresponding to the image forming point of the pinhole images, that is, the wavefront corresponding to each of the measurement points from the $1^{st}$ measurement point to the $n^{th}$ measurement point within the field of projection optical system PL, in this case, the coefficients of the terms in the Zernike polynomial in equation (3) that will be described later in the description, such as from coefficient $Z_1$ of the $1^{st}$ term to coefficient $Z_{37}$ of the $37^{th}$ term, based on the positional deviation data ($\Delta\xi$, $\Delta\eta$) for the image forming point of each pinhole images stored in the RAM and the coordinate data for each image forming point, according to the following principle.

In the embodiment, the wavefront of projection optical system PL is obtained by calculation according to the conversion program, based on the above positional deviations ($\Delta\xi$, $\Delta\eta$). That is, positional deviations ($\Delta\xi$, $\Delta\eta$) are values that reflect the gradient of the wavefront with respect to an ideal wavefront, which on the contrary means that the wavefront can be reproduced based on the positional deviation ($\Delta\xi$, $\Delta\eta$). As is obvious from the above physical relation between the positional deviations ($\Delta\xi$, $\Delta\eta$) and the wavefront, the principle of this embodiment for calculating the wavefront is the known Shack-Hartmann wavefront calculation principle.

Next, the method of calculating the wavefront based on the above positional deviations will be briefly described.

As is described above, the positional deviations ($\Delta\xi$, $\Delta\eta$) correspond to the gradient of the wavefront, and by integrating them the shape of the wavefront (or to be more precise, deviations from the reference plane (the ideal wavefront)) is obtained. When the wavefront (deviations from the reference plane) is expressed as W(x,y) and the proportional coefficient is expressed as k, then the relation in the following equations (1) and (2) exist.

$$\Delta\xi = k\frac{\partial W}{\partial x} \quad (1)$$

$$\Delta\eta = k\frac{\partial W}{\partial y} \quad (2)$$

Because it is not easy to integrate the gradient of the wavefront given only at spot positions, the surface shape is expanded in series so that it fits the wavefront. In this case, an orthogonal system is to be chosen for the series. The Zernike polynomial is a series suitable for expanding an axially opposite surface, expanding in a trigonometric series in the circumferential direction. That is, when wavefront W is expressed using a polar coordinate system ($\rho$, $\theta$), the Zernike polynomial is expanded as is shown in equation (3).

$$W(\rho, \theta) = \sum_i Z_i \cdot f_i(\rho\theta) \quad (3)$$

Because the system is an orthogonal system, coefficient $Z_i$ of the terms can be decided independently. Cutting off $i$ at a suitable value corresponds to performing a kind of filtering. Table 1 is an example showing the values of $f_i$ from the $1^{st}$ term to the $37^{th}$ term, along with Zi. In the actual Zernike polynomial, the $37^{th}$ term in Table 1 corresponds to the $49^{th}$ term, however, in this description, it will be handled as i=37 (the $37^{th}$ term). That is, in the invention, the number of terms in the Zernike polynomial is not limited in particular.

TABLE 1

| $Z_i$ | $f_i$ |
|---|---|
| $Z_1$ | 1 |
| $Z_2$ | $\rho \cos\theta$ |
| $Z_3$ | $\rho \sin\theta$ |
| $Z_4$ | $2\rho^2 - 1$ |
| $Z_5$ | $\rho^2 \cos 2\theta$ |
| $Z_6$ | $\rho^2 \sin 2\theta$ |
| $Z_7$ | $(3\rho^3 - 2\rho) \cos\theta$ |
| $Z_8$ | $(3\rho^3 - 2\rho) \sin\theta$ |
| $Z_9$ | $6\rho^4 - 6\rho^2 + 1$ |
| $Z_{10}$ | $\rho^3 \cos 3\theta$ |
| $Z_{11}$ | $\rho^3 \sin 3\theta$ |
| $Z_{12}$ | $(4\rho^4 - 3\rho^2) \cos 2\theta$ |
| $Z_{13}$ | $(4\rho^4 - 3\rho^2) \sin 2\theta$ |
| $Z_{14}$ | $(10\rho^5 - 12\rho^3 + 3\rho) \cos\theta$ |
| $Z_{15}$ | $(10\rho^5 - 12\rho^3 + 3\rho) \sin\theta$ |
| $Z_{16}$ | $20\rho^6 - 30\rho^4 + 12\rho^2 - 1$ |
| $Z_{17}$ | $\rho^4 \cos 4\theta$ |
| $Z_{18}$ | $\rho^4 \sin 4\theta$ |
| $Z_{19}$ | $(5\rho^5 - 4\rho^3) \cos 3\theta$ |
| $Z_{20}$ | $(5\rho^5 - 4\rho^3) \sin 3\theta$ |
| $Z_{21}$ | $(15\rho^6 - 20\rho^4 + 6\rho^2) \cos 2\theta$ |
| $Z_{22}$ | $(15\rho^6 - 20\rho^4 + 6\rho^2) \sin 2\theta$ |

TABLE 1-continued

| $Z_i$ | $f_i$ |
|---|---|
| $Z_{23}$ | $(35\rho^7 - 60\rho^5 + 30\rho^3 - 4\rho) \cos\theta$ |
| $Z_{24}$ | $(35\rho^7 - 60\rho^5 + 30\rho^3 - 4\rho) \sin\theta$ |
| $Z_{25}$ | $70\rho^8 - 140\rho^6 + 90\rho^4 - 20\rho^2 + 1$ |
| $Z_{26}$ | $\rho^5 \cos 5\theta$ |
| $Z_{27}$ | $\rho^5 \sin 5\theta$ |
| $Z_{28}$ | $(6\rho^6 - 5\rho^4) \cos 4\theta$ |
| $Z_{29}$ | $(6\rho^6 - 5\rho^4) \sin 4\theta$ |
| $Z_{30}$ | $(21\rho^7 - 30\rho^5 + 10\rho^3) \cos 3\theta$ |
| $Z_{31}$ | $(21\rho^7 - 30\rho^5 + 10\rho^3) \sin 3\theta$ |
| $Z_{32}$ | $(56\rho^8 - 105\rho^6 + 60\rho^4 - 10\rho^2) \cos 2\theta$ |
| $Z_{33}$ | $(56\rho^8 - 105\rho^6 + 60\rho^4 - 10\rho^2) \sin 2\theta$ |
| $Z_{34}$ | $(126\rho^9 - 280\rho^7 + 210\rho^5 - 60\rho^3 + 5\rho) \cos\theta$ |
| $Z_{35}$ | $(126\rho^9 - 280\rho^7 + 210\rho^5 - 60\rho^3 + 5\rho) \sin\theta$ |
| $Z_{36}$ | $252\rho^{10} - 630\rho^8 + 560\rho^6 - 210\rho^4 + 30\rho^2 - 1$ |
| $Z_{37}$ | $924\rho^{12} - 2772\rho^{10} + 3150\rho^8 - 1680\rho^6 + 420\rho^4 - 42\rho^2 + 1$ |

In actual, the differential is detected as the above positional deviations, therefore, the fitting needs to be performed on the derivatives. In the polar coordinate system ($x=\rho\cos\theta$, $y=\rho\sin\theta$), they are expressed as in the following equations (4) and (5).

$$\frac{\partial W}{\partial x} = \frac{\partial W}{\partial \rho}\cos\theta - \frac{1}{\rho}\frac{\partial W}{\partial \theta}\sin\theta \quad (4)$$

$$\frac{\partial W}{\partial y} = \frac{\partial W}{\partial \rho}\sin\theta + \frac{1}{\rho}\frac{\partial W}{\partial \theta}\cos\theta \quad (5)$$

Because the differential of the Zernike polynomial is not an orthogonal system, the fitting needs to be performed in the least squares method. The information on the image forming point of an spot image (the deviation amount) is given for the X direction and the Y direction, therefore, when the number of pinholes is set as n (n is, for example, from around 81 up to 400), the number of the observation equations that will be given in the above equations (1) to (5) are 2n (from around 162 up to 800).

Each term of the Zernike polynomial corresponds to an optical aberration. Moreover, the low order terms (the terms whose value $_i$ is small) substantially corresponds to the Seidel aberrations. So, by using the Zernike polynomial, the wavefront aberration of projection optical system PL can be obtained.

The calculation procedure of the conversion program is decided according to the principle described above, and by the calculation process according to the conversion program, the information on the wavefront (wavefront aberration) corresponding to each of the measurement points from the $1^{st}$ measurement point to the $n^{th}$ measurement point within the field of projection optical system PL is obtained, which is in this case, the coefficients of each term of the Zernike polynomial, such as the coefficient $Z_1$ of the $1^{st}$ term to the coefficient $Z_{37}$ of the $37^{th}$ term.

Referring back to FIG. 1, inside the hard disc or the like that the first communications server 920 comprises, the target information to be achieved by the first to third exposure apparatus $922_1$ to $922_3$ is stored, such as the resolution, the practical minimum line width (the device rule), the wavelength of illumination light EL (such as center wavelength and wavelength width), information on the patterns subject to transfer, and any other information that is related to determining the quality of the projection optical system of the exposure apparatus $922_1$ to $922_3$ that may possibly be a target value. In addition, in the hard disc that the first communications server 920 comprises, the target information of the exposure apparatus that is to be introduced, for example, such as the information on the pattern that is planned to be used, is also stored as the target information.

Meanwhile, inside the storage unit such as the hard disc or the like that the second communications server 930 comprises, an optimizing program is installed that optimizes the state of a projected image of a pattern formed on an object under any targeted exposure conditions, along with the first database and the second database pertaining to the optimizing program. That is, the optimizing program, the first database, and the second database are stored in an information storage media such as a CD-ROM, which is inserted into a drive unit such as a CD-ROM drive that the second communications server 930 comprises, and the optimizing program is installed into a storage unit such as a hard disc from the drive unit, while the first database and the second database are copied.

The first database is a database of a wavefront aberration variation table per each projection optical system (projection lens) that the exposure apparatus such as exposure apparatus $922_1$ to $922_3$ comprise. The wavefront aberration variation table, in this case, is a variation table that can be obtained by performing simulation using a model substantially equivalent to projection optical system PL, being composed of groups of data arranged according to a predetermined rule that shows the relation between the change in a unit adjustment amount of an adjustment parameter that can be used to optimize the state of the projected image of the pattern formed on the object that can be obtained, and the image forming quality corresponding to each of a plurality of measurement points within the field of projection optical system PL, or to be more specific, wavefront data, such as the variation amount of the coefficients of the Zernike polynomial from the $1^{st}$ term to the $37^{th}$ term.

In the embodiment, as the above adjustment parameters, a total of 19 parameters are used: $z_1$, $\theta x_1$, $\theta y_1$, $z_2$, $\theta x_2$, $\theta y_2$, $z_3$, $\theta x_3$, $\theta y_3$, $z_4$, $\theta x_4$, $\theta y_4$, $z_5$, $\theta x_5$, and $\theta y_5$, which are the drive amount of movable lenses $13_1$, $13_2$, $13_3$, $13_4$, and $13_5$ in directions of each degree of freedom (drivable direction); Wz, W$\theta$x, and W$\theta$y, which are the drive amount of the surface of wafer W (Z tilt stage 58); and $\Delta\lambda$, which is the shift amount of the wavelength of exposure light EL.

The procedure of making the database will now be briefly described. First of all, designed values of projection optical system PL (such as numerical aperture (N.A.), coherence factor value $\sigma$, illumination light wavelength $\lambda$, and data on each lens) is input into a simulation computer where specific optical software is installed. Next, data at any first measurement point within the field of projection optical system PL is input into the simulation computer.

Next, unit quantity data on the shift amount of movable lenses $13_1$ to $13_5$ in directions of each degree of freedom (movable directions), the surface of wafer W in the above degrees of freedom, and of the illumination wavelength is input. For example, when instructions are input to drive movable lens $13_1$ by only a unit quantity in a + direction in a Z direction shift, the simulation computer calculates the data of a first wavefront from the ideal wavefront at a first measurement point decided in advance within the field of projection optical system PL, such as the variation amount of the coefficients of each of the terms in the Zernike polynomial (for example, from the $1^{st}$ term to the $37^{th}$ term), and the variation data is shown on the screen of the simulation computer, as well as stored in memory as parameter PARA1P1.

Next, when instructions are input to drive movable lens $13_1$ by a only unit quantity in a + direction in a Y direction tilt (rotation $\theta$x around the X-axis), the simulation computer calculates the data of a second wavefront at the first measurement point, such as the variation amount of the coefficients of the above terms in the Zernike polynomial, and the variation data is shown on the above screen of the simulation computer, as well as stored in memory as parameter PARA2P1.

Then, when instructions are input to drive movable lens $13_1$ by a only unit quantity in a + direction in an X direction tilt (rotation θy around the Y-axis), the simulation computer calculates the data of a third wavefront at the first measurement point, such as the variation amount of the coefficients of the above terms in the Zernike polynomial, and the variation data is shown on the above screen of the simulation computer, as well as stored in memory as parameter PARA3P1.

Hereinafter, in the same procedure as in the above description, the input for each measurement point from the $2^{nd}$ measurement point to the $n^{th}$ measurement point is performed, and each time instructions are input to drive movable lens $13_1$ in a Z direction shift, a Y direction tilt, or an X direction tilt, the simulation computer calculates the data of a first, a second, and a third wavefront at each measurement point, such as the variation of the coefficients of the above terms in the Zernike polynomial, and the variation data is shown on the above screen of the simulation computer, as well as stored in memory as parameters PARA1P2, PARA2P2, PARA3P2, . . . , PARA1Pn, PARA2Pn, PARA3Pn.

The input for each measurement point and instructions to drive the movable lens in by only a unit quantity in the +direction in directions of each degree of freedom are performed also on other movable lenses $13_2$, $13_3$, $13_4$, and $13_5$, in the same procedure as in the above description, and in response the simulation computer calculates the data of the wavefront at each of the $1^{st}$ measurement point to the $n^{th}$ measurement point for movable lenses $13_2$, $13_3$, $13_4$, and $13_5$, such as the variation amount of the coefficients of the above terms in the Zernike polynomial, and parameter (PARA4P1, PARA5P1, PARA6P1, . . . , PARA15P1), parameter (PARA4P2, PARA5P2, PARA6P2, . . . , PARA15P2), . . . , parameter (PARA4Pn, PARA5Pn, PARA6Pn, . . . , PARA15Pn) are stored in memory.

In addition, input for each measurement point and instructions to drive wafer W by only a unit quantity in the + direction in directions of each degree of freedom are also performed in the same procedure as in the above description, and in response the simulation computer calculates the data of the wavefront at each of the $1^{st}$ measurement point to the $n^{th}$ measurement point when wafer W is driven only by a unit quantity in directions of each degree of freedom, that is, in the Z, θx, and θy directions, such as the variation amount of the coefficients of the terms in the Zernike polynomial, and parameter (PARA16P1, PARA17P1, PARA18P1), parameter (PARA16P2, PARA17P2, PARA18P2), . . . , parameter (PARA16Pn, PARA17Pn, PARA18Pn) are stored in memory.

Furthermore, regarding wavelength shift, input for each measurement point and instructions to shift the wavelength by only a unit quantity in the + direction are also performed in the same procedure as in the above description, and in response the simulation computer calculates the data of the wavefront at each of the $1^{st}$ measurement point to the $n^{th}$ measurement point when the wavelength is shifted in the + direction only by a unit quantity, such as the variation amount of the coefficients of the terms in the Zernike polynomial, and PARA19P1, PARA19P2, . . . , and PARA19Pn are stored in memory.

Each of the above parameters PARAiPj (i=1 to 19, j=1 to n) is a row-matrix (vector) of 1 row and 37 columns. That is, when n=33, an adjustment parameter PARA1 can be expressed as in the following equation, (6).

$$\left.\begin{aligned} PARA1P1 &= [\, Z_{1,1} \quad Z_{1,2} \quad \ldots \quad Z_{1,37}\,] \\ PARA1P2 &= [\, Z_{2,1} \quad Z_{2,2} \quad \ldots \quad Z_{2,37}\,] \\ &\qquad\vdots \\ PARA1Pn &= [\, Z_{33,1} \quad Z_{33,2} \quad \ldots \quad Z_{33,37}\,] \end{aligned}\right\} \quad (6)$$

In addition, an adjustment parameter PARA2 can be expressed as in the following equation, (7).

$$\left.\begin{aligned} PARA2P1 &= [\, Z_{1,1} \quad Z_{1,2} \quad \ldots \quad Z_{1,37}\,] \\ PARA2P2 &= [\, Z_{2,1} \quad Z_{2,2} \quad \ldots \quad Z_{2,37}\,] \\ &\qquad\vdots \\ PARA2Pn &= [\, Z_{33,1} \quad Z_{33,2} \quad \ldots \quad Z_{33,37}\,] \end{aligned}\right\} \quad (7)$$

Similarly, the other adjustment parameters PARA3 to PARA19 can be expressed as in the following equation, (8).

$$\left.\begin{aligned} PARA3P1 &= [\, Z_{1,1} \quad Z_{1,2} \quad \ldots \quad Z_{1,37}\,] \\ PARA3P2 &= [\, Z_{2,1} \quad Z_{2,2} \quad \ldots \quad Z_{2,37}\,] \\ &\qquad\vdots \\ PARA3Pn &= [\, Z_{33,1} \quad Z_{33,2} \quad \ldots \quad Z_{33,37}\,] \\ &\qquad\vdots \\ PARA19P1 &= [\, Z_{1,1} \quad Z_{1,2} \quad \ldots \quad Z_{1,37}\,] \\ PARA19P2 &= [\, Z_{2,1} \quad Z_{2,2} \quad \ldots \quad Z_{2,37}\,] \\ &\qquad\vdots \\ PARA19Pn &= [\, Z_{33,1} \quad Z_{33,2} \quad \ldots \quad Z_{33,37}\,] \end{aligned}\right\} \quad (8)$$

Then, PARA1P1 to PARA19Pn, which are composed of the variation amount of the coefficients of each of the Zernike polynomial and stored in memory, are grouped by each adjustment parameter and then sorted into a wavefront aberration variation table for each of the 19 adjustment parameters. That is, as is representatively shown in the following equation, (9), in the case of adjustment data PARA1, a wavefront aberration variation table is made for each parameter, which is stored in memory.

$$\begin{bmatrix} PARA1P1 \\ PARA1P2 \\ \vdots \\ PARA1Pn \end{bmatrix} = \begin{bmatrix} Z_{1,1} & Z_{1,2} & \ldots & Z_{1,36} & Z_{1,37} \\ Z_{2,1} & & & & Z_{2,37} \\ \vdots & & \ddots & & \vdots \\ Z_{32,1} & & & & Z_{32,27} \\ Z_{33,1} & Z_{33,2} & \ldots & Z_{33,36} & Z_{33,37} \end{bmatrix} \quad (9)$$

And, the database composed of the wavefront aberration variation table for each type of exposure apparatus made in the above manner is stored in the hard disc or the like that the second communications server 930 comprises, as the first database. Although in the embodiment, one wavefront aberration variation table is made for the projection optical system of the same type, the wavefront aberration variation table may be made for each projection optical system (that is, per each exposure apparatus), regardless of the type.

Next, the second database will be described.

The second database is a database that includes the image forming quality of the projection optical system that is obtained under different exposure conditions, which are optical conditions (such as exposure wavelength, numerical aperture (N.A.) of the projection optical system (the maximum N.A, the N.A. set on exposure, or the like), and illumination conditions (illumination N.A (numerical aperture (N.A.) of the illumination optical system) or illumination σ (coherence factor), and the aperture shape of illumination system aperture stop plate 24 (the light amount distribution of the illumination light on the pupil plane of the illumination optical system, that is, the shape of the secondary light source)), and evaluation items (such as the type of mask, line width, evaluation amount, and information on the pattern), and under a plurality of exposure conditions decided by combining such optical conditions and evaluation items, respectively. Such a database including the image forming quality of the projection optical system is, for example, a calculation chart made up of the variation amount of 1λ in each of the $1^{st}$ to $37^{th}$ terms, or in other words, the Zernike Sensitivity Chart.

Incidentally, in the following description, the Zernike Sensitivity Chart will be referred to as Zernike Sensitivity or ZS. In addition, the file composed of the Zernike Sensitivity Chart under a plurality of exposure conditions will hereinafter be referred to as 'ZS file' as appropriate.

In the embodiment, each Zernike Sensitivity Chart contains the following 12 aberrations as the image forming quality: that is, distortions $Dis_x$ and $Dis_y$ in the X-axis and Y-axis directions, four types of line width abnormal values $CM_V$, $CM_H$, $CM_R$, and $CM_L$ that serve as index values for coma, four types of curvature of field $CF_V$, $CF_H$, $CF_R$, and $CF_L$, and two types of spherical aberration $SA_V$ and $SA_H$.

Next, the method of optimizing the state of the projected image of the reticle pattern formed on the wafer in the first to third exposure apparatus 922₁ to 922₃ will be described, according to a flow chart in FIG. 5 (and FIGS. 6 to 10 and 14 to 20), which is a processing algorithm of a processor that the second communications server 930 comprises.

Figure 5:
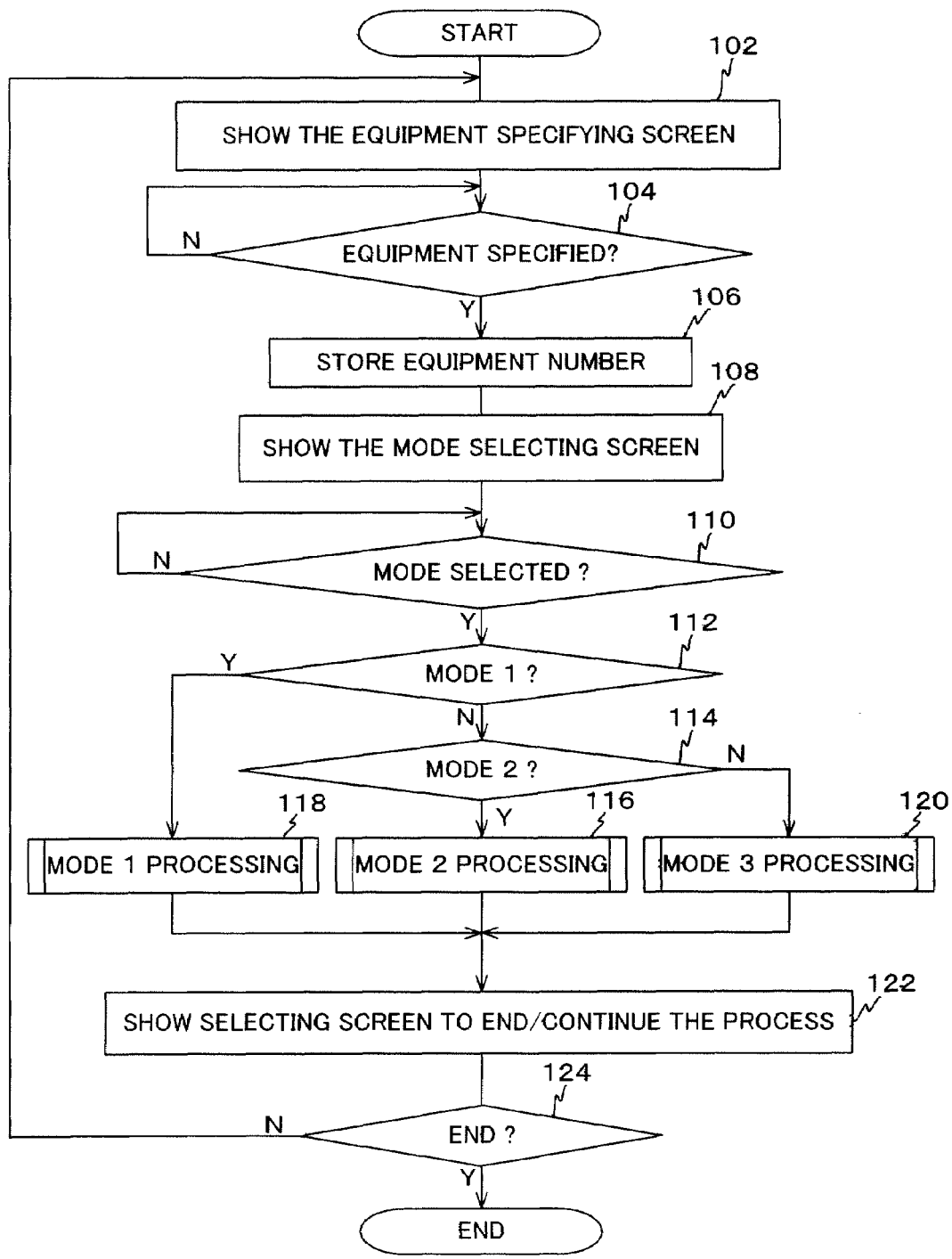
FIG. 5 is a flowchart showing a processing algorithm executed by a CPU in a second communications server.

The operation in the flow chart in FIG. 5 starts, for example, when an operator of the exposure apparatus in the clean room sends instructions that include specifying the exposure apparatus subject to optimizing by e-mail via the first communications server 920 to an operator on the side of the second communications server 930, and the operator inputs instructions to start the processing into the second communications server 930.

First of all, in step 102, the screen to specify the equipment subject to optimizing is shown on the display.

In the next step, step 104, the procedure is on standby until the equipment specified in the e-mail by the operator, such as exposure apparatus 922₁, is specified via a pointing device such as a mouse. Then, when the equipment is specified, the procedure proceeds onto step 106, where the specified equipment is stored, for example, by storing data such as the equipment number.

In the next step, step 108, the display shows the mode selecting screen. In the embodiment, a mode is selectable from modes 1 to 3, therefore, for example, the mode selecting screen shows selections buttons for mode 1, mode 2, and mode 3.

In the next step, step 110, the procedure is on standby until the mode is selected. Then, when the operator selects the mode using the mouse or the like, the step the proceeds to step 112 where the decision is made whether the mode selected is mode 1 or not. When mode 1 is selected, the step then proceeds to step 118, to a sub-routine that performs processing in mode 1 (hereinafter also referred to as 'mode 1 processing routine'). In this case, mode 1 is a mode where optimizing is performed using an ID reference that is already available. Mode 1 is mainly selected in cases when, for example, illumination conditions or the numerical aperture (N.A.) of the projection optical system is changed during the operation of exposure apparatus 922₁, in a state where adjustment has already been performed under an exposure condition serving as a reference (reference ID).

Figure 6:
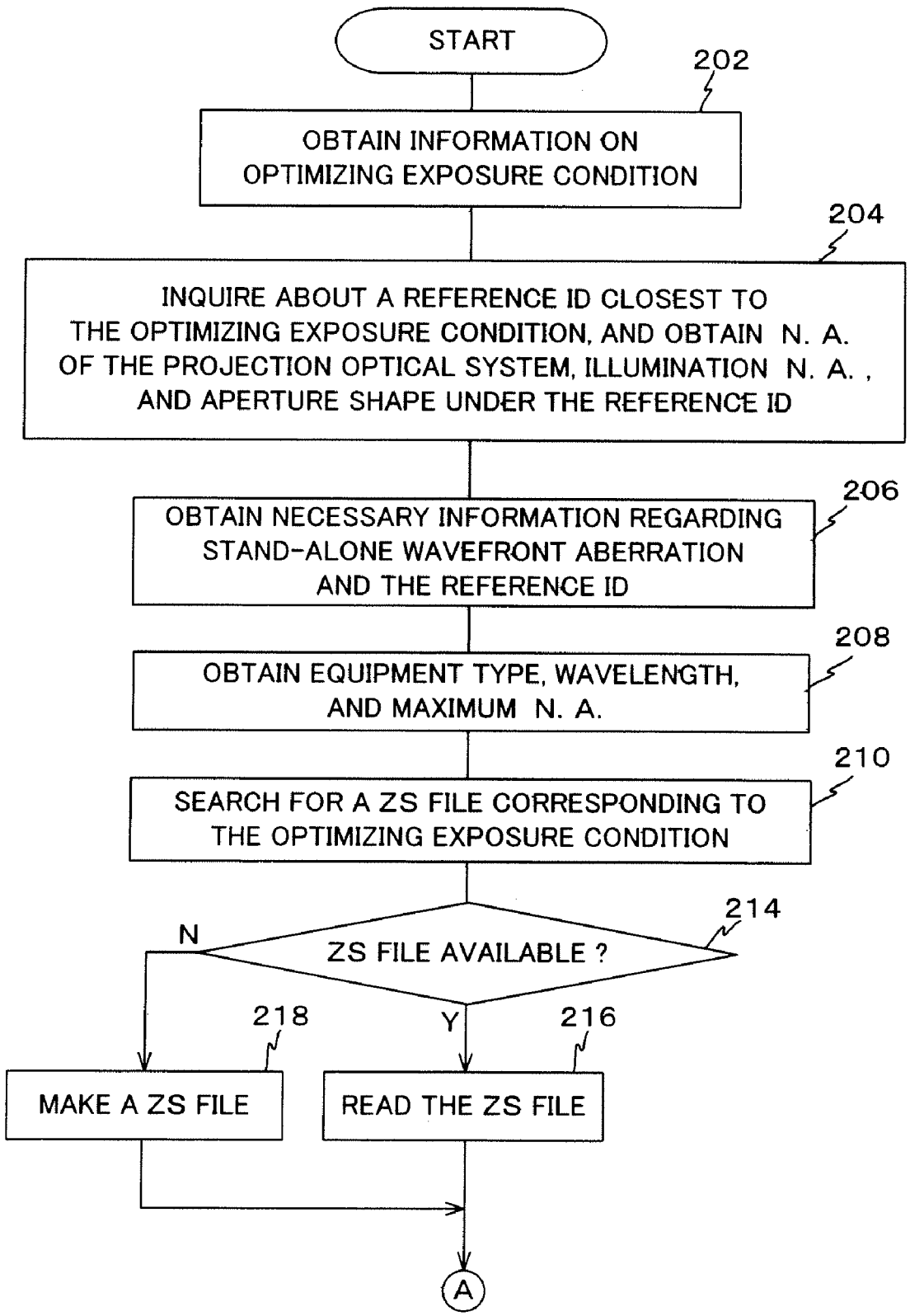
FIG. 6 is a flow chart (No. 1) showing a processing in step 118 in FIG. 5.

In mode 1 processing routine (hereinafter also referred to as 'the first mode'), first of all, in step 202 in FIG. 6, information on exposure conditions subject to optimizing (hereinafter referred to as 'optimizing exposure conditions' as appropriate) is obtained. To be more specific, an inquiry is made to the first communications server 920 (or to main controller 50 of the specified equipment (exposure apparatus 922₁) via the first communications server 920) on setting information of the specified equipment (exposure apparatus 922₁) such as the current N.A of the projection optical system, illumination conditions (such as illumination N.A. or illumination σ, and the type of aperture stop), and the subject pattern type, and the information obtained.

In the next step, step 204, an inquiry is made to the first communications server 920 (or to main controller 50 of the specified equipment (exposure apparatus 922₁) via the first communications server 920) on a reference ID that is the closest reference to the above optimizing exposure conditions, and obtains the setting information such as the N.A. of the projection optical system and illumination conditions (such as illumination N.A. or illumination σ, and the type of aperture stop) under the reference ID.

In the next step, step 206, necessary information on the stand-alone wavefront aberration and the above reference ID, or to be more specific, information on the adjustment amount values (adjustment parameters) under the reference ID, the wavefront aberration correction amount against the stand-alone wavefront aberration under the reference ID (or information on the image forming quality), or the like, is obtained from the first communications server 920 (or to main controller 50 of the specified equipment (exposure apparatus 922₁) via the first communications server 920).

The reason for referring to the wavefront aberration correction amount (or information on the image forming quality) here, is because when the wavefront aberration correction amount is unknown under the reference ID, the wavefront aberration correction amount (or the wavefront aberration) can be estimated from the image forming quality. The estimation of the wavefront aberration correction amount from the image forming quality will be described later in the description.

Normally, the stand-alone wavefront aberration and the wavefront aberration of projection optical system PL after it is built into the exposure apparatus (hereinafter referred to as 'on-body wavefront aberration') do not coincide for some reason, however, for the sake of simplicity in the description, the correction is to be performed at the start-up of the exposure apparatus or during the adjustment in the making of the exposure apparatus for each of the reference IDs (the exposure condition serving as a reference).

In the next step, step 208, information on the apparatus such as the name of the model, its exposure wavelength, and the maximum N.A. of its projection optical system is obtained from the first communications server 920 (or to main controller 50 of the specified equipment (exposure apparatus 922₁) via the first communications server 920).

Then, in the next step, step 210, the ZS file that corresponds to the optimizing exposure conditions previously described, is searched for in the second database.

In the next step, step 214, the decision is made whether the ZS file corresponding to the optimizing exposure conditions has been found or not, when it has been found, the ZS file is loaded into the memory such as the RAM. On the other hand, when the decision in step 214 is denied, that is, when the ZS file corresponding to the optimizing conditions is not available within the second database, the procedure then proceeds to step 218 to make the ZS file using a ZS file in the second database according to, for example, an interpolation method that is described below.

Following will be a brief description exemplifying such an interpolation method.

The Zernike Sensitivity (the Zernike Sensitivity Chart) changes, depending on the illumination conditions, the N.A. of the projection optical system, the type of reticle pattern, and the evaluation items.

As the illumination conditions, illumination $\sigma$ and the light quantity distribution of the illumination light on the pupil plane of the illumination optical system (for example, the size and shape of the secondary light source referred to earlier) including the annular ratio can be representatively given.

In addition, examples of the reticle pattern types include the following: an extracted pattern or a residual pattern, a dense pattern or an isolated pattern, in the case of dense lines (lines and spaces) its pitch, line width, and duty ratio, whereas in the case of isolated lines its line width, in the case of contact holes its longitudinal length, its lateral length, and the length between the hole patterns (such as its pitch), and whether the reticle is a phase shift pattern (including a halftone type) or a phase shift reticle or not and its type (such as a spatial frequency modulation type and a halftone type).

In addition, the evaluation items include aberrations such as distortion, the line width abnormal values (the index values for coma), focus (image plane), and spherical aberration (focus difference between patterns); however, the evaluation items are not limited to the ones above. For example, it may be of any other items, as long as it is an image forming quality (aberration) or its index value that can be evaluated using the Zernike polynomial.

In this interpolation method, basically, two or more known points are required that can be interpolated. Extrapolation will not be performed, because it causes some problems from the viewpoint of accuracy. More specifically, when there are only two known points, linear interpolation is performed. Whereas, when there are three or more known points, linear interpolation or an interpolation with high precision such as polynomial approximation (as in quadratic function or cubic function) or spline interpolation is performed. The method to be employed is decided depending on the amount of the Zernike Sensitivity variation ratio (first and second derivatives). When the variation is monotonous, linear interpolation is performed.

In addition, when there is a plurality of conditions that are to be interpolated, successive interpolation is performed.

Hereinafter, as an example, the case will be described when no ZS files are available that coincide with the conditions of N.A. of the projection optical system=0.74 and illumination $\sigma$ (hereinafter also appropriately described as '$\sigma$')=0.52 (however, conditions other than the N.A. and $\sigma$ coincide with the required conditions), therefore, a ZS file related to focus is made by the interpolation method that contains the conditions of line width 100 nm, isolated lines, extracted pattern, N.A. of the projection optical system=0.74, and illumination $\sigma$=0.52. In this case, interpolation of the Zernike Sensitivity related to the plurality of conditions N.A.=0.74 and illumination $\sigma$=0.52 needs to be sequentially performed.

(1) First of all, the points that can be used for interpolation are confirmed. That is, the ZS files that can be used for interpolation are selected. In the case of this example, because interpolation is to be performed at three points, three points are selected for N.A. as well as for $\sigma$, which makes 3×3=9 conditions of ZS files necessary. Then, the 9 ZS files that can be interpolated are selected. That is, in this case, 9 ZS files are selected whose N.A is 0.8, 0.7, or 0.6, and $\sigma$ is 0.4, 0.5, or 0.6 as is shown below.

ZS(N.A.=0.60, $\sigma$=0.4), ZS(N.A.=0.60, $\sigma$=0.5), ZS(N.A.=0.60, $\sigma$=0.6)

ZS(N.A.=0.70, $\sigma$=0.4), ZS(N.A.=0.70, $\sigma$=0.5), ZS(N.A.=0.70, $\sigma$=0.6)

ZS(N.A.=0.80, $\sigma$=0.4), ZS(N.A.=0.80, $\sigma$=0.5), ZS(N.A.=0.80, $\sigma$=0.6)

Hereinafter, interpolation calculation is performed in sequence for each condition.

(2) Interpolation calculation is performed to make the ZS file related to N.A.=0.74.

Figure 11:
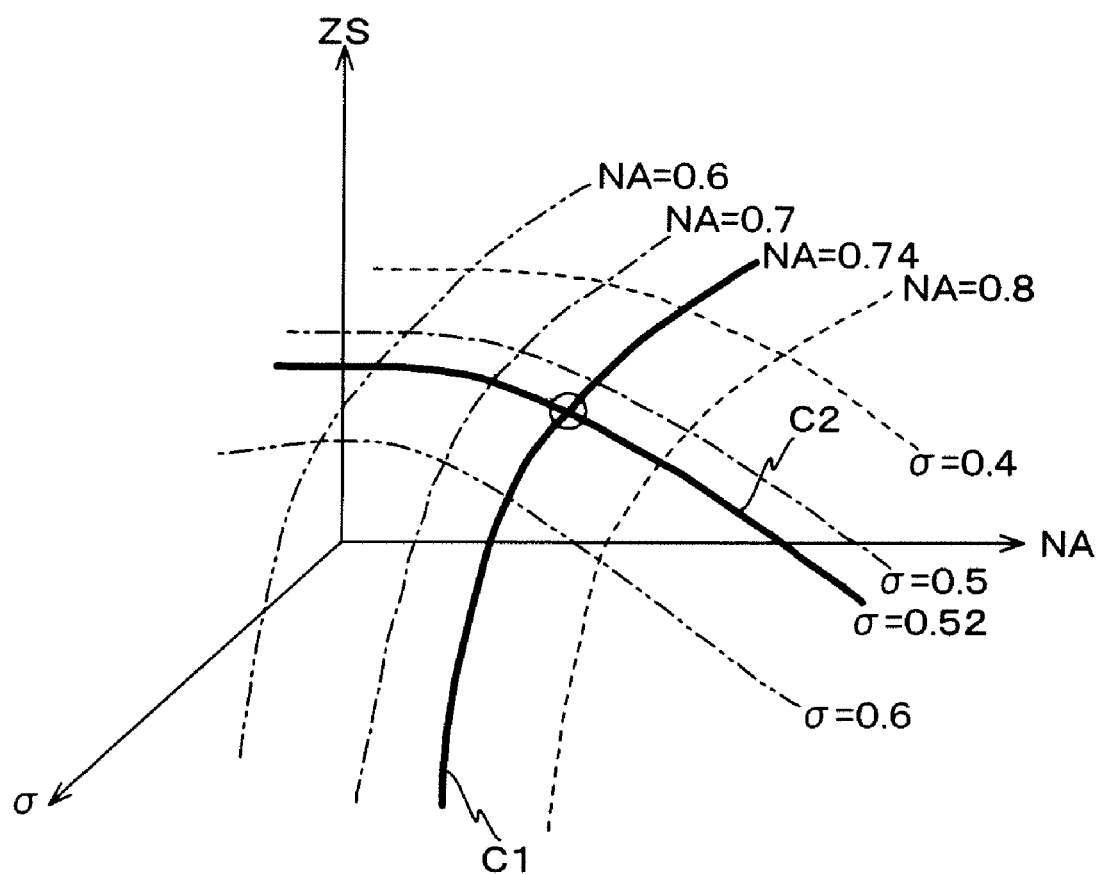
FIG. 11 is a schematic diagram for showing an interpolation method to make a ZS file.

As is modeled in FIG. 11, in the vicinity of N.A.=0.74, when the Zernike Sensitivity related to N.A.=0.6, 0.7, and 0.8 is known, a quadric function approximation (or a spline interpolation) is performed according to the three points. As a result, the ZS files turn out to be as follows.

ZS(N.A.=0.6, $\sigma$=0.4), ZS(N.A.=0.6, $\sigma$=0.5), ZS(N.A.=0.6, $\sigma$=0.6)

ZS(N.A.=0.7, $\sigma$=0.4), ZS(N.A.=0.7, $\sigma$=0.5), ZS(N.A.=0.7, $\sigma$=0.6)

ZS(N.A.=0.74, $\sigma$=0.4), ZS(N.A.=0.74, $\sigma$=0.5), ZS(N.A.=0.74, $\sigma$=0.6)

ZS(N.A.=0.8, $\sigma$=0.4), ZS(N.A.=0.8, $\sigma$=0.5), ZS(N.A.=0.8, $\sigma$=0.6)

FIG. 11 shows the approximation curve of N.A.=0.74 obtained in this interpolation in a solid line C1.

(3) Next, interpolation calculation is performed to make the ZS file related to $\sigma$=0.52.

In the vicinity of $\sigma$=0.52, when the Zernike Sensitivity related to $\sigma$=0.4, 0.5, and 0.6 is known, a quadric function approximation (or a spline interpolation) is performed according to the three points. As a result, the ZS files turn out to be as follows.

ZS(N.A.=0.6, $\sigma$=0.4), ZS(N.A.=0.6, $\sigma$=0.5), ZS(N.A.=0.6, $\sigma$=0.52), ZS(N.A.=0.6, $\sigma$=0.6)

ZS(N.A.=0.7, $\sigma$=0.4), ZS(N.A.=0.7, $\sigma$=0.5), ZS(N.A.=0.7, $\sigma$=0.52), ZS(N.A.=0.7, $\sigma$=0.6)

ZS(N.A.=0.74, $\sigma$=0.4), ZS(N.A.=0.74, $\sigma$=0.5), ZS(N.A.=0.74, $\sigma$=0.52), ZS(N.A.=0.74, $\sigma$=0.6)

ZS(N.A.=0.8, $\sigma$=0.4), ZS(N.A.=0.8, $\sigma$=0.5), ZS(N.A.=0.8, $\sigma$=0.52), ZS(N.A.=0.8, $\sigma$=0.6)

FIG. 11 shows the approximation curve of $\sigma$=0.52 obtained in this interpolation in a solid line C2.

As is obvious from FIG. 11, the intersecting point of the curves C1 and C2 (circled point ($\circ$)) shows the ZS file related to focus made by the interpolation method that contains the conditions of line width 100 nm, isolated lines, extracted pattern, N.A. of the projection optical system=0.74, and illumination $\sigma$=0.52.

Employing the method of making a new ZS file by such an interpolation method easily solves realistic problems, such as the difficulty of making all the ZS files in advance because of continuous variable items such as the N.A and the $\sigma$, and the fact that the ZS files cannot be made under all conditions in a fine pitch in advance, due to too many combinations.

In addition, the interpolation method has been confirmed suitable for making new ZS files related to conditions such as the N.A. of the projection optical system, illumination σ, annular ratio, pitch (dense lines, contact holes), and longitudinal width/lateral width (contact holes). Furthermore, the above interpolation method is also effective when making a ZS file related to the distance between a partial area where the intensity distribution of the illumination light on the pupil plane of the illumination optical system can be increased by modified illumination such as quadrupole illumination and the axis of the illumination optical system, or a ZS file related to the size of the partial area (corresponding to illumination σ).

Figure 7:
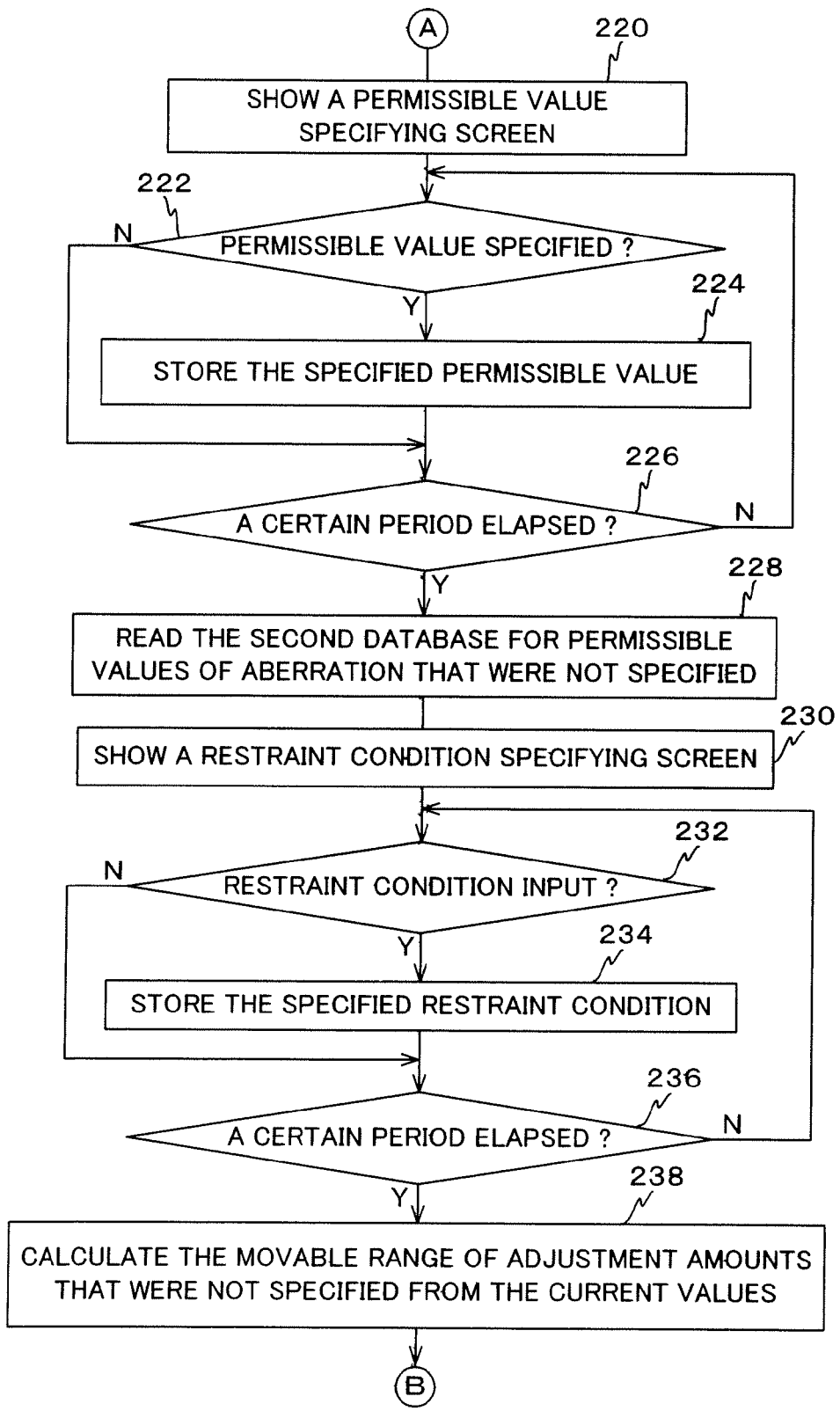
FIG. 7 is a flow chart (No. 2) showing a processing in step 118 in FIG. 5.

Next, in step 220 in FIG. 7, the display shows the specifying screen for specifying the permissible value of the image forming quality (the twelve aberrations referred to earlier). Then, in step 222, the decision is made whether the permissible values are input or not, and when the decision has been denied, the procedure then proceeds to step 226 where the decision is made to see if a certain period of time has elapsed after the input screen for the above permissible values has been displayed. And, when the decision is negative, the procedure then returns to step 222. Meanwhile, in step 222, when the operator has specified the permissible values via the keyboard or the like, then the specified permissible values for aberration are stored in memory such as the RAM, and the procedure moves to step 226. That is, the procedure waits for a certain period of time for the permissible values to be specified, while steps 222→226 or steps 222→224→226 are being repeated in a loop.

The permissible values do not necessarily have to be used in the optimizing calculation itself (calculating the adjustment amount of the adjustment parameter using a merit function φ, which will be described later in the embodiment). They will, however, be required when evaluating the calculation results. Furthermore, in the embodiment, these permissible values will be required when weighting of the image forming quality is set, which will also be described later in the description.

Then, when the above certain period of time has elapsed, the procedure then moves on to step 228 where the ZS database within the second database is read for permissible values of aberration that were not specified are read, according to the default setting. As a consequence, both the specified permissible values of aberration and the remaining permissible values read from the ZS database are stored in memory.

In the next step, step 230, the display shows a specifying screen for restraint conditions, and then in step 232, the decision is made whether the restraint conditions have been input in step 232. When the decision is denied, the procedure then moves to step 236 where the decision is made to see if a certain period of time has passed since showing the above specifying screen. When this decision is denied, the procedure then returns to step 232. On the other hand, when the operator has specified the restraint conditions via the keyboard or the like in step 232, the procedure then moves to step 234 where the restraint conditions of the specified adjustment parameters are stored in memory such as the RAM, and then proceeds to step 236. That is, the procedure waits for a certain period of time for the permissible values to be specified, while steps 232→236 or steps 232→234→236 are being repeated in a loop.

Restraint conditions, in this case, refers to the permissible movable range of each adjustment amount (adjustment parameter) referred to earlier such as the permissible movable range of movable lenses 13₁ to 13₅ in directions of each degree of freedom, the permissible movable range of Z tilt stage 58 in directions of three degrees of freedom, and the permissible range of wavelength shift.

And, when the above certain period of time has elapsed, the procedure then moves to step 238 where the movable range for each adjustment parameter is calculated based on the current values as the restraint conditions of the parameters that were not specified, and is stored in memory. As a consequence, both the restraint conditions of the specified adjustment parameters and the restraint conditions of the remaining adjustment parameters that have been calculated are stored in memory.

Figure 8:
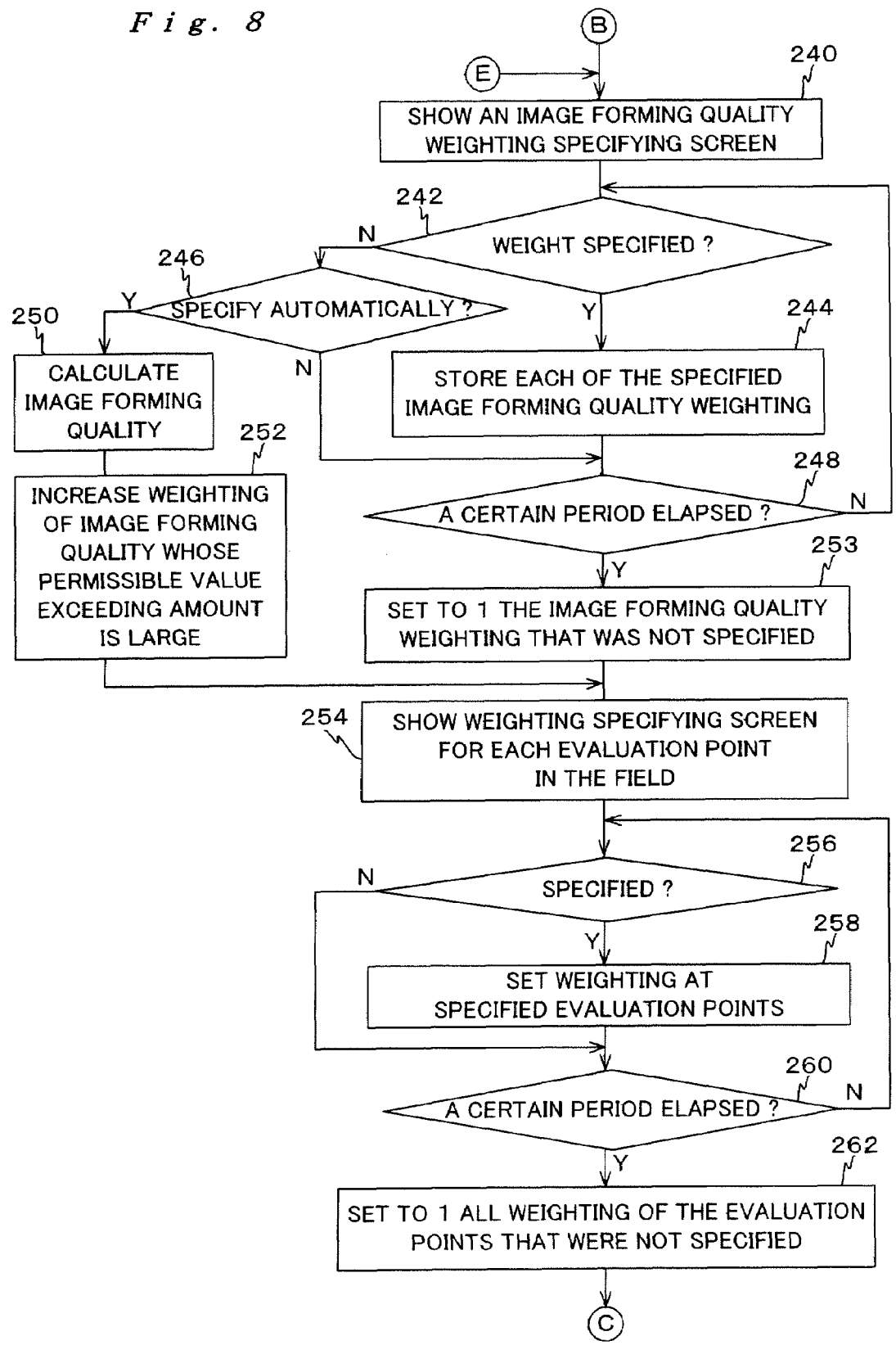
FIG. 8 is a flow chart (No. 3) showing a processing in step 118 in FIG. 5.

Next, in step 240 in FIG. 8, the display shows a screen to specify the weighting of the image forming quality. In the case of the embodiment, when specifying the weighting of the image forming quality, because the 12 aberrations described earlier needs to be specified at 33 evaluation points (measurement points) within the field of the projection optical system, 33×12=396 weightings need to be specified. Therefore, the weighting specifying screen is made to show the following two screens to specify such weightings; first, the screen to specify the 12 types of image forming quality weighting, and then the screen to specify the weighting at each evaluation point within the field. In addition, on the screen to specify the weighting of the image forming quality, an automatic specify button is also shown.

Then, in step 242, the decision is made whether a weighting of an image forming quality is specified or not. When the operator has specified a weighting via the keyboard or the like, the procedure then moves to step 244 where the weighting of the specified image forming quality (aberration) is stored in memory such as the RAM, and then the procedure proceeds to step 248. In step 248, the decision is made whether a certain period of time has elapsed since the above weighting specifying screen has been displayed, and when the decision is negative, then the procedure returns to step 242.

Meanwhile, when the decision turns out to be negative in the above step 242, the procedure then moves to step 246 to see if the automatic specify button has been selected. And, when the result is negative, the procedure then moves to step 248. On the other hand, when the operator has selected the automatic specify button via the mouse or the like, the procedure then moves to step 250 where the current image forming quality is calculated based on the following equation, (10).

$$f = Wa \cdot ZS \quad (10)$$

In this case, f is an image forming quality expressed as in the following equation (11), and Wa is the wavefront aberration data shown in the following equation (12), which is calculated from the stand-alone wavefront aberration and the wavefront aberration correction amount under the reference ID obtained in step 206. In addition, ZS is data of a ZS file, shown as in the following equation (13), which is obtained in step 216 or 218.

$$f = \begin{bmatrix} f_{1,1} & f_{1,2} & \cdots & f_{1,11} & f_{1,12} \\ f_{2,1} & & & & f_{2,12} \\ \vdots & & \ddots & & \vdots \\ f_{32,1} & & & & f_{32,12} \\ f_{33,1} & f_{33,2} & \cdots & f_{33,11} & f_{33,12} \end{bmatrix} \quad (11)$$

-continued $$Wa = \begin{bmatrix} Z_{1,1} & Z_{1,2} & \cdots & Z_{1,36} & Z_{1,37} \\ Z_{2,1} & & & & Z_{2,37} \\ \vdots & & \ddots & & \vdots \\ Z_{32,1} & & & & Z_{32,27} \\ Z_{33,1} & Z_{33,2} & \cdots & Z_{33,36} & Z_{33,37} \end{bmatrix} \quad (12)$$

$$ZS = \begin{bmatrix} b_{1,1} & b_{1,2} & \cdots & b_{1,11} & b_{1,12} \\ b_{2,1} & & & & b_{2,12} \\ \vdots & & \ddots & & \vdots \\ b_{36,1} & & & & b_{36,12} \\ b_{37,1} & b_{37,2} & \cdots & b_{37,11} & b_{37,12} \end{bmatrix} \quad (13)$$

In equation (11), $f_{i,1}$ (i=1 to 33) indicates $Dis_x$ at the $i^{th}$ measurement point, $f_{i,2}$ indicates $Dis_y$ at the $i^{th}$ measurement point, $f_{i,3}$ indicates $CM_V$ at the $i^{th}$ measurement point, $f_{i,4}$ indicates $CM_H$ at the $i^{th}$ measurement point, $f_{i,5}$ indicates $CM_R$ at the $i^{th}$ measurement point, $f_{i,6}$ indicates $CM_L$ at the $i^{th}$ measurement point, $f_{i,7}$ indicates $CF_V$ at the $i^{th}$ measurement point, $f_{i,8}$ indicates $CF_H$ at the $i^{th}$ measurement point, $f_{i,9}$ indicates $CF_R$ at the $i^{th}$ measurement point, $f_{i,10}$ indicates $CF_L$ at the $i^{th}$ measurement point, $f_{i,11}$ indicates $SA_V$ at the $i^{th}$ measurement point, and $f_{i,12}$ indicates $SA_H$ at the $i^{th}$ measurement point, respectively.

In addition, in equation (12), $Z_{i,j}$ indicates the coefficient of the $j^{th}$ term in the Zernike polynomial.

In addition, in equation (13), $b_{p/q}$ (p=1 to 37, q=1 to 12) indicates the components of the ZS file, and among the components, $b_{p,1}$ indicates the change of $Dis_x$ per $1\lambda$ in the $p^{th}$ term of the Zernike polynomial which is an expansion of the wavefront aberration, $b_{p,2}$ indicates the change of $Dis_y$ per $1\lambda$ in the $p^{th}$ term, $b_{p,3}$ indicates the change of $CM_V$ per $1\lambda$ in the $p^{th}$ term, $b_{p,4}$ indicates the change of $CM_H$ per $1\lambda$ in the $p^{th}$ term, $b_{p,5}$ indicates the change of $CM_R$ per $1\lambda$ in the $p^{th}$ term, $b_{p,6}$ indicates the change of $CM_L$ per $1\lambda$ in the $p^{th}$ term, $b_{p,7}$ indicates the change of $CF_V$ per $1\lambda$ in the $p^{th}$ term, $b_{p,8}$ indicates the change of $CF_H$ per $1\lambda$ in the $p^{th}$ term, $b_{p,9}$ indicates the change of $CF_R$ per $1\lambda$ in the $p^{th}$ term, $b_{p,10}$ indicates the change of $CF_L$ per $1\lambda$ in the $p^{th}$ term, $b_{p,11}$ indicates the change of $SA_V$ per $1\lambda$ in the $p^{th}$ term, and $b_{p,12}$ indicates the change of $SA_H$ per $1\lambda$ in the $p^{th}$ term, respectively.

In the next step, step 252, of the calculated 12 types of image forming quality (aberrations), the weighting of the image forming quality that greatly exceeds the permissible values which are previously set is increased (greater than 1), and then the procedure proceeds to step 254. This operation does not necessarily have to be performed, and the image forming quality greatly exceeding the permissible values may be shown on the screen in different colors instead. Such an arrangement helps the operator when specifying the weighting of the image forming quality.

In the embodiment, the procedure waits for a certain period of time so that the weighting of the image forming quality can be specified, while the loop composed of steps 242→246→248 or steps 242→244→248 is repeated. And when the automatic specify button is selected during the period, automatic specifying is performed. On the other hand, when the automatic specify button is not selected, if at least one or more weighting of the image forming quality is specified, the specified weighting is stored in memory. Then, after a certain period of time, the procedure moves on to step 253 where each weighting of the image forming quality that is not specified is set to 1 according to a default setting, and then the procedure proceeds to step 254.

As a consequence, both the specified weighting of the image forming quality and the remaining weighting (=1) are stored in memory.

In the next step, step 254, the display shows a screen for specifying the weighting at the evaluation points (measurement points) within the field, and then in step 256 the decision is made whether the weighting at the evaluation points is specified or not. When the decision is negative, the procedure then moves to step 260 where the decision is made whether a certain period of time has elapsed or not since showing the above screen for specifying the weighting at the evaluation points (measurement points). When the decision is negative, the procedure returns to step 256.

Meanwhile, when the operator specifies the weighting of an evaluation point (normally, an evaluation point that especially needs to be improved is selected) via the keyboard or the like in step 256, the procedure then moves to step 258 where the weighting at the evaluation point is set and stored in memory such as the RAM. Then the procedure moves on to step 260.

That is, the procedure waits for a certain period of time so that the weighting of the evaluation point can be specified, while the loop composed of steps 256→260 or steps 256→258→260 is repeated.

Then, after a certain period of time, the procedure moves on to step 262 where the weighting of the evaluation points that is not specified are all set to 1 according to a default setting, and then the procedure proceeds to step 264.

As a consequence, both the specified value of the weighting at the specified evaluation point and the weighting of the remaining evaluation points (=1) are stored in memory.

Figure 9:
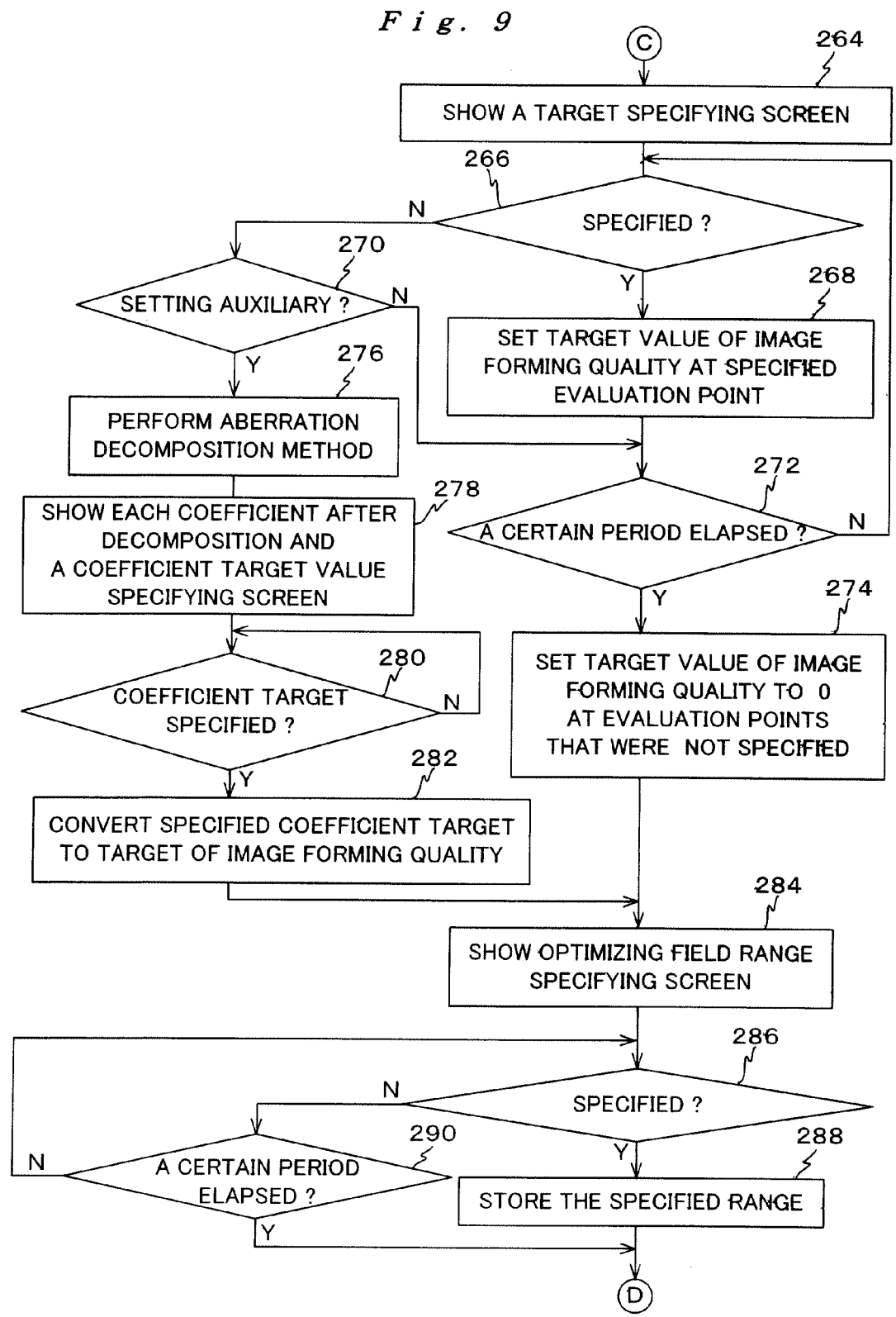
FIG. 9 is a flow chart (No. 4) showing a processing in step 118 in FIG. 5.
Figure 10:
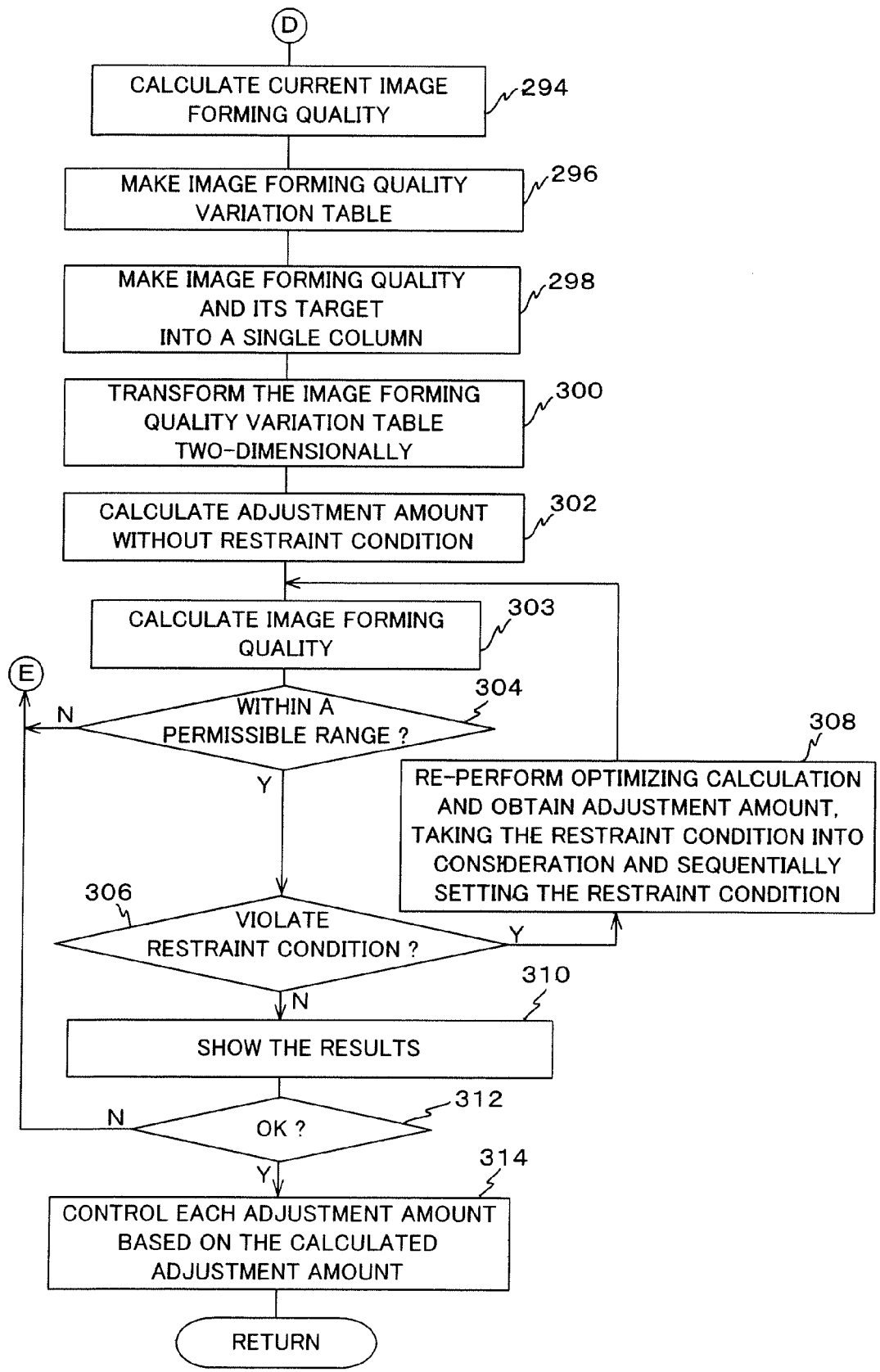
FIG. 10 is a flow chart (No. 5) showing a processing in step 118 in FIG. 5.

In step 264 in FIG. 9, the display shows the screen for specifying the target value (target) of the image forming quality (the 12 types of aberrations referred to earlier) at each evaluation point in the field. In the case of the embodiment, the target of the image forming quality needs to be specified at 33 evaluation points (measurement points) within the field of the projection optical system for the 12 aberrations described earlier, so 33×12=396 targets need to be specified. Therefore, the screen for specifying the targets also shows a setting auxiliary button, along with the section for manual specification.

Then, in the next step, step 266, the procedure is suspended for a predetermined period of time to wait for the targets to be specified (that is, the decision is made whether the targets are specified or not), and when they are not specified (when the decision is negative), the procedure moves to step 270 where the decision is made whether the setting auxiliary button has been selected or not. When this decision is negative, the procedure then proceeds to step 272 where the decision is made whether a certain period of time has elapsed since the above target specifying screen has been displayed. And, when the decision is negative, then the procedure returns to step 266.

Meanwhile, when the operator selects the setting auxiliary button with the mouse or the like in step 270, the procedure then proceeds to step 276 where an aberration decomposition method is performed.

The aberration decomposition method will now be described.

First of all, power expansion is performed on each image forming quality (aberration), which is a component of image forming quality f described earlier, on x and y as in the following equation (14).

$$f = G \cdot A \quad (14)$$

In the above equation, (14), G is a 33 row 17 column matrix as is shown in the following equation (15).

$$G = \begin{bmatrix} g_1(x_1, y_1) & g_2(x_1, y_1) & \cdots & g_{16}(x_1, y_1) & g_{17}(x_1, y_1) \\ g_1(x_2, y_2) & & & & g_{17}(x_2, y_2) \\ \vdots & & \ddots & & \vdots \\ g_1(x_{32}, y_{32}) & & & & g_{17}(x_{32}, y_{32}) \\ g_1(x_{33}, y_{33}) & g_2(x_{33}, y_{33}) & \cdots & g_{16}(x_{33}, y_{33}) & g_{17}(x_{33}, y_{33}) \end{bmatrix} \quad (15)$$

In this case, $g_1=1$, $g_2=x$, $g_3=y$, $g_4=x^2$, $g_5=xy$, $g_6=y^2$, $g_7=x^3$, $g_8=x^2y$, $g_9=xy^2$, $g_{10}=y^3$, $g_{11}=x^4$, $g_{12}=x^3y$, $g_{13}=x^2y^2$, $g_{14}=xy^3$, $g_{15}=y^4$, $g_{16}=x(x^2+y^2)$, and $g_{17}=y(x^2+y^2)$. In addition, $(x_i, y_i)$ is the xy coordinate of the $i^{th}$ evaluation point.

In addition, in the above equation (14), A is a matrix composed of 17 rows and 12 columns whose components are decomposition coefficients, as is shown in the following equation (16).

$$A = \begin{bmatrix} a_{1,1} & a_{1,2} & \cdots & a_{1,11} & a_{1,12} \\ a_{2,1} & & & & a_{2,12} \\ \vdots & & \ddots & & \vdots \\ a_{16,1} & & & & a_{16,12} \\ a_{17,1} & a_{17,2} & \cdots & a_{17,11} & a_{17,12} \end{bmatrix} \quad (16)$$

The above equation (14) is then transformed into the following equation (17), so that the least squares method can be performed.

$$G^T \cdot f = G^T \cdot G \cdot A \quad (17)$$

In this case, $G^T$ is a transposed matrix of matrix G.

Next, matrix A is obtained using a least squares method, based on the above equation (17).

$$A = (G^T \cdot G)^{-1} \cdot G^T \cdot f \quad (18)$$

The aberration decomposition method is performed in the manner described above, and after the decomposition is completed, each of the decomposition item coefficients is obtained.

Referring back to FIG. 9, in the next step, step 278, the display shows each of the decomposition item coefficients after decomposition obtained in the manner described above, as well as the screen for specifying the target values of the coefficients.

Then, in the next step, step 280, the procedure is suspended to wait for all the target values (targets) of the decomposition item coefficients to be specified. And, when the operator specifies all the targets of the decomposition coefficients via the keyboard or the like, the step then proceeds to step 282 where the targets of the decomposition item coefficients are converted into targets of the image forming quality. In this case, the operator specifies the target by revising the target only for the coefficient that needs to be improved, and as for the remaining targets, the coefficients shown may, as a matter of course, be specified as the targets.

$$F_t = G \cdot A' \quad (19)$$

In the above equation (19), $f_t$ is a target of a specified image forming quality, and A' is a matrix whose component is the specified decomposition item coefficient (revised).

Incidentally, each of the decomposition item coefficients that is calculated does not necessarily have to be shown on the screen, and the target that needs to be revised can be automatically set based on each of the calculated decomposition item coefficients.

Meanwhile, when the operator specifies a target for an image forming quality at an evaluation point via the keyboard or the like in the above step 266, the decision made in step 266 is positive, and the procedure moves on to step 268 where the specified target is set and stored in memory such as the RAM. The procedure then moves on to step 272

That is, in the embodiment, the procedure waits for a certain period of time from when the target specifying screen referred to earlier has been shown so that the targets can be specified, while the loop composed of steps 266→270→272 or steps 266→268→272 is repeated. And, when the setting auxiliary is specified during the period, the targets are specified by calculating and showing the decomposition item coefficients that is calculated, and specifying the targets of the decomposition item coefficients, as is previously described. In the case the setting auxiliary button is not selected, when one or more image forming quality targets are specified at one or more evaluation points, the specified image forming quality target at the evaluation point is stored in memory. And, when a certain period of time elapses, the procedure then moves on to step 274 where each of the image forming quality targets at each measurement point that were not specified are all set to 0 according to a default setting, then the procedure proceeds to step 284.

As a result, both the specified image forming quality target at the specified evaluation point and the remaining image forming quality targets (=0) are stored in memory, for example, in the form of a 33 row 12 column matrix $f_t$ as is shown in the following equation (20).

$$f_t = \begin{bmatrix} f'_{1,1} & f'_{1,2} & \cdots & f'_{1,11} & f'_{1,12} \\ f'_{2,1} & & & & f'_{2,12} \\ \vdots & & \ddots & & \vdots \\ f'_{32,1} & & & & f'_{32,12} \\ f'_{33,1} & f'_{33,2} & \cdots & f'_{33,11} & f'_{33,12} \end{bmatrix} \quad (20)$$

In the embodiment, the image forming quality at the evaluation points where the targets are not specified is not taken into consideration in the optimizing calculation. Accordingly, the image forming quality has to be evaluated again, after the solutions are obtained.

In the next step, step 284, the display shows the screen for specifying the optimizing field range, and then the loop composed of steps 286→290 is repeated while the procedure waits for a certain period of time for the field range to be specified, after the specifying screen of the optimizing field range is displayed. The reason for making it possible to specify the optimizing range is because points such as the ones described below are taken into consideration: in the scanning exposure apparatus such as in the so-called scanning steppers, the image forming quality or the transferred state of the pattern on the object in the entire field of the projection optical system does not necessarily have to be optimized, or as in the case of steppers used in the embodiment, depending on the reticle that is used or its size of the pattern area (that is, the entire pattern area or a part of the pattern area that is used when exposing a wafer) the image forming quality or the transferred state of the pattern on the object in the entire field of the projection optical system does not necessarily have to be optimized.

And, when the optimizing field is specified within a certain period of time, the procedure then moves on to step 288 where the specified range is stored in memory such as the RAM. Then, the procedure proceeds to step 294 in FIG. 294. On the other hand, when the optimizing field range is not specified, the procedure then simply proceeds to step 294 without performing any particular operation.

In step 294, the current image forming quality is calculated, based on equation (10) referred to earlier.

Then, in the next step, step 296, an image forming quality variation table is made for each adjustment parameter, using the wavefront aberration variation table (refer to the equation (9) previously described) and the ZS (Zernike Sensitivity) file for each adjustment parameter, or the Zernike Sensitivity Chart. This can be expressed as in the following equation (21).

$$\text{image forming quality variation table} = \text{wavefront aberration variation table} \cdot \text{ZS file} \qquad (21)$$

The equation (21) is a calculation in which the wavefront aberration variation table (a matrix having 33 rows and 37 columns) and the ZS file (a matrix having 37 rows and 12 columns) are multiplied, therefore, the results obtained, that is, an image forming quality variation table B1 is, for example, a matrix that has 33 rows and 12 columns expressed as in the following equation (22).

$$B1 = \begin{bmatrix} h_{1,1} & h_{1,2} & \cdots & h_{1,11} & h_{1,12} \\ h_{2,1} & & & & h_{2,12} \\ \vdots & & \ddots & & \vdots \\ h_{32,1} & & & & h_{32,12} \\ h_{33,1} & h_{33,2} & \cdots & h_{33,11} & h_{33,12} \end{bmatrix} \qquad (22)$$

The image forming quality variation table is calculated for each of the 19 adjustment parameters. As a result, 19 image forming quality variation tables B1 to B19 are obtained, each composed of a matrix having 33 rows and 12 columns.

In the next step, step 298, image forming quality f and its target $f_t$ are made into a single column (one-dimensional column). Being made into a single column, in this case, means to transform the matrices f and $f_t$ of 33 rows and 12 columns into matrices of 396 rows and a single column. The following equations (23) and (24) are f and $f_t$ after such transformation is performed.

$$f = \begin{bmatrix} f_{1,1} \\ f_{2,1} \\ \vdots \\ f_{33,1} \\ f_{1,2} \\ f_{2,2} \\ \vdots \\ f_{33,2} \\ \vdots \\ f_{1,12} \\ f_{2,12} \\ \vdots \\ f_{33,12} \end{bmatrix} \qquad (23)$$

$$f_t = \begin{bmatrix} f'_{1,1} \\ f'_{2,1} \\ \vdots \\ f'_{33,1} \\ f'_{1,2} \\ f'_{2,2} \\ \vdots \\ f'_{33,2} \\ \vdots \\ f'_{1,12} \\ f'_{2,12} \\ \vdots \\ f'_{33,12} \end{bmatrix} \qquad (24)$$

In the next step, step 300, the 19 image forming quality variation tables for each adjustment parameter made in the above step 296 are transformed into a two-dimensional form. In this case, such a transformation into a two-dimensional form refers to converting the form of the 19 types of image forming quality variation tables that are each made up of a 33 row 12 column matrix into a matrix having 396 rows and 19 columns so that each column shows the image forming quality variation at each evaluation point against an adjustment parameter. An example of an image forming quality variation table that has completed such a two-dimensional transformation is shown as B in the following equation (25).

$$B = \begin{bmatrix} h_{1,1} & h_{1,1}^2 & \cdots & \cdots & h_{1,1}^{19} \\ h_{2,1} & & & & \vdots \\ \vdots & & & & \\ h_{33,1} & & & & \\ h_{1,2} & & & & \vdots \\ h_{2,2} & & & & \\ \vdots & & & & \\ h_{33,2} & & & & \\ \vdots & & & & \vdots \\ h_{1,12} & & & & \\ \vdots & & & & \vdots \\ h_{33,12} & h_{33,12}^2 & \cdots & \cdots & h_{33,12}^{19} \end{bmatrix} \qquad (25)$$

When the image forming quality variation table has undergone such two-dimensional transformation in the manner described above, the procedure then moves on to step 302, where the variation amount (adjustment amount) of the adjustment parameter is calculated without consideration of the restraint conditions.

Hereinafter, the processing in step 302 will be described. When the weighting is not taken into consideration, a relation that is expressed as in the following equation (26) exists between image forming quality target $f_t$ that has been made into a single column, image forming quality f that has been made into a single column, image forming quality variation table B that has undergone two-dimensional transformation, and an adjustment amount dx of the adjustment parameter.

$$(f_t - f) = B \cdot dx \qquad (26)$$

In this case, dx is a matrix having 19 rows and 1 column as is shown in the following equation (27) whose components are the adjustment amounts of each adjustment parameter. In addition, ($f_t$–f) is a matrix that has 396 rows and 1 column, as is shown in the following equation (28).

$$dx = \begin{bmatrix} dx_1 \\ dx_2 \\ dx_3 \\ dx_4 \\ \vdots \\ dx_{19} \end{bmatrix} \quad (27)$$

$$(f_t - f) = \begin{bmatrix} f'_{1,1} - f_{1,1} \\ f'_{2,1} - f_{2,1} \\ \vdots \\ f'_{33,1} - f_{33,1} \\ f'_{1,2} - f_{1,2} \\ f'_{2,2} - f_{2,2} \\ \vdots \\ f'_{33,2} - f_{33,2} \\ \vdots \\ f'_{1,12} - f_{1,12} \\ f'_{2,12} - f_{2,12} \\ \vdots \\ f'_{33,12} - f_{33,12} \end{bmatrix} \quad (28)$$

When the above equation (26) is solved by the least squares method, it can be expressed as in the following equation.

$$dx = (B^T \cdot B)^{-1} \cdot B^T \cdot (f_t - f) \quad (29)$$

In this case, $B^T$ is a transposed matrix of image forming quality variation table B referred to earlier, and $(B^T \cdot B)^{-1}$ is an inverse matrix of $(B^T \cdot B)$.

However, the case is rare when the weighting is not specified (all the weightings=1). Therefore, normally, when the weighting is specified, a merit function φ as is shown in the following equation (30), which serves as a weighting function, is solved using the least squares method.

$$\phi = \Sigma w \cdot (f_{ti} - f_i)^2 \quad (30)$$

In this case, $f_{ti}$ is a component of $f_t$, and $f_i$ is a component of f. When the above equation is transformed, it can be expressed as follows.

$$\phi = \Sigma \cdot (w_i^{1/2} \cdot f_{ti} - w_i^{1/2} \cdot f_i)^2 \quad (31)$$

Accordingly, when $w_i^{1/2} \cdot f_i$ is a new image forming quality (aberration) $f_i'$ and $w_i^{1/2} \cdot f_{ti}$ a new target $f_{ti}'$, then merit function φ will be expressed as follows.

$$\phi = \Sigma \cdot (f_{ti}' - f_i')^2 \quad (32)$$

Accordingly, the above equation (32) may be solved using the least squares method. However, in this case, the image forming quality variation table expressed as in the following equation has to be used.

$$\partial f_i'/\partial x_j = w_i^{1/2} \cdot \partial f_i/\partial x_j \quad (33)$$

As is described, in step 302 the 19 components of dx, that is, the adjustment amounts of the 19 adjustment parameters PARA1 to PARA19 are obtained by the least squares method, without taking into consideration the restraint conditions.

In the next step, step 303, by substituting the adjustment amounts of the 19 adjustment parameters that are obtained into, for example, the above equation (26), each component of matrix f, that is, the 12 types of aberration (image forming quality) at all the evaluation points are calculated.

In the next step, step 304, the decision is made whether the above calculated 12 types of aberration at all the evaluation points is within the individual permissible values that are set in advance or not, and when the decision is negative, the procedure then returns to step 240 referred to earlier. Then, by performing the processing after step 240, the target and weighting are set again, and the optimizing process performed.

Meanwhile, when the decision in step 304 is affirmed, the procedure then moves on to step 306 where the decision is made whether the adjustment amounts of the 19 adjustment parameters calculated in the above step 302 fail to satisfy the restraint conditions that have been previously set (the decision making method will be described further later in the description). And, when the decision is affirmed, the procedure then moves on to step 308.

Hereinafter, the processing that is performed when the restraint conditions are violated will be described, including step 308.

The merit function on such violation of the restraint conditions can be expressed, as in the following expression (34).

$$\phi = \phi_1 + \phi_2 \quad (34)$$

In the above equation, $\phi_1$ is an ordinary merit function as is shown in equation (30), and $\phi_2$ is a penalty function (restraint conditions violation amount). When the restraint conditions are expressed as $g_j$ and the boundary values $b_j$, $\phi_2$ is to be a weighted squared sum of the boundary value violation amount ($g_j - b_j$), as in the following equation (35).

$$\phi_2 = \Sigma w_j' \cdot (g_j - b_j)^2 \quad (35)$$

The reason for $\phi_2$ being a squared sum of the boundary value violation amount is because when $\phi_2$ takes the form of a squared sum of the violation amount, the following equation (36) can be solved for dx by the least squares method.

$$\partial \phi/\partial X = \partial \phi_1/\partial X + \partial \phi_2/\partial X = 0 \quad (36)$$

That is, dx can be obtained as in the normal least squares method.

Next, concrete processing on violation of the restraint conditions will be described Restraint conditions are physically determined by the movable range of each of the three drive axes (piezoelectric elements) of the movable lenses $13_1$ to $13_5$ and the tilt (θx and θy) limit physically determines the restraint conditions.

The movable range in each axis can be expressed as in the following equations (37a) to (37c), with z1, z2, and z3 indicating the position of each axis.

$$z1a \leq z1 \leq z1b \quad (37a)$$

$$z2a \leq z2 \leq z2b \quad (37b)$$

$$z3a \leq z3 \leq z3b \quad (37c)$$

In addition, the limit unique to tilt can be exemplified as in the following equation (37d).

$$(\theta x^2 + \theta y^2)^{1/2} \leq +40'' \quad (37d)$$

The reason for choosing 40" is for the following reason. When 40" is transformed into radian, $$40'' = 40/3600 \text{ degrees}$$
$$= \pi/(90 \times 180) \text{ radian}$$
$$= 1.93925 \times 10^{-4} \text{ radian.}$$

Accordingly, for example, when a radius r of movable lenses $13_1$ to $13_5$ is around 200 mm, the movement amount of each axis is as follows.

$$\text{axis movement amount} = 1.93925 \times 10^{-4} \times 200 \text{ mm}$$
$$= 0.03878 \text{ mm}$$
$$= 38.78 \text{ μm} \approx 40 \text{ μm}$$

That is, when the tilt is 40", the perimeter moves around 40 μm from the horizontal position. The movement amount of each axis is strokes whose average is around 200 μm, therefore, compared with such strokes of the axes around 200 μm, 40 μm is an amount that cannot be ignored. The tilt, however, is not limited to 40", and can be set at any value according to, for example, the strokes of the drive axis. In addition, the restraint conditions may take into consideration not only the movable range previously described and the tilt limit, but also the shift range of the wavelength of illumination light EL or the movable range related to the wafer (Z tilt stage 58) in the Z direction and its tilt.

In order to prevent violation of the restraint conditions, the above equations (37a) to (37d) have to be satisfied at the same time.

Therefore, first of all, as is described in the above step 302, optimizing is performed without taking the restraint conditions into consideration, and the adjustment amount dx of the adjustment parameters is obtained. This dx is to be shown as a movement vector k0 ($Z_i$, $\theta x_i$, $\theta y_i$, i=1 to 7) as in the diagram in FIG. 12. In this case, i=1 to 5 correspond to movable lenses $13_1$ to $13_5$, i=6 corresponds to the wafer (Z tilt stage), and i=7 corresponds to the wavelength shift of the illumination light. The wavelength of the illumination light does not actually have three degrees of freedom, however, in this case, it does, for the sake of convenience.

Next, the decision is made whether at least one of the above conditions (37a) to (37d) is not satisfied (step 306), and when the decision is denied, that is, the above equations (37a) to (37d) are all satisfied at the same time, the processing when the restraint conditions are violated will not be required, therefore, the processing performed on violation of the restraint conditions comes to an end (steps 306→310). On the other hand, when at least one of the conditions in the above equations (37a) to (37d) is not satisfied, the procedure then moves on to step 308.

Figure 12:
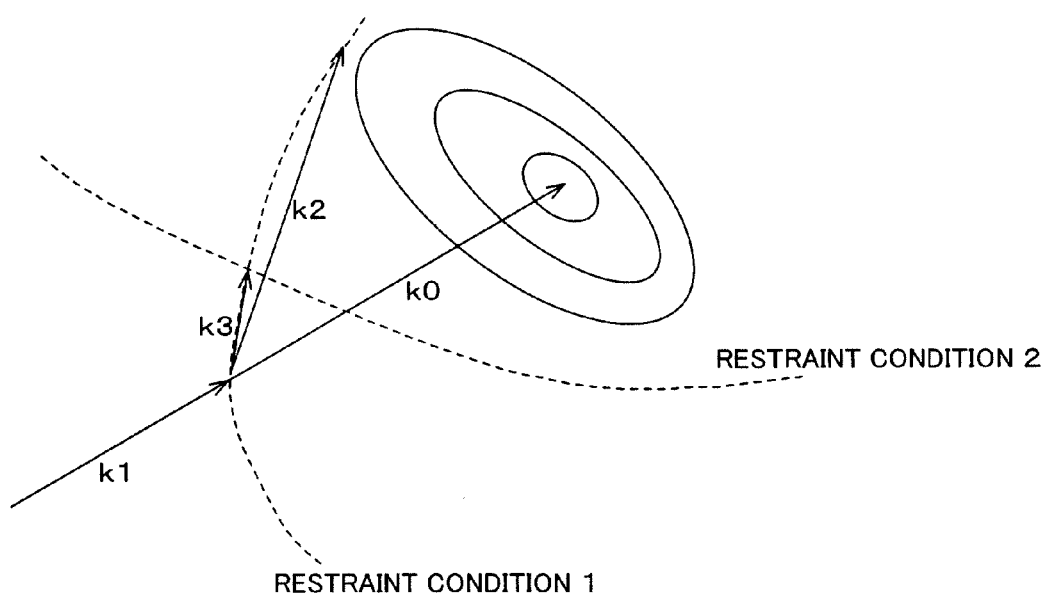
FIG. 12 is a view modeling a processing when a restraint condition is violated.

In step 308, as is shown in FIG. 12, the movement vector k0 that has been obtained is scaled down, and the condition and the point that firstly violate the restraint conditions are obtained. The vector is expressed as k1.

Next, the optimizing calculation is reperformed, with the condition serving as a restraint condition and the restraint condition violation amount regarded as an aberration. In this case, the image forming quality variation table related to the restraint condition violation amount is calculated at a point on k1. And, in this manner, movement vector k2 in FIG. 12 is obtained.

'The restraint condition violation amount regarded as an aberration,' in this case, means that the restraint condition violation amount, which can be expressed as, for example, $z1-z1b$, $z2-z2b$, $z3-z3b$, $(\theta x^2 + \theta y^2)^{1/2} - 40$, can be a restraint condition aberration.

For example, when $z2$ violates the restraint condition of $z2 \leq z2b$, the restraint condition violation amount ($z2-z2b$) can be regarded as an aberration and the normal optimizing processing can be performed. Accordingly, in this case, a row on the restraint condition is added to the image forming quality variation table. Such restraint condition is added also to the image forming quality (aberration) and its target. In this case, when the weighting is largely set, then $z2$ is consequently fixed to a boundary value $z2b$.

Because the restraint condition is a nonlinear function of $\theta x$ and $\theta y$, a different derivative can be obtained depending on the place picked for the image forming quality variation table. Accordingly, the adjustment amount (movement amount) and the image forming quality variation table have to be sequentially calculated.

Next, as is shown in FIG. 12, scaling is performed on vector k2, and the condition and the point that firstly violate the restraint conditions are obtained. Then, the vector up to the point is to be k3.

Hereinafter, the above setting of the restraint conditions is sequentially performed (adding restraint conditions in the order of the movement vector violating the restraint conditions), and the processing for re-optimizing and obtaining the movement amount (adjustment amount) is repeated until the restraint conditions are not violated.

With such operation, the following equation can be obtained as a conclusive movement vector.

$$k = k1 + k3 + k5 + \quad (38)$$

In this case, to simplify the process, k1 may be the solution (answer), that is, linear approximation may be performed. Or, when the optimal value is strictly searched within the range of the restraint conditions, k of the above equation (38) may be obtained by sequential calculation.

Next, optimizing that takes the restraint conditions into consideration is further described.

As is described, normally, the following equation stands.

$$(f_r - f) = B \cdot dx \quad (26)$$

By solving this equation using the least squares method, adjustment amount dx of the adjustment parameter can be obtained.

The image forming quality variation chart can therefore be divided as is shown in the following equation (39), into a normal variation table and a restraint condition variation table.

$$B = \begin{bmatrix} B_1 \\ B_2 \end{bmatrix} \quad (39)$$

In this case, $B_1$ is a normal variation table without dependence on location. Meanwhile, $B_2$ is a restraint condition variation table that is dependent on location.

In addition, the left side of the above equation (26) ($f_r - f$) can also be divided into 2 accordingly, as is shown in the following equation (40).

$$f_t - f = \begin{bmatrix} f_{t1} - f_1 \\ f_{t2} - f_2 \end{bmatrix} \quad (40)$$

In this case, $f_{t1}$ is the normal aberration target and $f_1$ is the current aberration. In addition, $f_{t2}$ is the restraint condition and $f_2$ is the current restraint condition violation amount.

Because restraint condition variation table $B_2$, current aberration $f_1$, and current restraint condition violation amount $f_2$ are dependent on location, they need to be newly calculated per movement vector.

Then, by performing optimizing calculations in the usual manner using the variation table, optimizing that takes the restraint conditions into account is performed.

In step 308, the adjustment amount is obtained in the manner described above, taking the restraint conditions into account into consideration, and then the procedure returns to step 303.

On the other hand, when the decision in step 306 is denied, that is, when there is no restraint condition violation and when the restraint condition violation has been dissolved, the procedure then moves on to step 310 where the results are shown on the display. In the embodiment, the following are shown as results: the adjustment amount of 19 adjustment parameters (in this case, the variation amount from the position under the reference ID), the values of each adjustment parameter after adjustment, the image forming quality (the 12 types of aberration) values after optimizing, the wavefront aberration correction amount (carrying over the same value as the wavefront aberration correction amount under the reference ID), the OK button, and the NG button.

And, when the operator sees the results shown on the display and selects the NG button with the mouse or the like, the procedure then returns to step 240 previously described. The NG button can be selected in cases such as when the operator is satisfied with the weighting and the target permissible values that have been set, but wants to further improve a specific aberration or the image forming quality at a specific evaluation point by resetting the weighting and performing the optimizing again.

Meanwhile, when the operator sees the results shown on the display and selects the OK button with the mouse or the like, the procedure then moves on to step 314 where based on the calculated adjustment amount, each section that requires adjustment (at least one of movable lenses $13_1$ to $13_5$, the Z position and tilt of wafer W, and the wavelength shift amount of the illumination light) is controlled via the first communications server 920 and main controller 50 of exposure apparatus $922_1$.

In this case, as the adjustment amount of movable lens $13i$ (i=1 to 5), when the displacement amount is calculated in directions of three degrees of freedom, in the Z, $\theta x$ (rotation around the x-axis), and $\theta y$ (rotation around the y-axis) directions, these adjustment amounts are transformed into drive amounts z1, z2, and z3 for each axis in the following manner.

Figure 13:
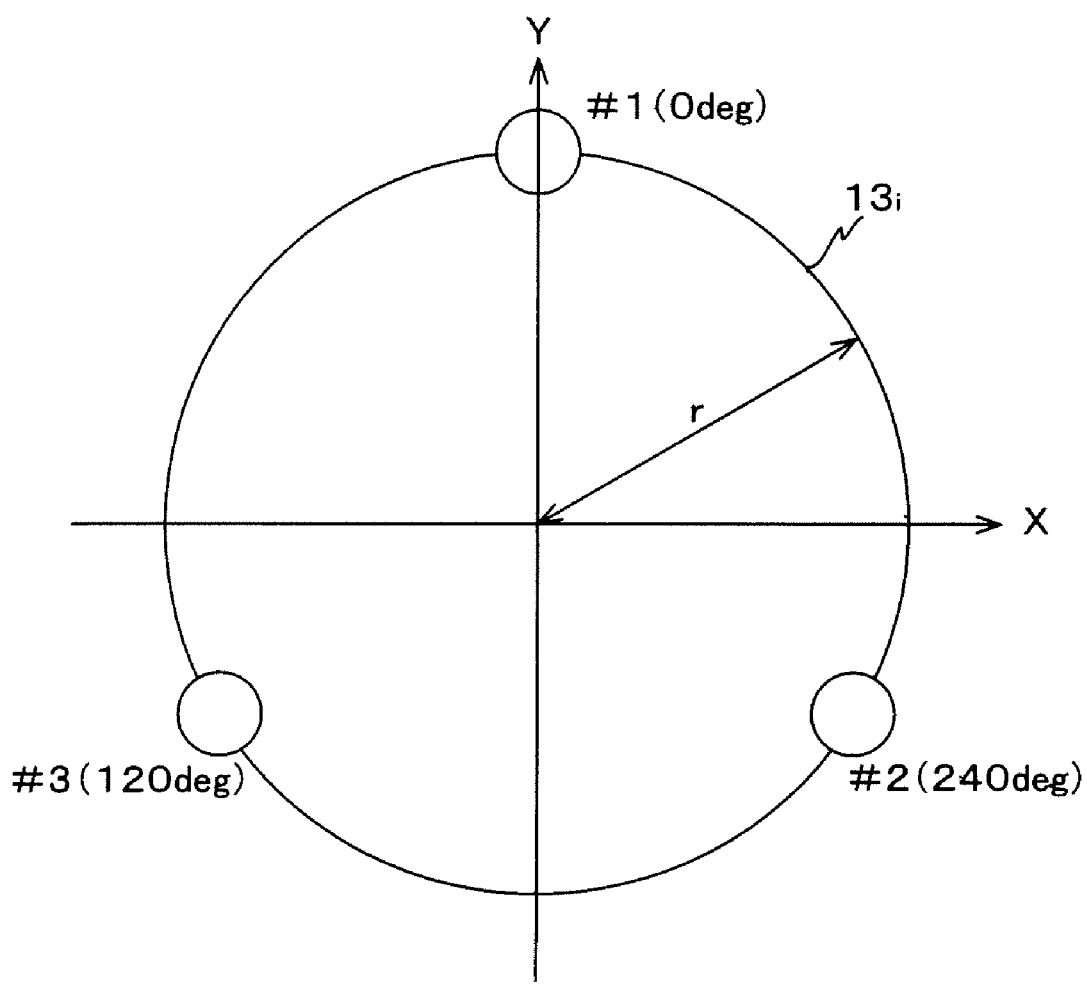
FIG. 13 is a view showing the arrangement of a drive axis of a movable lens $13_i$.

FIG. 13 shows the arrangement of a drive axis of movable lens $13_i$. From the geometrical relation shown in this drawing, in order to transform Z, $\theta x$, and $\theta y$ into drive amounts z1, z2, and z3 for each axis (#1, #2, and #3), it is obvious that the following equations (41a) to (41c) need to be calculated.

$$z1 = Z - r \times \tan \theta x \quad (41a)$$

$$z2 = Z + 0.5 \times r \times \tan \theta x + r \times \cos 30° \times \tan \theta y \quad (41b)$$

$$z3 = Z + 0.5 \times r \times \tan \theta x - r \times \cos 30° \times \tan \theta y \quad (41c)$$

That is, based on the above transformation results, for example, the second communications server 930 provides instruction values to image forming quality correction controller 48 for driving movable lenses $13_1$ to $13_5$ in directions of each degree of freedom. With these values, image forming quality correction controller 48 controls the applied voltage to each drive element driving the movable lenses $13_1$ to $13_5$ in directions of each degrees of freedom.

In the embodiment, the adjustment parameter referred to earlier includes drive amount Wz, W$\theta$x, and W$\theta$y of wafer W and the wavelength shift amount $\Delta\lambda$ of illumination light EL, and the adjustment amount corresponding to these four adjustment parameters are calculated in advance. The adjustment amount of these four adjustment parameters, which is made to correspond to the optimizing exposure conditions (including illumination conditions) referred to earlier, is stored in memory, and when a pattern is transferred onto the wafer under such exposure conditions it is read and used. That is, the adjustment amount of the three adjustment parameters related to the wafer is used in the focus leveling control of the wafer that uses the focus detection system previously described, and the adjustment amount of the parameter related to the wavelength of the illumination light is used when setting the center wavelength of the illumination light in light source 16. In addition, the adjustment amount of the movable lenses and their drive amount can also be made to correspond with the to the optimizing exposure conditions referred to earlier and stored in memory, and when a pattern is transferred onto the wafer under such exposure conditions it can be read form the memory and used to drive the movable lenses.

By controlling each of the above adjustment portions, exposure apparatus $922_1$ is optimized, which optimizes the forming state of the projected image of the reticle pattern on wafer W on exposure.

Then, the processing routine of the first mode (mode 1) is completed, and the procedure then returns to step 122 of the main routine in FIG. 5.

Meanwhile, in the above step 110, when the operator selects mode 2 with a mouse or the like, the decision in step 114 turns out to be positive, and the procedure then moves on to step 116 where a subroutine that performs the mode 2 processing (hereinafter also referred to as 'mode 2 processing routine') is performed. In this case, mode 2 is a mode in which optimizing is performed based on actual measurement data of wavefront aberration (or image forming quality) under optional exposure conditions (optional IDs). Mode 2 is mainly selected when adding new IDs. While using exposure apparatus $922_1$ in a state where each of the above adjustment portions referred to earlier are adjusted according to the optimizing results in mode 1, when a service technician measures the wavefront aberration of the projection system at times such as maintenance, errors in the calculated adjustment amount according to mode 1 can consequently be corrected by performing the processing in mode 2 that will be described in the description below.

When mode 2 is selected, as a premise, the wavefront aberration of projection optical system PL of the subject equipment is to be measured under the current ID (the ID subject to optimizing). Accordingly, in this case, information that the wavefront aberration has been measured is also to be sent by e-mail or the like referred to earlier, along with the specification of the exposure apparatus (equipment) subject to optimizing and instructions to perform optimizing.

Figure 14:
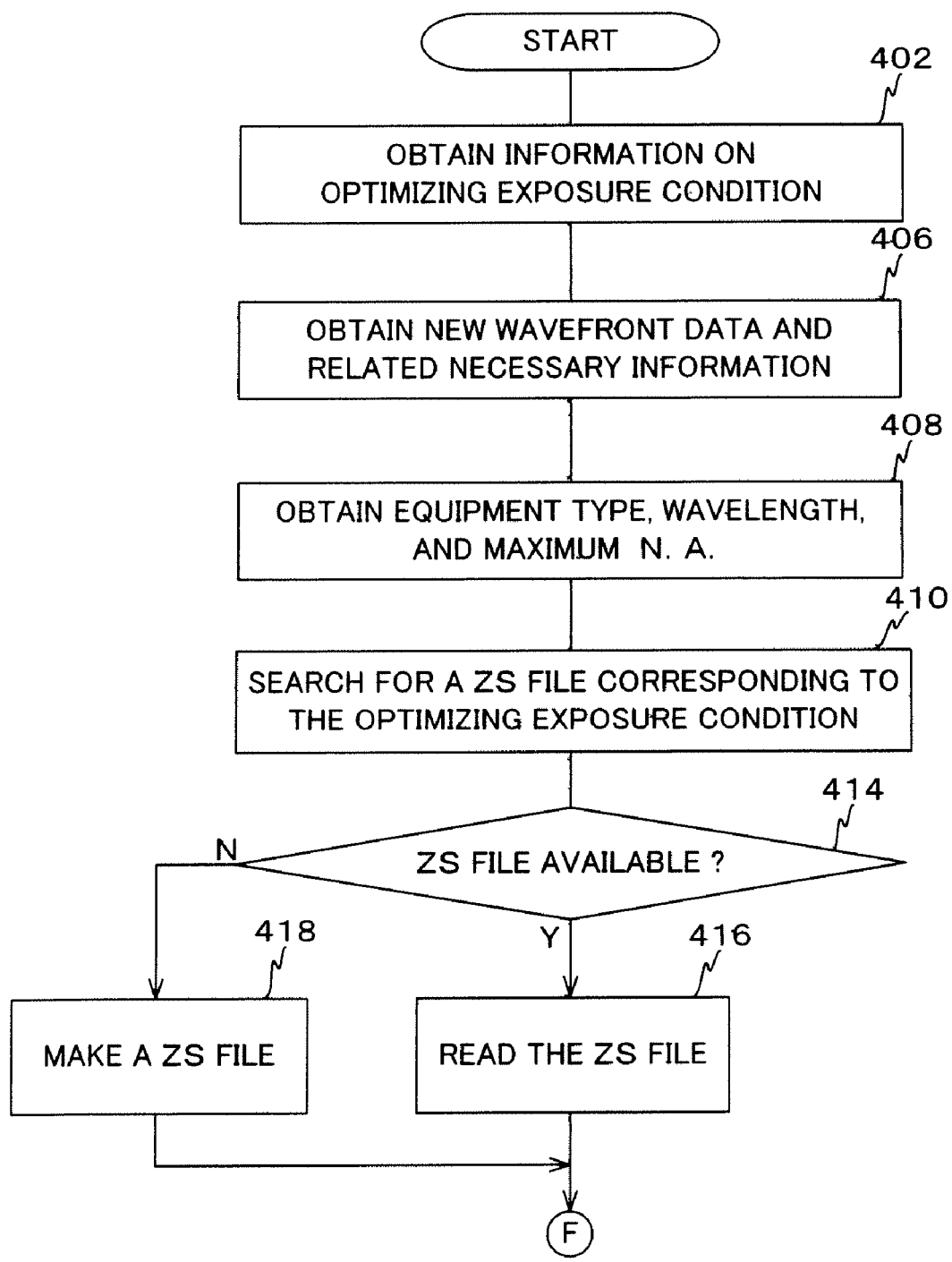
FIG. 14 is a flow chart (No. 1) showing a processing in step 116 in FIG. 5.

In the processing routine in mode 2 (hereinafter also referred to as 'the second mode'), first of all, in step 402 in FIG. 14, information on exposure conditions subject to optimizing is obtained. To be more specific, an inquiry is made to the first communications server 920 (or to main controller 50 of the specified equipment (exposure apparatus 922₁) via the first communications server 920) and obtains setting information such as, the current N.A of the projection optical system, illumination conditions (such as illumination N.A., illumination σ, and the types of aperture stops), and the types of subject patterns.

In the next step, step 406, measurement data on the new wavefront (coefficients of each term in the Zernike polynomial that expand the wavefront corresponding to the $1^{st}$ measurement point to the $n^{th}$ measurement point, such as coefficient $Z_1$ of the first term to coefficient $Z_{37}$ of the $37^{th}$ term) and necessary relative information is obtained by communications, or to be more specific, the values of the adjustment amount (adjustment parameter) on measurement of the wavefront aberration. Such values of the adjustment amount, that is, the positional information of movable lenses $13_1$ to $13_5$ in directions of three degrees of freedom or the like normally coincides with the values at this point, that is, the values under the exposure conditions subject to optimizing.

In the next step, step 408, in a manner similar to the one described earlier in step 208, information on the apparatus such as the name of the model, its exposure wavelength, and the maximum N.A. of its projection optical system is obtained.

In the next step, step 410, as is previously described in step 210, the ZS file that corresponds to the optimizing exposure conditions is searched for in the second database.

And, in steps 414, 416, and 418, processing (that includes decision making) similar to the one performed in steps 214, 216, and 218 previously described is performed. With this operation, when the ZS file that corresponds to the optimizing exposure conditions is found within the second database, it is read into memory, whereas, when it cannot be found, then the ZS file is made by the interpolation method, which is described earlier in the description.

Figure 15:
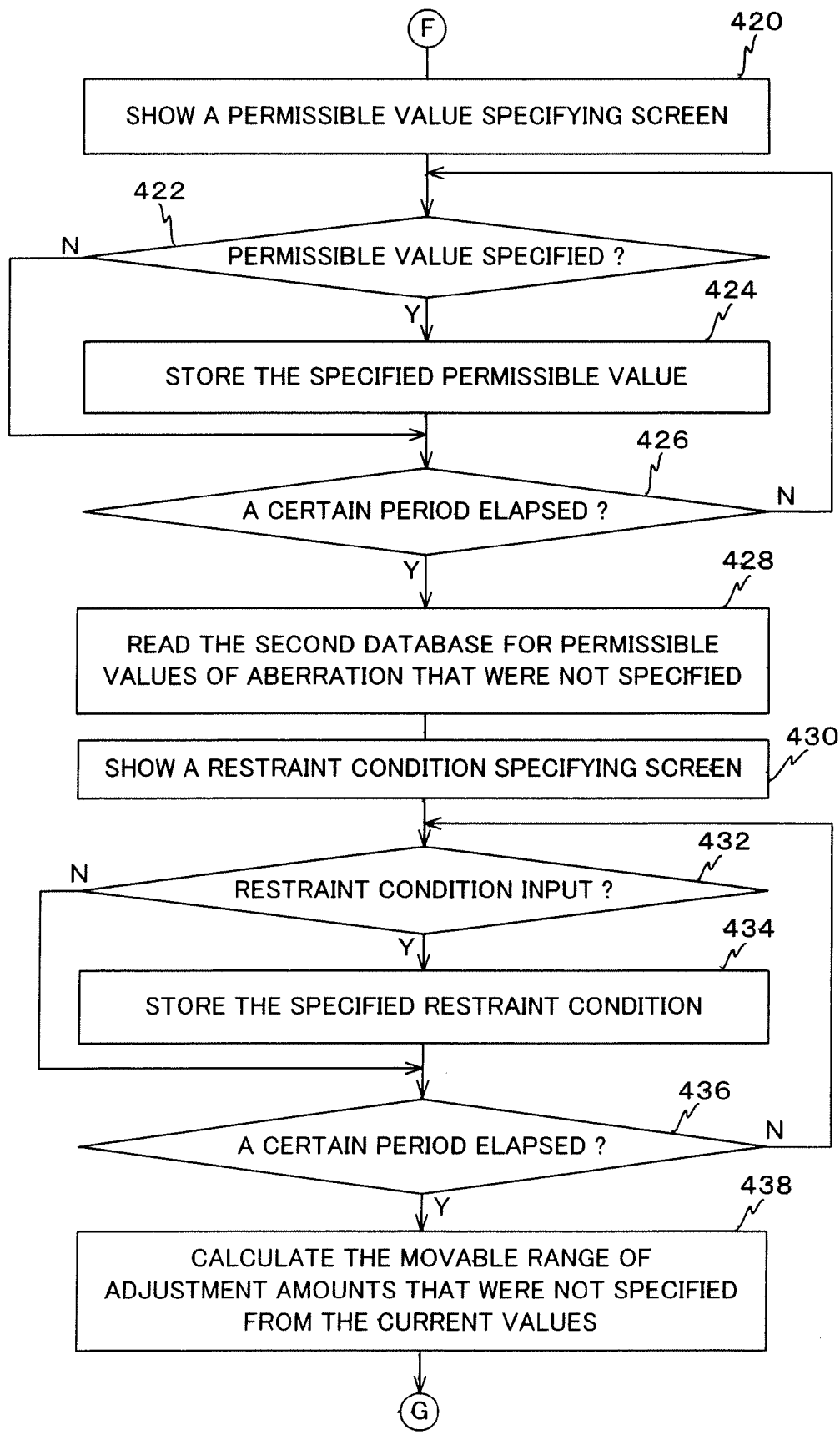
FIG. 15 is a flow chart (No. 2) showing a processing in step 116 in FIG. 5.

Next, in steps 420 to 438 in FIG. 15, processing (that includes decision making) similar to the one performed in steps 220 to 238 previously described is performed. With this operation, the permissible values of the image forming quality and restraint conditions of the adjustment amount are set.

Figure 16:
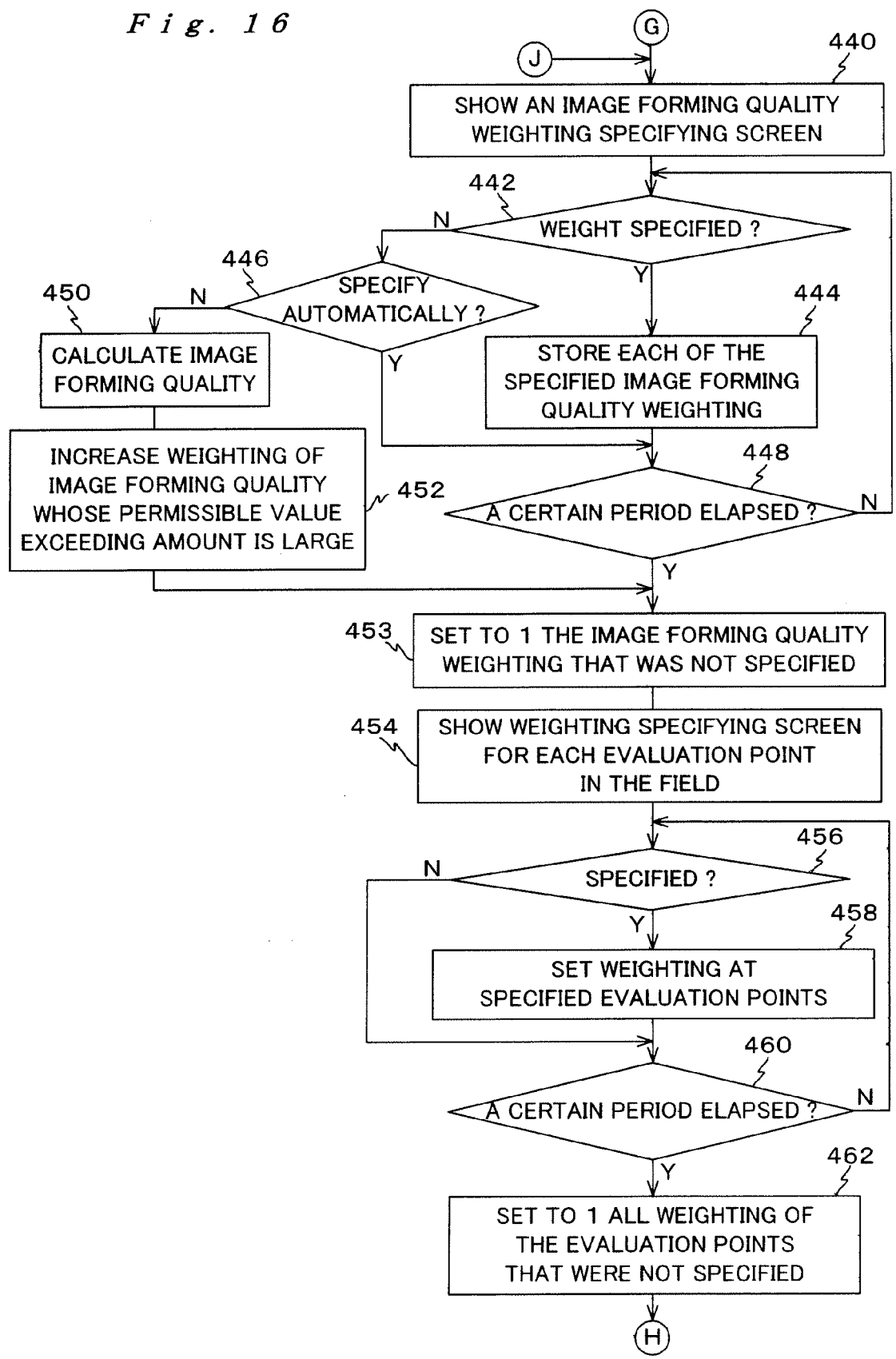
FIG. 16 is a flow chart (No. 3) showing a processing in step 116 in FIG. 5.

Next, in steps 440 to 462 in FIG. 16, processing (that includes decision making) similar to the one performed in steps 240 to 262 previously described is performed. With this operation, weighting of the 12 types of aberration at the 33 evaluation points (measurement points) within the field of the projection optical system is set in a manner similar to the one described earlier in the description. However, in the second mode processing, when automatic selection is selected in step 446, then the procedure moves on to step 450 where the present image forming quality is calculated based on the following equation (42).

$$f = Wa' \cdot ZS \quad (42)$$

In this case, f is the image forming quality expressed in equation (11) referred to earlier, and ZS is the ZS file data shown in the previous equation (13), which is obtained in step 416 or 418. In addition, Wa' is the wavefront aberration data (actual measurement data) obtained in step 406, shown as in the following equation (43). That is, in the second mode, the point where it uses actual measurement data when calculating the image forming quality differs from the first mode (mode 1).

$$Wa' = \begin{bmatrix} Z'_{1,1} & Z'_{1,2} & \cdots & Z'_{1,36} & Z'_{1,37} \\ Z'_{2,1} & & & & Z'_{2,37} \\ \vdots & & \ddots & & \vdots \\ Z'_{32,1} & & & & Z'_{32,37} \\ Z'_{33,1} & Z'_{33,2} & \cdots & Z'_{33,36} & Z'_{33,37} \end{bmatrix} \quad (43)$$

In the above equation (43), $Z_{i,j}'$ shows the $j^{th}$ coefficient (j=1 to 37) in the Zernike polynomial of the wavefront aberration at the $i^{th}$ measurement point.

Figure 17:
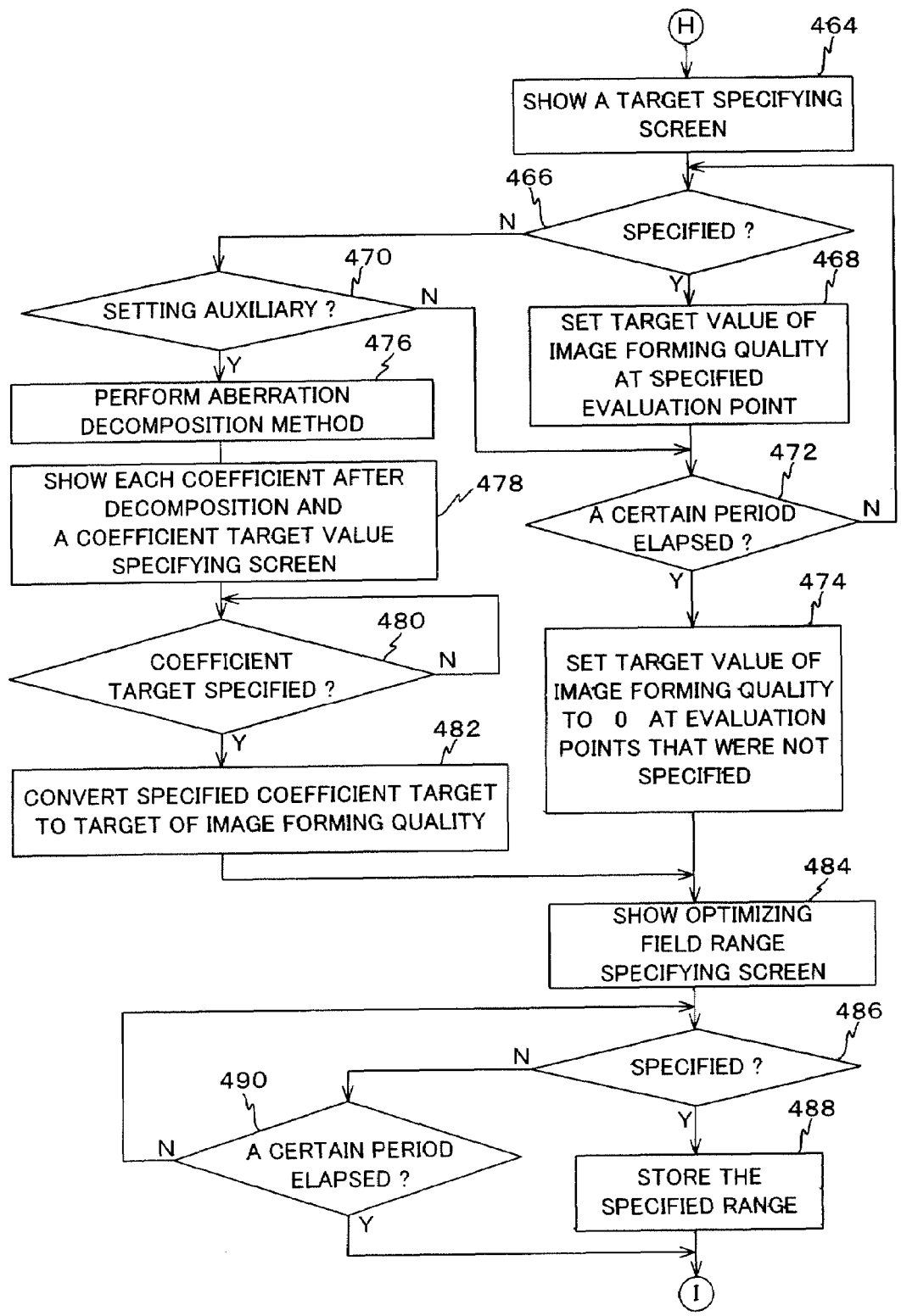
FIG. 17 is a flow chart (No. 4) showing a processing in step 116 in FIG. 5.

Next, in steps 464 to 490 in FIG. 17, processing (that includes decision making) similar to the one performed in steps 264 to 290 previously described is performed. With this operation, the target values (targets) of the 12 types of aberrations at the 33 evaluation points within the field of the projection optical system is set, as well as the optimizing field range when the range is specified. In the mode 2 processing, however, when the setting auxiliary is specified (selected) in step 470, the aberration decomposition method is performed in step 476. In this case, image forming quality f calculated by the above equation (42) is used.

Figure 18:
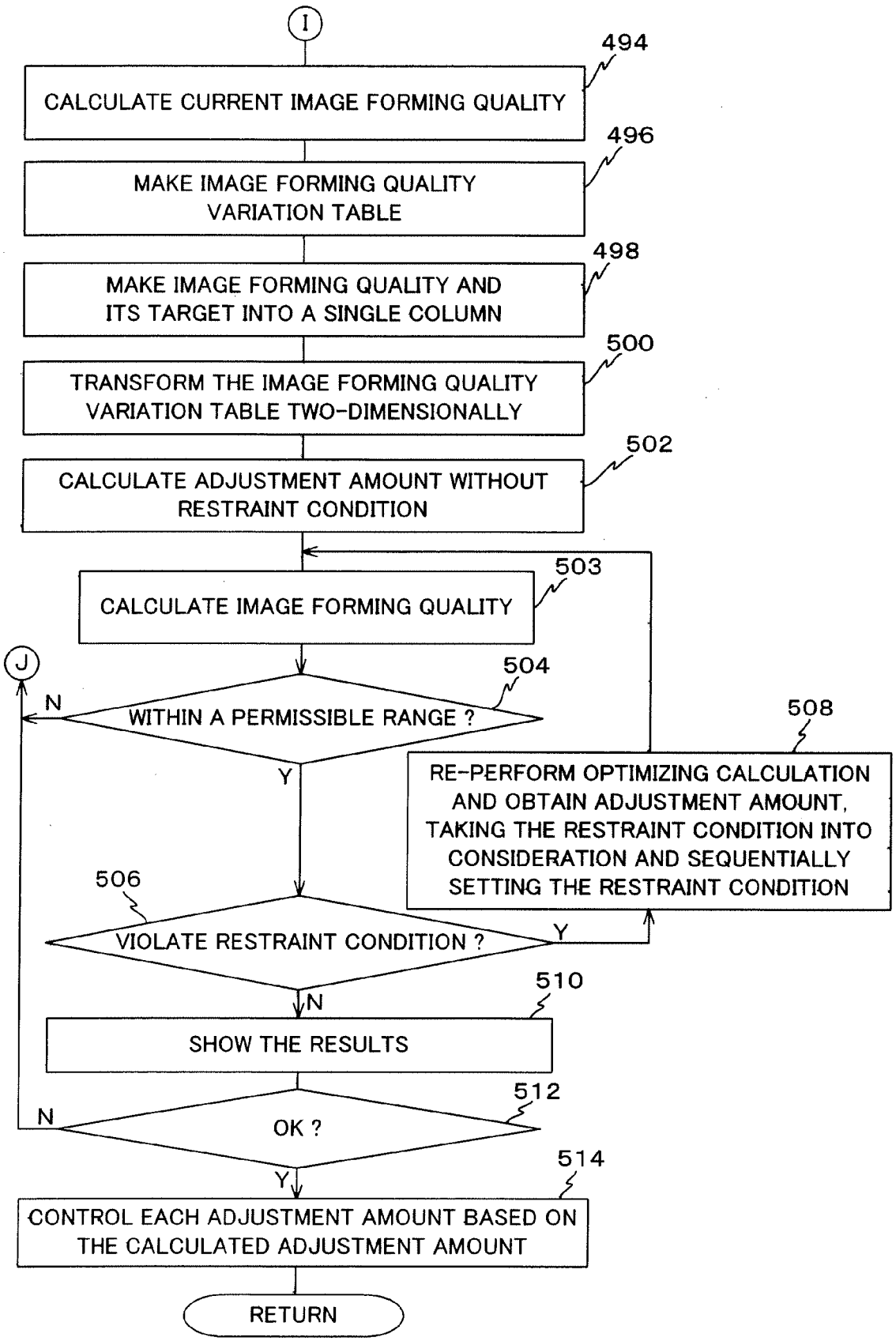
FIG. 18 is a flow chart (No. 5) showing a processing in step 116 in FIG. 5.

Next, in step 494 in FIG. 18, the present image forming quality is calculated, based on equation (42) previously described.

In the next step, step 496, the image forming quality variation table for each adjustment parameter is made, similar to step 296 previously described.

In the next step, step 498, image forming quality f calculated in step 494 and its target $f_t$ are made into a single column (one-dimensional column).

Next, in step 500, the 19 image forming quality variation tables are transformed into a two-dimensional form as in step 300 previously described, then the procedure moves on to step 502 where the variation amount (adjustment amount) of the adjustment parameter is calculated without consideration of the restraint conditions, as in step 302 referred to earlier.

In the next step, step 503, by substituting the adjustment amounts of the 19 adjustment parameters that are obtained into, for example, the above equation (26), each component of matrix f, that is, the 12 types of aberration (image forming quality) at all the evaluation points are calculated.

In the next step, step 504, the decision is made whether the above calculated 12 types of aberration at all the evaluation points is within the individual permissible values that are set in advance or not, and when the decision is negative, the procedure then returns to step 440 referred to earlier. Then, by performing the processing after step 440, the target and weighting are set again, and the optimizing process performed.

Meanwhile, when the decision in step 504 is affirmed, the procedure then moves on to step 506 where the decision is made whether the adjustment amounts of the 19 adjustment parameters calculated in the above step 502 fail to satisfy the restraint conditions that have been previously set (the decision making method will be described further later in the description). And, when the decision is affirmed, the procedure then moves on to step 508 where optimizing is re-performed by sequentially setting the restraint conditions in consideration of the restraint conditions and the adjustment amount is obtained, as in step 308, and then the procedure returns to step 503.

On the other hand, when the decision in step 506 is denied, that is, when there is no restraint condition violation and when the restraint condition violation has been dissolved, the procedure then moves on to step 510 where the results are shown on the display. In the embodiment, the following are shown as results: the adjustment amount of 19 adjustment parameters (in this case, the variation amount from the default values), the values of each adjustment parameter after adjustment, the image forming quality (the 12 types of aberration) values after optimizing, the wavefront aberration correction amount, the OK button, and the NG button.

And, when the operator sees the results shown on the display and selects the NG button with the mouse or the like, the procedure then returns to step 440.

Meanwhile, when the operator sees the results shown on the display and selects the OK button with the mouse or the like, the procedure then moves on to step 514 where based on the calculated adjustment amount, each section that requires adjustment (at least one of movable lenses $13_1$ to $13_5$, the Z position and tilt of wafer W, and the wavelength shift amount of the illumination light) is controlled via the first communications server 920 and main controller 50 of exposure apparatus $922_1$, in a manner similar to the one previously described. By controlling each of the above adjustment portions, exposure apparatus $922_1$ is optimized, which optimizes the forming state of the projected image of the reticle pattern on wafer W on exposure.

Then, the processing routine of the second mode (mode 2) is completed, and the procedure then returns to step 122 of the main routine in FIG. 5.

Furthermore, when the operator selects mode 3 with the mouse or the like in the above step 110, the decision made in step 114 turns out negative, and the procedure moves on to step 120 where the sub-routine of processing in mode 3 (hereinafter also referred to as 'mode 3 processing routine') is performed. Mode 3, in this case, is a mode in which the image forming quality (in the case of the embodiment, the 12 types of aberration) is obtained under any exposure condition (optional ID), in a state where the wavefront aberration is known in a reference state and the values of the adjustment parameters are fixed at that point. Mode 3 can be suitably used, not only by device manufacturers but also by exposure apparatus makers during the making stage of the apparatus to adjust the optical properties of the projection optical system, so that the image forming quality improves and nears the desired target value.

Figure 19:
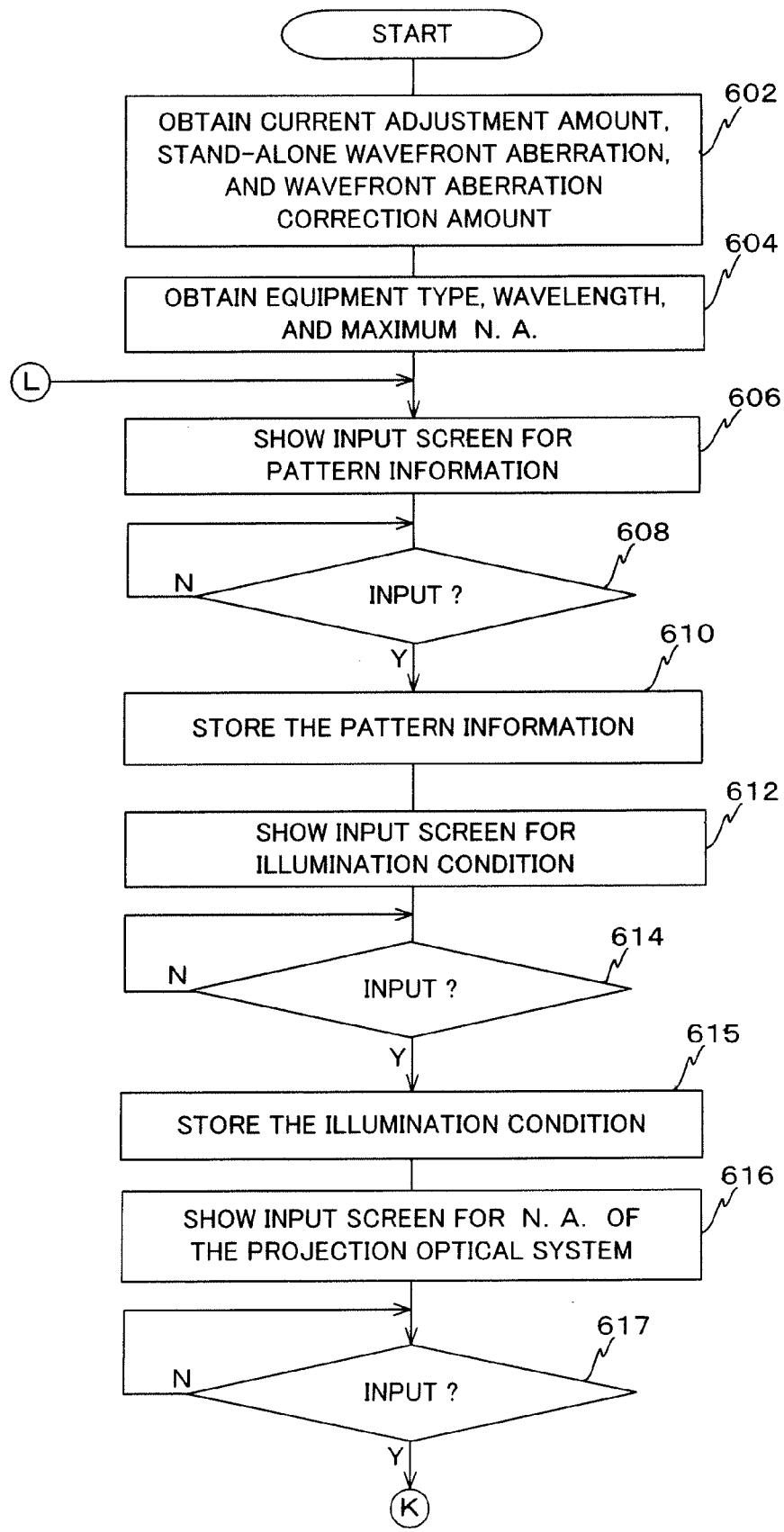
FIG. 19 is a flow chart (No. 1) showing a processing in step 120 in FIG. 5.
Figure 20:
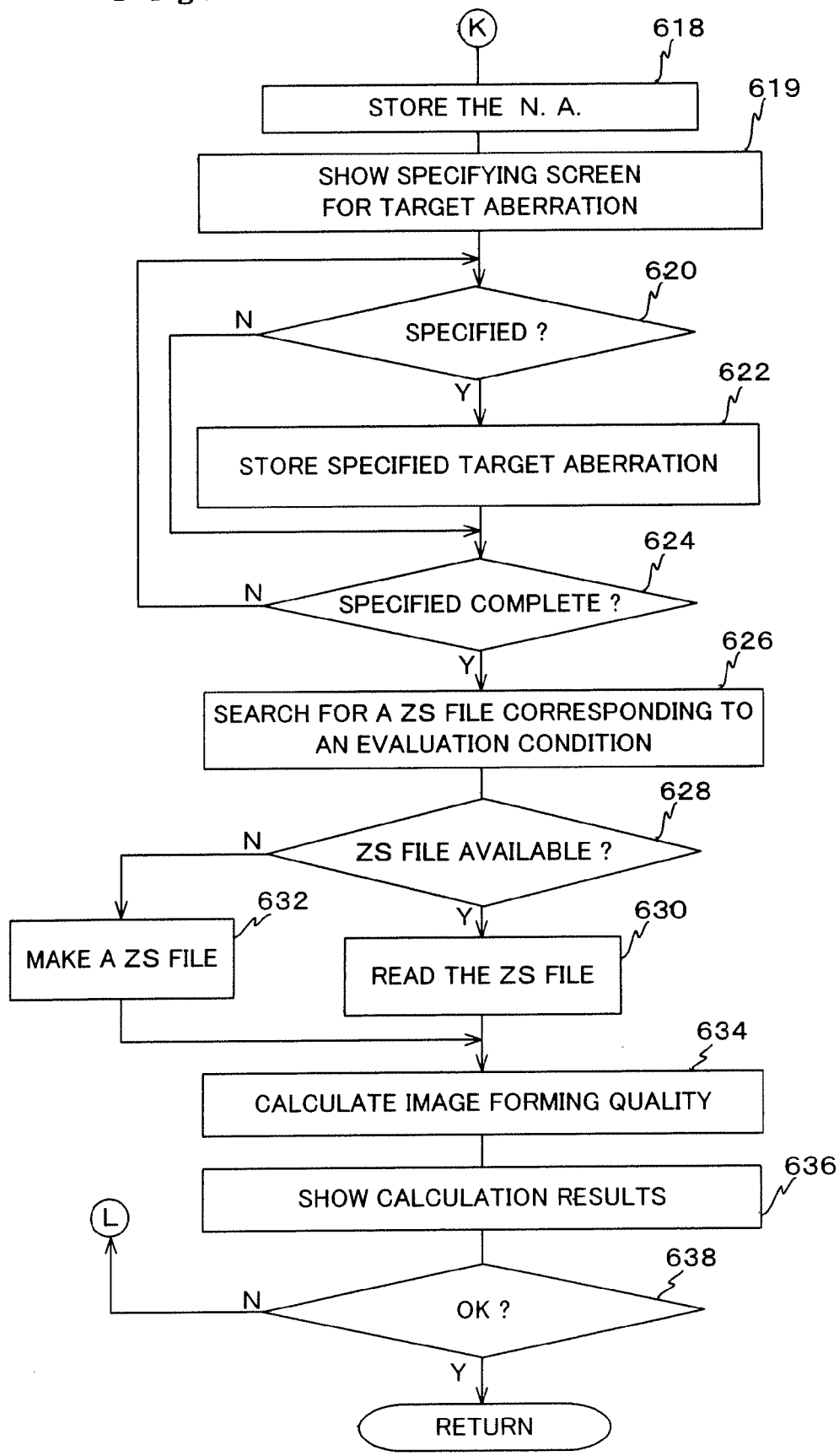
FIG. 20 is a flow chart (No. 2) showing a processing in step 120 in FIG. 5.

In mode 3 processing routine (hereinafter also referred to as 'the third mode'), first of all, in step 602 in FIG. 19, the adjustment amount values (adjustment parameters), the stand-alone wavefront aberration, and the wavefront aberration correction amount against the stand-alone wavefront aberration are obtained under the current state from the first communications server 920 (or to main controller 50 of the specified equipment (exposure apparatus $922_1$) via the first communications server 920). The information obtained will be information of mode 3 in a reference state.

In the next step, step 604, information on the apparatus such as the name of the model, its exposure wavelength, and the maximum N.A. of its projection optical system is obtained from the first communications server 920 (or to main controller 50 of the specified equipment (exposure apparatus $922_1$) via the first communications server 920).

In the next step, step 606, the display shows an input screen for inputting information on the subject pattern. And then, the procedure proceeds to step 608 where it waits for information on the subject pattern to be input.

And, when the operator inputs information on the subject pattern (such as whether the pattern is an extracted pattern or a residual pattern, a dense pattern or an isolated pattern, in the case of dense lines (lines and spaces) its pitch, line width, and duty ratio, in the case of isolated lines its line width, in the case of contact holes its longitudinal length, its lateral length, and the length between the hole patterns (such as its pitch), and whether the reticle pattern type is a phase shift pattern (including a halftone type) or a phase shift reticle or not and its type (such as a spatial frequency modulation type and a halftone type) via the keyboard or the like, the procedure then moves on to step 610 where the information on the pattern that has been input is stored in memory such as the RAM.

In the next step, step 612, the display shows an input screen for inputting illumination conditions. And then, the procedure proceeds to step 614 where it waits for information on illumination conditions to be input. And, when the operator inputs information on illumination conditions such as illumination N.A of the illumination optical system or illumination σ, annular ratio, and the aperture shape of illumination system aperture stop plate 24 (the shape of the secondary light source) via the keyboard or the like, in step 615 the illumination conditions that have been input are stored in memory such as the RAM.

In the next step, step 616, the display shows an input screen for inputting the N.A. of the projection optical system. Then, the procedure proceeds to step 617 where it waits for the N.A. to be input. And, when the operator inputs the N.A via the keyboard or the like, the procedure then moves on to step 618 where the N.A. that has been input is stored in memory such as the RAM.

In the next step, step 619, the display shows a specifying screen for specifying an aberration that is to be a target and is subject to evaluation of the image forming quality (hereinafter referred to as 'target aberration' as appropriate). And then, the procedure then proceeds to step 620 where the decision is made whether the target aberration has been specified or not. On the specifying screen for the target aberration, a specifying complete button is also shown.

And, when the operator specifies an aberration from the 12 types of aberration described earlier as the target aberration via the keyboard or the like, the specified target aberration is stored in memory such as the RAM as the evaluation subject. Then, the procedure proceeds to step 624 where the decision is made whether the specifying complete button has been selected or not. And, when the decision turns out to be negative, the procedure then returns to step 620. Meanwhile, when the decision in step 620 is negative, the procedure then moves on to step 624.

That is, in the embodiment, the loop made up of steps 620→622→624 or steps 620→624 is repeatedly performed until the target aberration has been specified. And, when the operator selects the specifying complete button via the mouse or the like, the procedure then proceeds to step 626. Other than specifying the target aberration by direct input as is described above, the target aberration (evaluation item) can also be specified, for example, by selecting the ZS file for different evaluation items corresponding to the same illumination conditions and N.A. of the projection optical system. When specifying the target aberration, the target aberration (evaluation item) may also be specified in plurals.

In step 626, the ZS file corresponding to the evaluation condition is searched for in the second database. Evaluation condition, in this case, refers to the condition subject to evaluation, that is, conditions for evaluating the image forming quality of the evaluation items (in this case, the target aberration specified in step 620 and stored in memory in step 622) under the exposure conditions determined by the information input in the above steps 610, 615, and 618 (hereinafter referred to as 'target exposure conditions' as appropriate).

In the next step, step 628, the decision is made whether the ZS file corresponding to the evaluation condition has been found or not. When the file has been found, the ZS file is read into memory such as the RAM. On the other hand, when the decision is negative in step 628, that is, when the ZS file corresponding to the evaluation condition is not available in the second database, the procedure then moves on to step 632 where the ZS file corresponding to the evaluation condition is made using the ZS database within the second database, by for example, the interpolation method previously described.

In the next step, step 634, the image forming quality of the evaluation items under the target exposure condition (in this case, the target aberration specified in step 620 and stored in memory in step 622) is calculated in the following manner.

That is, by substituting the wavefront aberration data obtained from the information in the above step 602 and the ZS file data read in the above step 630 or made in the above step 632 into equation (10) previously described, the image forming quality at each evaluation point within the field is obtained.

Then, in the next step, step 636, the display shows the information on the calculated image forming quality. On the display, the OK button and the redo button are also shown with the information on the image forming quality.

By the above display of the image forming quality, the operator can acknowledge the image forming quality, which is the evaluation item, under the target exposure condition that have been specified by him/herself.

The operator then confirms the display, and when the image forming quality is sufficiently satisfying under the target exposure condition, selects the OK button using the mouse or the like. With this operation, the processing routine of the third mode is completed, and the procedure then returns to step 122 of the main routine in FIG. 5.

On the other hand, when the operator confirms the display and is not satisfied with the image forming quality under the target exposure condition, the operator then selects the redo button with the mouse or the like so that the image forming quality under other target exposure conditions can be checked. With this operation, the procedure then returns to step 606 where it shows the input screen for pattern information, and then the processing (including decision making) of step 608 and after is repeatedly performed.

In the third mode, by repeatedly selecting the redo button so that various exposure conditions are set as the target exposure condition and the image forming quality is calculated and displayed, the operator can easily decide the best exposure condition. That is, for example, when the specified information other than the pattern information input in step 608 is fixed, and the operator repeatedly selects the redo button while gradually changing the pattern information so that the above operations of making (or selecting) the ZS file and calculating the image forming quality (target aberration) are repeatedly performed, the operator can sequentially confirming the calculation results in step 636 shown on the display and find the pattern information in which the image forming quality (target aberration) becomes minimum (or optimum), which allows the optimal pattern to be decided as the best exposure condition.

Similarly, the redo button can be repeatedly selected to repeatedly perform the operations of making (or selecting) the ZS file and calculating the image forming quality (target aberration) while a specific condition is gradually changed and the remaining specified information is fixed, and by sequentially confirming the calculation results in step 636 shown on the display, the specific condition in which the image forming quality (target aberration) becomes minimum (or optimum) can be found, and the optimal specific condition can be decided as the best exposure condition.

Referring back to FIG. 5, in step 122, the display shows a selecting screen of whether to end or to continue the processing. When the continue button is selected, the procedure then returns to step 102, whereas when the end button is selected, the series of processing in the routine is completed.

As is referred to earlier in the description, in the first mode processing, a case may be considered when the wavefront aberration correction amount under the reference ID is unknown. In this case, the wavefront aberration correction amount can be estimated from the image forming quality. Following is a description of such a case.

The correction amount of the wavefront aberration will be estimated on the assumption that the deviation of the stand-alone wavefront aberration and the on-body wavefront aberration corresponds to an adjustment amount deviation $\Delta x'$ of adjustment parameters of movable lenses $13_1$ to $13_5$ or the like referred to earlier.

When the adjustment amount under the assumption that the stand-alone wavefront aberration coincides with the on-body wavefront aberration is expressed as $\Delta x$, the correction amount of the adjustment amount as $\Delta x'$, the ZS file as ZS, the theoretical image forming quality (the theoretical image forming quality when there is no deviation in the on-body wavefront aberration) under the reference ID as $K_0$, the actual image forming quality under the reference ID as $K_1$, the wavefront aberration variation table as H, the image forming quality variation table as H', the stand-alone wavefront aberration as Wp, and the wavefront aberration correction amount as $\Delta Wp$, the following 2 equations (44) and (45) are valid.

$$K_0 = ZS \cdot (Wp + H \cdot \Delta x) \quad (44)$$

$$K_1 = ZS \cdot (Wp + H \cdot (\Delta x + \Delta x')) \quad (45)$$

From these equations, $$K_1 - K_0 = ZS \cdot H \cdot \Delta x' = H' \cdot \Delta x'. \quad (46)$$

When the above equation (46) is calculated by the least squares method, the correction amount $\Delta x'$ of the adjustment amount can be expressed as in the following equation (47).

$$\Delta x' = (H'^T \cdot H')^{-1} \cdot H'^T \cdot (K_1 - K_0) \quad (47)$$

In addition, correction amount $\Delta Wp$ of the wavefront aberration can be expressed as in the following equation (48).

$$\Delta Wp = H \cdot \Delta x' \quad (48)$$

Each reference ID will have a wavefront aberration correction amount $\Delta Wp$.

In addition, the actual on-body wavefront aberration will be as in the following equation (49).

$$\text{the actual on-body wavefront aberration} = Wp + H \cdot \Delta x + \Delta Wp \quad (49)$$

With the exposure apparatus $922_1$ to $922_3$ in the embodiment, when manufacturing semiconductor devices, reticle R for manufacturing devices is mounted on reticle stage RST, and then preparatory operations such as reticle alignment and the so-called baseline measurement, and wafer alignment like the EGA (Enhanced Global Alignment) are performed.

Details on preparatory operations such as the above reticle alignment and baseline measurement are disclosed in, for example, Japanese Patent Application Laid-open No. H04-324923 and the corresponding U.S. Pat. No. 5,243,195. In addition, details on the following operation, EGA, are disclosed in, Japanese Patent Application Laid-open No. S61-44429, and the corresponding U.S. Pat. No. 4,780,617. As long as the national laws in designated states or elected states, to which this international application is applied, permit, the disclosures of the above publication and the above U.S. patent are incorporated herein by reference.

Then, based on the wafer alignment results, exposure based on the step-and-repeat method is performed. Details on exposure operations will be omitted, since they are the same as in a typical stepper.

Figure 21:
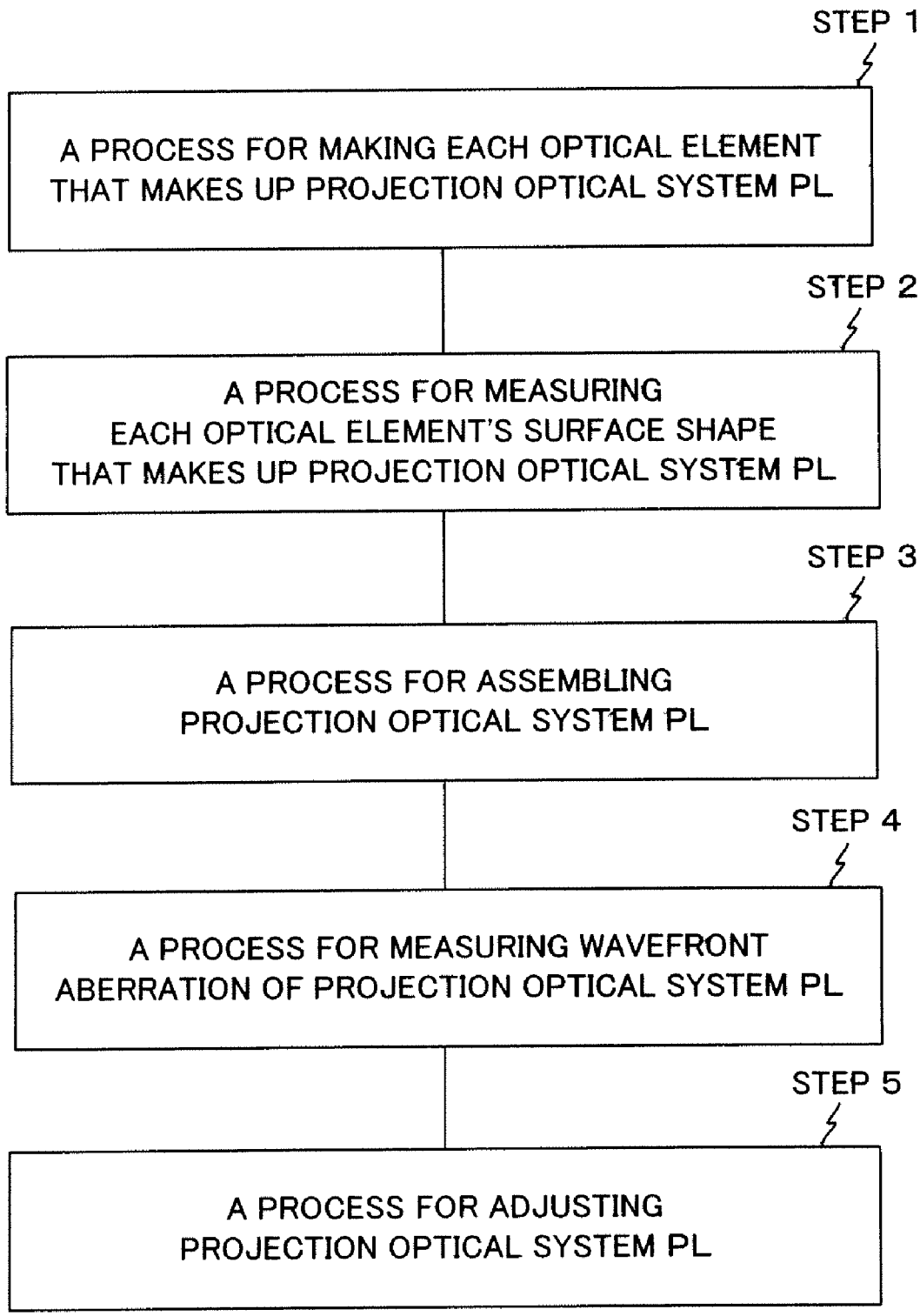
FIG. 21 is a flow chart showing the entire making process of a projection optical system.

Next, the making method of exposure apparatus PL, which is performed when making exposure apparatus 922 ($922_1$ to $922_3$), will be described, according to a flowchart in FIG. 21 that shows the making process of projection optical system PL.

As a premise, a computer system that has the same configuration as the one shown in FIG. 1 is to be built in the factory of the exposure apparatus maker (to be referred to as 'maker B'). Hereinafter, as the references for each component, the same references will be used as the one used when describing the computer system of device manufacturer A earlier in the description. In addition, for the sake of convenience in the description, the first communications server 920 is to be disposed at the place where projection optical system PL is made.

[Step 1]

In step 1, the following parts that structure projection optical system PL are made according to design values based on a predetermined design lens data: lens elements each serving as an optical member, lens holders that hold each of the lenses, and a barrel that houses an optical unit made up of the lens elements and the lens holders. That is, each lens element is processed using a well-known lens processor from a predetermined optical material, so that the lens element has a radius of curvature and axial thickness according to predetermined design values. In addition, the lens holder that holds each lens and the barrel that houses the optical unit made up of the lens elements and the lens holders are processed into shapes of a predetermined size, using a well-known metal processor or the like from predetermined holding materials (such as stainless steel, brass, or ceramics).

[Step 2]

In step 2, the surface shape of the lens surface of each lens element that makes up projection optical system PL made in step 1 is measured using, for example, a Fizeau interferometer. As such an interferometer, a unit whose light source is an He—Ne gas laser that emits light having a wavelength of 633 nm, an Ar laser that emits light having a wavelength of 363 nm, or a harmonic of an Ar laser having the wavelength of 248 nm is used. The Fizeau interferometer can accurately obtain the shape of the surface subject to detection, which is a lens element surface, by measuring interference fringe that is formed when the reflection beams from a reference surface formed on the surface of a condenser lens disposed on the optical path and the lens element surface interfere with each other, using a pick-up device such as a CCD. Obtaining the shape of the surface (lens surface) of an optical element such as a lens using the Fizeau interferometer is well known, and the details are disclosed in, for example, Japanese Patent Application Laid-open Nos. S62-126305 and H06-185997.

The above measurement of the surface shape of the optical element using the Fizeau interferometer is performed on all the lens surfaces of the lens elements that make up projection optical system PL. Then, a worker inputs each measurement result into the first communications server 920 via an input device such as a console or the like (not shown). The information input is transmitted to the second communications server 930 from the first communications server 920, and is stored in memory such as the RAM or in a storage unit such as the hard disc in the second communication server 930.

[Step 3]

When the measurement of the surface shape of all the lens surfaces of the lens elements that make up projection optical system PL has been completed in step 2, the optical unit that is processed and made according to design values, or more specifically, a plurality of optical units consisting of the optical elements such as lenses and lens holders that hold the lenses are assembled. Among these optical units, a plurality of units, such as five, have movable lenses $13_1$ to $13_5$ described earlier in the description, respectively, and as is also described earlier in the description, such optical units with movable lenses $13_1$ to $13_5$ use lens holders that have a double structure. That is, the lens holders that have a double structure each have an inner lens holder that holds movable lenses $13_1$ to $13_5$ and an outer lens holder that holds the inner lens holder, and the positional relation between the inner lens holder and the outer lens holder is adjustable with a mechanical adjustment mechanism. In addition, on the lens holder having such a double structure, drive elements that are previously described are provided at predetermined positions.

Then, the plurality of optical units assembled in the manner described above is sequentially assembled into the barrel via the opening on the upper end, being dropped into the barrel with spacers in between. Then, the first optical unit that is dropped into the barrel is supported by a projected portion formed on the lower end of the barrel via a spacer, and when all the optical units are housed inside the barrel, the assembly process is completed. In parallel with the assembly process, information related to spacing in between the optical surface of the lens elements (lens surfaces) is measured using a tool such as a micrometer, taking into consideration the thickness of the spacers also housed with the optical units inside the barrel. And, while alternately performing the assembly operation and the measurement operation of the projection optical system, the final spacing in between the optical surface of the lens elements (lens surfaces) of projection optical system PL at the point where the assembly process in step 3 has been completed is obtained.

During each processing in the making of the projection optical system including the assembly process, movable lenses $13_1$ to $13_5$ previously described are fixed at a neutral position. In addition, although it is omitted in the description, in the assembly process, pupil aperture stop 15 is also assembled into the system.

The worker inputs the measurement results, which is related to the spacing in between the optical surface of the lens elements (lens surfaces) of projection optical system PL at the point during the above assembly process or when the assembly has been completed, into the first communications server 920 via an input device such as a console or the like (not shown). The information that has been input is transmitted from the first communications server 920 to the second communications server 930, and is stored in memory such as the RAM or in a storage unit such as the hard disc in the second communication server 930. In the above assembly process, the optical units may be adjusted when necessary.

When adjusting the optical unit, for example, the relative spacing between optical elements in the optical axis direction may be changed or the optical elements can be inclined against the optical axis, via the mechanical adjustment mechanism. In addition, the barrel may be structured so that the tip of a screw, which is screwed to an internal screw that penetrates the side surface of the barrel, is in contact with the lens holder. And, by making the screw move using a tool such as a screw driver, the lens holder may be shifted in a direction perpendicular to the optical axis so that eccentricity or the like is adjusted. Details on an adjustment mechanism for moving the lens holders in five or more degrees of freedom in order to perform optical adjustment on the projection optical system assembled in the manner described above are disclosed in, for example, Japanese Patent Application Laid-open No. 2002-162549.

[Step 4]

Next, in step 4, the wavefront aberration of projection optical system PL assembled in step 3 is measured.

To be more specific, projection optical system PL is to be attached to the body of a large wavefront aberration measuring unit (not shown)(such as the PMI referred to earlier), and the wavefront aberration measured. The measuring principle of the wavefront by the wavefront aberration measuring unit is the same as wavefront aberration measuring instrument 80 previously described, therefore, the details will be omitted.

As a result of the above wavefront aberration measurement, the wavefront of the projection optical system is expanded and coefficient $Z_i$ (i=1, 2, . . . , 81) of each term in a Zernike polynomial (Fringe Zernike polynomial) is obtained by the wavefront aberration measuring unit. Accordingly, by connecting the wavefront aberration measuring unit to the second communications server 930, the above coefficient $Z_i$ of each term in the Zernike polynomial will automatically be loaded into memory such as the RAM (or into a storage unit such as the hard disc) of the second communications server 930. In the above description, the wavefront aberration measuring unit uses the terms up to the $81^{st}$ term in the Zernike polynomial. In this case, the high order component of each aberration of projection optical system PL can also be calculated. However, the calculation may be performed up to the $37^{th}$ term, as in the case of the wavefront aberration measuring unit previously described, or it may be performed on the $82^{nd}$ term and over.

[Step 5]

In step 5, projection optical system PL is adjusted so that the wavefront aberration measured in step 4 becomes optimal.

First of all, prior to adjusting projection optical system PL, the second communications server 930 corrects an optical basic data stored in advance in memory and reproduces the optical data of projection optical system PL in the making process that has actually been built, based on information stored in memory, that is, the information on surface shape of the optical elements obtained in the above step 2 and the information on spacing between optical surfaces of the optical elements obtained in the above assembling process in step 3. The optical data is used to calculate the adjustment amount of each optical element.

That is, within the hard disc of the second communications server 930, an adjustment basic data is stored in advance that is a calculation on a relation between a unit drive amount of each lens element in directions of 6 degrees of freedom and a variation amount of coefficient $Z_i$ of each term in the Zernike polynomial based on design values of the projection optical system, sort of like the wavefront aberration variation table referred to earlier but expanding to include not only the movable lenses but also the immovable lenses. Then, the second communications server 930 corrects the above adjustment basic data according to a predetermined calculation, based on the above optical data obtained during the making process of projection optical system PL.

Then, the second communications server 930 performs a predetermined calculation using the corrected database and the wavefront aberration measurement results, and calculates the adjustment amount (including zero) of each lens element in directions of 6 degrees of freedom, then shows the information on the adjustment amount on the display. At the same time, the second communications server 930 transmits the information on the adjustment amount to the first communications server 920. Then, the first communications server 920 shows the information on the adjustment amount on the display.

According to the display, a technician (worker) adjusts each lens element. As a result, projection optical system PL whose wavefront aberration is optimal is made.

In order to perform simple reprocessing of the optical elements of projection optical system PL, when the wavefront aberration is measured using the wavefront measurement unit as is described above, the availability and position of the optical element(s) that require reprocessing can be specified based on the measurement results, and the reprocessing of the optical element and the readjustment of the remaining optical elements may be performed in parallel.

Next, the making method of exposure apparatus 922 will be described.

On the making of exposure apparatus 922, first of all, illumination optical system 12 that includes optical elements such as a plurality of lens elements and mirrors is assembled as a unit, as well as projection optical system PL in the manner above. In addition, the reticle stage system and the wafer stage system that are made up of various mechanical components are also assembled as units. And then, optical adjustment, mechanical adjustment, and electrical adjustment are performed so that each unit has a desired level of performance as stand-alone units. On this adjustment, the adjustment of projection optical system PL is performed in the manner described above.

Next, units such as illumination optical system 12 and projection optical system PL are assembled into the exposure apparatus main body. The reticle stage system and the wafer stage system are also attached to the exposure apparatus main body, and then the wiring and piping are connected.

Next, optical adjustment is further performed on illumination optical system 12 and projection optical system PL. This is because the image forming quality of these optical systems, especially that of projection optical system PL slightly changes from before being assembled into the exposure apparatus to after being assembled. In the embodiment, on the optical adjustment performed after projection optical system PL has been built into the exposure apparatus, wavefront aberration measuring instrument 80 previously described is attached onto Z tilt stage 58 and measurement of the wavefront aberration is performed in the manner described earlier. Then, the information for each measurement point obtained as the measurement results of wavefront aberration is sent online from main controller 50 of the exposure apparatus being built to second communications server 930, via the first communications server 920. And then, in a manner similar to the adjustment performed when making projection optical system PL described above, the adjustment amount of each lens element is calculated in directions of 6 degrees of freedom, and the calculation results are shown on the display of the exposure apparatus via the first communications server 920.

Then, according to the display, the technician (worker) adjusts each lens element. As a result, projection optical system PL is made that satisfies the decided configurations without fail.

The final adjustment of projection optical system PL in its making stage can be performed by automatic adjustment by main controller 50 via image forming quality correction controller 48, based on instructions from the second communications server 930. However, at the point when the making of the exposure apparatus has been completed, each movable lens is preferably maintained at a neutral position so that the drive strokes of the drive elements after the exposure apparatus has been delivered are sufficiently secured. In addition, the aberration that has not been corrected at this stage, mainly high order aberration, may be decided as aberration that cannot be automatically corrected, therefore, the assembly of the lenses or the like is preferably readjusted in the manner described above.

When the desired quality cannot be obtained by the above readjustment, some lenses may have to be reprocessed or exchanged. In order to reprocess the optical elements of projection optical system PL easily, the wavefront aberration can be measured before assembling projection optical system PL into the exposure apparatus main body using the wavefront aberration measuring unit only for measuring the wavefront aberration, and based on the measurement results the presence of the optical element that requires reprocessing and its position can be specified, and the reprocessing of the optical element and the readjustment of the remaining optical elements may be performed in parallel.

In addition, the optical element may be exchanged per the optical element of projection optical system PL, or, when the projection optical system has a plurality of barrels, it may be exchanged per barrel. Furthermore, in the reprocessing of the optical element, the surface may be processed into an aspheric surface if necessary. Also, when adjusting projection optical system PL, the adjustment may be made only on the position of the optical element (including the spacing between optical elements) and its inclination, or when the optical element is a lens element, it eccentricity may be changed or it may be rotated with the optical axis AX serving as the center. Furthermore, in order to correct the aberration of projection optical system PL, especially the non-rotational symmetric component, for example, the wavefront aberration may be measured in a state where a plane-parallel plate is assembled into projection optical system PL. And based on the measurement results, the surface of the plane-parallel plate disassembled from projection optical system PL may be processed, and then the processed plane-parallel plate (aberration correcting plate) may be reassembled into projection optical system PL. With such operation, projection optical system PL can be easily adjusted, or the adjustment can be performed with higher precision. The wavefront aberration may be measured with the aberration correcting plate fixed to projection optical system PL, and based on the measurement results the aberration correction plate may be reprocessed or exchanged.

Then, overall adjustment (such as electrical adjustment and operation verification) is further performed. By such operations, exposure apparatus 922 in the embodiment that can transfer a pattern of reticle R on wafer W with good precision using projection optical system PL whose optical properties have been adjusted with high precision can be made. The exposure apparatus is preferably built in a clean room where the temperature and the degree of cleanliness are controlled.

As is obvious from the description so far, in the embodiment, movable lenses $13_1$ to $13_5$, Z tilt stage 58 and light source 16 constitute an adjustment section, and the position (or the variation amount) of movable lenses $13_1$ to $13_5$ and Z tilt stage 58 in the Z, θx, and θy directions and the shift amount of the wavelength of the illumination light make up the adjustment amount. And, the above adjustment section, drive elements that drive the movable lenses, wafer stage drive section 56 that drives image forming quality correction controller 48 and Z tilt stage 58, and main controller 50 which controls image forming quality correction controller 48, wafer stage drive section 56, and light source 16 constitute an adjustment unit. However, the arrangement of the adjustment unit is not limited to this, and for example, the adjustment unit section may only include movable lenses $13_1$ to $13_5$. Even in such a case, the image forming quality (aberrations) of the projection optical system can be adjusted.

In addition, in the description so far, the measurement of the wavefront aberration performed at times such as the adjustment of projection optical system PL has been performed using wavefront aberration measuring instrument 80, based on the aerial images formed via pinholes and projection optical system PL. However, the present invention is not limited to this, and the wavefront aberration may be measured using a measurement mask that has a special structure, which is disclosed in, for example, U.S. Pat. No. 5,978,085. In this method, a plurality of measurement patterns on the mask is sequentially exposed on an object via pinholes that are individually provided and projection optical system PL, while reference patterns on the mask are exposed on the object via only the projection optical system without passing through the condenser lens and pinholes. Then, the positional deviation of each of the resist images of the plurality of measurement patterns to the resist images of the reference patterns that are obtained from the exposure are measured, and the wavefront aberration is calculated by a predetermined calculation.

Furthermore, the wavefront aberration may be measured using a PDI (Point Diffraction Interferometer), such as the one disclosed in, for example, Japanese Patent Application Laid-open No. 2000-97617. In addition, methods such as a phase recovering method whose details are disclosed in, for example, Japanese Patent Application Laid-open No. H10-284368, and in U.S. Pat. No. 4,309,602, and a method that uses a halftone phase shift mask whose details are disclosed in, for example, Japanese Patent Application Laid-open No. 2000-146757, can also be used. Moreover, a method that uses a beam that passes through a part within the pupil of the projection optical system can also be used, as is disclosed in, for example, Japanese Patent Application Laid-open No. H10-170399, Jena Review 1991/1, pp 8-12 "Wavefront analysis of photolithographic lenses" Wolfgang Freitag et al., Applied Optics Vol. 31, No. 13, May 1, 1992, pp 2284-2290 "Aberration analysis in aerial images formed by lithographic lenses", Wolfgang Freitag et al., and in Japanese Patent Application Laid-open No. 2002-22609.

As is described in detail, according to computer system 10 related to the embodiment, when the first mode previously described is selected, the second communications server 930 calculates the optimal adjustment amount of the adjustment unit under the target exposure condition, based on the adjustment information of the above adjustment unit and the information related to the image forming quality of the projection optical system such as the wavefront aberration under the reference exposure condition (reference ID). In this case, the relation between the adjustment information of the above adjustment unit and the image forming quality of the projection optical system such as the wavefront aberration under the reference exposure condition is known, and when the adjustment is performed, the image forming quality of the projection optical system is supposed to be accurate. Accordingly, the optimal adjustment amount under the target exposure condition, which is calculated based on the adjustment information of the above adjustment unit and the wavefront aberration of the projection optical system under the reference exposure condition, will have high accuracy. In addition, based on the calculated adjustment amount, the second communications server 930 adjusts the adjustment unit referred to earlier via the first communications server 920. Accordingly, with computer system 10 related to the embodiment, it is possible to swiftly optimize the image forming state of a projected image of the reticle pattern by projection optical system PL on wafer W under any target exposure condition.

In the embodiment, the second communications 930 is to adjust the adjustment unit, based on the calculation results of the optimal adjustment amount. The second communications server 930, however, does not necessarily have to perform the adjustment operation. That is, the second communications server 930 may only perform the calculation of the adjustment amount. Even in such a case, by transmitting the information on the calculated adjustment amount to the first communications server 920, exposure apparatus 922, or the operator of such equipment or the like such as through e-mail, the adjustment unit can be adjusted based on the information in a manner similar to the one described in the above embodiment by the first communications server 920 or exposure apparatus 922 themselves, or in response to the instructions from the operator. And, even in such a case, it is possible to swiftly optimize the image forming state of a projected image of the reticle pattern by projection optical system PL on wafer W under any target exposure condition, as is described in the above embodiment.

In this case, since the information related to the image forming quality only has to be basic information when calculating the optimal adjustment amount of the adjustment unit under the target exposure condition, along with the adjustment information of the adjustment unit, it may contain various kinds of information. That is, the information related to the image forming quality may include information on the wavefront aberration of the projection optical system that has been adjusted under the reference exposure condition as in the embodiment described above. Or, it may include information on the wavefront aberration of the stand-alone projection optical system as well as information on the image forming quality of the projection optical system under the reference exposure condition. In the latter case, information on the wavefront aberration of the projection optical system after adjustment under the reference exposure condition may be calculated from the image forming quality, using the estimation method of the wavefront aberration previously described.

In addition, according to computer system 10 related to the embodiment, when the second mode previously described is selected, the second communications server 930 calculates the optimal adjustment amount of the adjustment unit under the target exposure condition, based on the adjustment information of the above adjustment unit and the image forming quality of the projection optical system such as the actual measurement data on wavefront aberration under a predetermined target condition. That is, because the optimal adjustment amount of the adjustment unit under the target exposure condition is calculated based on actual measurement data of the wavefront aberration of the projection optical system measured under the target exposure condition, the adjustment amount can be accurately calculated.

In addition, the second communications server 930 adjusts the adjustment unit described earlier via the first communications server 920, based on the adjustment amount calculated in the second mode. Accordingly, with computer system 10 related to the embodiment, it is possible to swiftly optimize the image forming state of a projected image of the reticle pattern by projection optical system PL on wafer W under any target exposure condition. Since the adjustment amount calculated in this case is based on actual measurement values, the accuracy is the same or better than the case in the first mode.

In this case, as the actual measurement data, any kind of data may be used as long as it may be the base when calculating the optimal adjustment amount of the adjustment unit under the target exposure condition, along with the adjustment information of the adjustment unit. For example, the actual measurement data may include the actual measurement data of the wavefront aberration under the target exposure condition as in the embodiment. The present invention, however, is not limited to this, and the actual data may also include the actual measurement data of any image forming quality under the target exposure condition. Even in such a case, the wavefront aberration can be obtained by simple calculation, using the actual measurement data of the image forming quality and the Zernike Sensitivity Chart (ZS file) previously described.

In addition, in the embodiment, the second communications server 930 makes the Zernike Sensitivity Chart under the target exposure condition by interpolation calculation, based on Zernike Sensitivity Charts under a plurality of reference exposure conditions. Therefore, even when the Zernike Sensitivity Chart under the target exposure condition is not prepared in advance, it can be swiftly obtained by interpolation calculation using the Zernike Sensitivity Charts under a plurality of reference exposure conditions.

In addition, according to computer system 10 related to the embodiment, wavefront aberration measuring instrument 80 in exposure apparatus 922 self-measures the wavefront of projection optical system PL. The first communications server 920 transmits the measurement results of the wavefront of projection optical system PL measured by wavefront aberration measuring instrument 80 to the second communications server 930 via a communications channel. The second communications server 930 uses the measurement results of the wavefront to control the adjustment unit previously described. Accordingly, the image forming quality of projection optical system PL is adjusted with good accuracy using the information of the wavefront on the pupil plane of the projection optical system, that is, the overall information of the wavefront that passes through the pupil plane. As a consequence, the image forming state of the pattern by the projection optical system is adjusted to an optimum. In this case, the second communications server 930 can be arranged at a position away from exposure apparatus 922 and the first communications server 920 joined to exposure apparatus 922. In such a case, the image forming quality of projection optical system PL, and in turn the image forming state of the pattern by projection optical system PL can be adjusted with high precision by remote control.

In addition, when an intranet system as in FIG. 1 is built within an exposure apparatus maker, the first communications server 920 is installed, for example, in a clean room side of a research development department, such as in a place where the exposure apparatus is built and adjusted (hereinafter referred to as a 'site'), and the second communications server 930 is installed in a laboratory away from the site. Then, the engineer at the site sends the measurement of the wavefront aberration previously described and the information on exposure conditions of the exposure apparatus at the experimental stage (including pattern information) to the second communications server 930 at the laboratory side via the first communications server 920. And, the engineer at laboratory side remotely performs automatic correction of the image forming quality of projection optical system PL of exposure apparatus 922 based on the information received, using the second communications server 930 in which a software program designed by the engineer is installed in advance. And then, by receiving the measurement results of the wavefront aberration of the projection optical system whose image forming quality has been adjusted, the results of the adjustment of the image forming quality can be confirmed, which may also be useful during the development stage when developing software.

The processing algorithm of the second communications server described in the above embodiment is a mere example, and it is a matter of course that the image forming state adjusting system in the present invention is not limited to this.

For example, specifying the weight (weight of image forming quality, weight at each evaluation point within the field) previously described, specifying the target (target value of the image forming quality at each evaluation point within the field), and specifying the optimizing field range do not necessarily have to be performed. This is because these can be specified in advance as a default setting, as is previously described.

Due to similar reasons, specifying permissible values and restraint conditions do not necessary have to be performed.

On the other hand, other functions that have not been described so far may be added. For example, specifying the evaluation mode may be added. More specifically, for example, specifying the evaluation method such as the absolute value mode or the maximum minimum width mode (per axis, all) may be added. In this case, because the optimizing calculation itself is performed with the absolute value of the image forming quality as the target at all times, the absolute value mode is to be a default setting, and the maximum minimum width mode is to be optional.

To be more specific, for example, with distortion whose average values may be deducted as offset in both the X-axis direction and Y-axis direction, the maximum minimum width mode (range/offset per axis) can be specified. In addition, with TFD (total focus difference due to in-plane evenness in astigmatism and curvature of field) or the like whose average value of the entire XY plane is deducted as offset, the maximum minimum width mode (range/total offset) can be specified.

The maximum minimum width mode will be required when the measurement results are evaluated. That is, when the decision is made whether the width is within a permissible value range, and the width turns out to be off the permissible value range, the optimizing calculation can be performed again with different calculation conditions (such as weight).

In addition, in the above embodiment, the necessary ZS files were made by the interpolation method previously described, however, the present invention is not limited to this. For example, the ZS files may be made when necessary in methods other than the interpolation method, or more ZS files may be prepared in advance and the ZS file that has the closest conditions may be selected and used as the ZS file.

In addition, in the above embodiment, in the case of mode 1, wavefront aberration that has been calculated under the reference ID is used, while in the case of mode 2, wavefront aberration that has been actually measured is used, and in the case of mode 3, wavefront aberration data similar to mode 1 is used. However, for example, wavefront aberration that has been actually measured may be used in the case of mode 3. That is, the 12 types of aberration previously described may be obtained by calculation under various exposure conditions based on the wavefront aberration actually measured, and when the best exposure condition is decided based on the calculation results, a more accurate best exposure condition can be decided because the actual measurement data has been used as the basic data.

In addition, in the cases of mode 1 and mode 3, instead of using wavefront aberration that has been calculated under the reference ID, wavefront aberration that has been actually measured may be used. The point is that the data used on the optimizing calculation or the like is wavefront aberration data.

In addition, instead of the wavefront aberration, actual measurement data on individual image forming quality can be used as is previously described. However, such measurement of the image forming quality may simply be detecting the pattern image of the image with an aerial image measuring instrument whose photodetection surface is provided on Z tilt stage 58, or transferring the reticle pattern onto the wafer, detecting the transferred image (such as a latent image or a resist image), and obtaining the image forming quality from the detection results.

In addition, in the above embodiment, three modes from mode 1 to mode 3 can be set in the second communications server. The modes, however, may also be set only to mode 1, mode 2, modes 1 and 2, modes 1 and 3, and modes 2 and 3.

In the description so far, from the viewpoint of avoiding complication, no particular reference is made to the point that the image forming quality of the projection optical system changes due to an atmospheric pressure change of the environment in which the exposure apparatus is installed and the quantity of energy irradiated on the projection optical system, that is, the so-called atmospheric pressure change and the so-called irradiation fluctuation of the image forming quality. However, in the above embodiment, such points may be taken into consideration.

For example, basic data on atmospheric pressure change can be obtained by monitoring the relation between the change of atmospheric pressure in the environment in which the projection optical system is arranged and the image forming quality (for example, wavefront aberration), or by housing the projection optical system in a decompression chamber and measuring the change in the image forming quality while changing the inner pressure of the decompression chamber. In addition, basic data on irradiation fluctuation can be obtained by actually measuring the change in the image forming quality when the illumination light is irradiated on the projection optical system. As a matter of course, these basic data can also be obtained by performing a highly precise optical simulation.

Meanwhile, in the embodiment previously described, when the database is made for the wavefront aberration variation table under the reference ID or the like, reference values can be assumed for such atmospheric pressure and irradiation quantity, and the database such as the wavefront aberration variation table can be made taking the values into consideration by the simulation referred to earlier. Then, for example, when mode 1 previously described is selected, as a premise for using the calculated wavefront aberration under the reference ID, the second communications server 930 loads the measurement data of a sensor that measures the atmospheric pressure in chamber 11 (or in the clean room) of exposure apparatus 922 subject to adjustment amount calculation and the irradiation record in the log data that main controller 50 of exposure apparatus 922 collects via the first communications server 920, when it performs the optimizing of the image forming state. Then, based on such data, the second communications server 930 calculates the fluctuation amount of the atmospheric pressure and irradiation quantity from a reference atmospheric pressure and a reference irradiation quantity under the reference ID. And based on such calculation results, the second communications server 930 calculates the atmospheric pressure and irradiation quantity of the image forming quality of the projection optical system, and taking the calculated results into consideration, performs the optimizing process using the calculated wavefront aberration under the reference ID in mode 1 previously described.

For example, the optimal condition under the target exposure condition is not directly calculated based on data such as the wavefront aberration variation table under the reference ID (the exposure condition serving as a reference), but is calculated by making a third exposure condition that either has at least a different atmospheric pressure or a different illumination light quantity of the projection optical system compared to the reference ID stand between the reference ID and the target exposure condition, obtaining the data on wavefront aberration variation table or the like under the third exposure condition (a more accurate data on wavefront aberration variation table or the like, which is various data such as the wavefront aberration variation table or the like under the reference ID that has been corrected so that the atmospheric change and irradiation fluctuation in the image forming quality of the projection optical system are taken into consideration), and then calculating the optimal condition under the target exposure condition based on the data that has been obtained.

Not only in the case of mode 3, but also in mode 2, the above atmospheric change and irradiation fluctuation in the image forming quality of the projection optical system may also similarly be taken into consideration. This can also be said for the modified example that will be described later in the description.

The various changes described above in the processing algorithm of the second communications server can be easily made by making changes to the software.

The system configuration described in the above embodiment is a mere example, and the image forming state adjusting system related to the present invention is not limited to this. For example, as in the computer system shown in FIG. 22, the system may employ a configuration that comprises a public line 916 as a part of its communication channel.

Computer system 10' shown in FIG. 22 comprises a lithographic system 912' set up in a semiconductor manufacturing site of a device manufacturer (hereinafter referred to as 'maker A' as appropriate) that uses device manufacturing equipment such as an exposure apparatus, and a computer system 914 of an exposure apparatus maker (hereinafter referred to as 'maker B' as appropriate) joined to lithographic system 912' via the communication channel that has a public line 916 as a part of its channel.

Lithographic system 912' comprises a first communications server 920, a first to third exposure apparatus $922_1$ to $922_3$, and a first authentication proxy server 924 connecting reciprocally via a LAN 918.

The first communications server 920 and each of the first to third exposure apparatus $922_1$ to $922_3$ are to have an assigned address, AD1 to AD4, respectively.

The first authentication proxy server 924 is provided in between LAN 918 and public line 916, and in this case, functions as a kind of a firewall. That is, the first authentication proxy server 924 secures the communications of data flowing through LAN 918 from the outside, and by allowing access only to information from the outside that has the addresses AD1 to AD4 and blocking other information, it protects LAN 918 from external attacks.

Computer system 914 comprises a second authentication proxy server 928 and a second communications server 930 connecting reciprocally via a LAN 929. In this case, an address AD5 is assigned to the second communications server 930 for identification.

Similar to the first authentication proxy server 924, the second authentication proxy server 928 functions as a kind of a firewall that secures the communications of data flowing through LAN 929 from the outside, and protects LAN 929 from external attacks.

Figure 22:
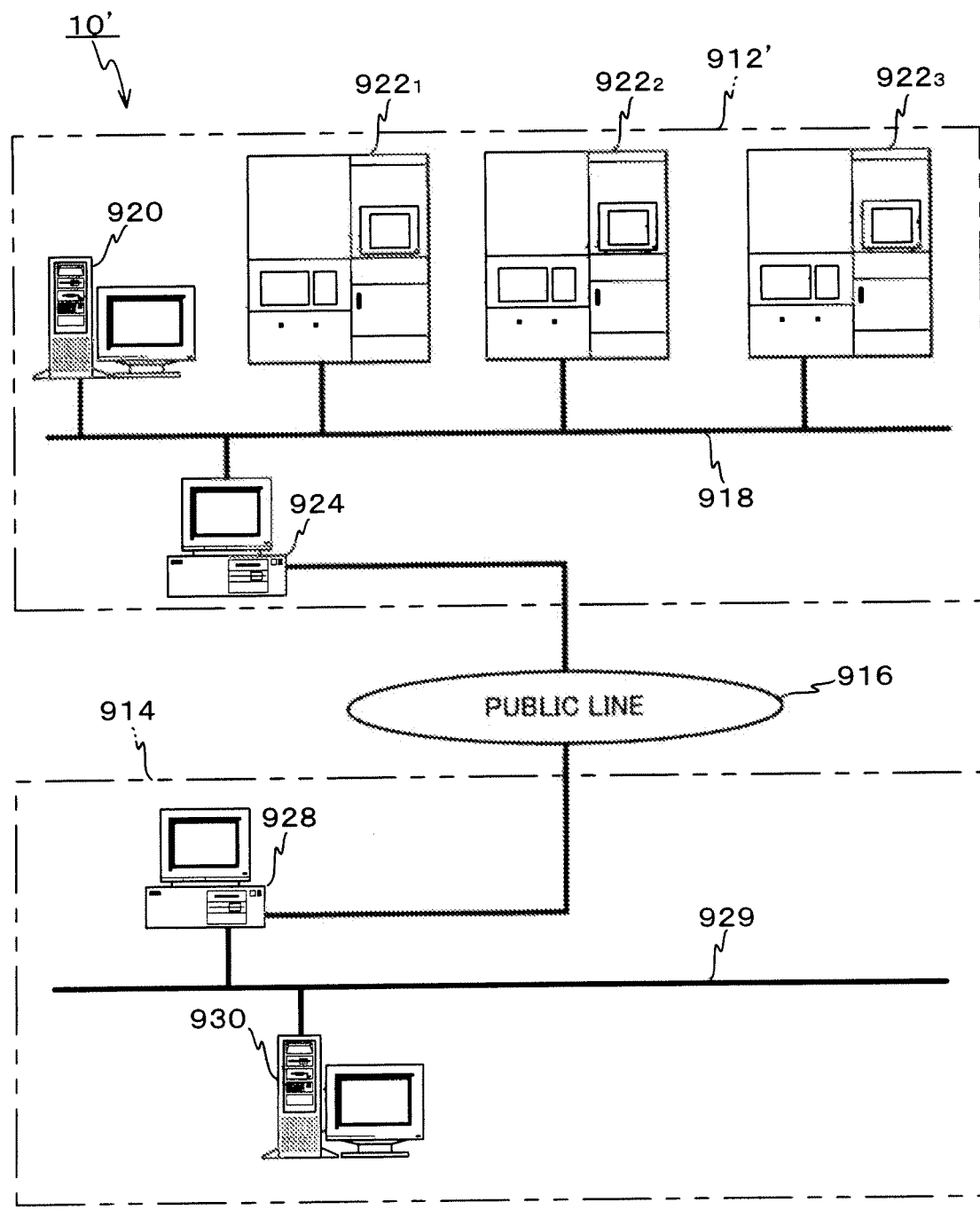
FIG. 22 is a view showing a configuration of a computer system related to a modified example.

In system 10' in FIG. 22, when data is transmitted outside the system from the first to third exposure apparatus $922_1$ to $922_3$, it is transmitted via the first communications server 930 and the first authentication proxy server 924, while data transmitted from the outside to the first to third exposure apparatus $922_1$ to $922_3$ goes via the first authentication proxy server 924 and then directly to the first to third exposure apparatus, or via the first authentication proxy server 924 and the first communications server 920.

System 10' in FIG. 22 is suitable for times such as periodic maintenance when a service technician or the like who is visiting maker A on business adjusts the image forming state of the projected image of a pattern on the object in the exposure apparatus, using the optimizing program previously described which is installed in the second communications server 930.

Besides the above description, the following operation is possible with the system configuration in FIG. 22. More particularly, in the automatic adjustment of the adjustment unit previously described, there may be cases when the aberration is difficult to correct. In such a case, the service technician can perform the wavefront aberration at the site (maker A side) and send the data to the second communications server 930 via the first communications server 920 and public line 916. Then, a skilled engineer of maker B can retrieve the measurement data of the wavefront from the hard disc of the second communications server 930 and show it on the display, analyze the contents, and figure out the problems. And when the engineer finds an aberration that is difficult to correct by automatic adjustment, instructions on precise countermeasures can be input from the keyboard or the like of the second communications server 930 and transmitted so that can be shown on the screen of display unit 44 of exposure apparatus 922. Then, the service technician at maker A can perform fine adjustment on the lens assembly based on the contents displayed, which allows the projection optical system to be adjusted in a short period of time.

In addition, in the above embodiment and the modified example in FIG. 22, the case has been described when the optimizing program that has been described earlier is stored within the second communications server 930. However, the present invention is not limited to this, and a CD-ROM in which the optimizing program and the database that goes with the program are stored may be set in the CD-ROM of the first communications server 920, and the optimizing program and the database that goes with the program may be installed or copied into the storage unit such as the hard disc of the first communications server 920. Such an arrangement allows the optimizing processing to be performed, by the first communications server 920 simply receiving the information from exposure apparatus 922.

In addition, as is previously described, in the hard disc or the like of the first communications server 920, target information that is to be achieved in the first to third exposure apparatus $922_1$ to $922_3$ is stored, such as resolution, practical minimum line width (device rule), wavelength of illumination light EL (such as center wavelength and wavelength width), information on the pattern subject to transferring, and any other information related to the projection optical system that decides the quality of exposure apparatus $922_1$ to $922_3$ that can become a target value. In addition, in the hard disc or the like of the first communications server 920, target information related to the exposure apparatus that will be used, such as information on the pattern that will be used, is also stored as target information.

Accordingly, the best exposure condition can be automatically set, by setting the default setting of the mode to mode 3 and making a change in the software so that the various condition settings that the operator performs in mode 3 is performed by the first communications server 920 itself instead.

Or, the CD-ROM in which the optimizing program and the database that goes with the program can be set in drive unit 46 of exposure apparatus 922, and the optimizing program and the database that goes with the program may be installed or copied into storage unit 42 such as the hard disc from the CD-ROM drive. When such an arrangement is employed, exposure apparatus 922 will be able to perform the optimizing processing that has been described on its own. Instead of the operator inputting the pattern information, the exposure apparatus may obtain the information from a host computer at the device manufacturing site of maker A or by reading a barcode or a two-dimensional code provided in the reticle on which the pattern to be transferred to the wafer is formed, and automatically adjust projection optical system PL, without having an operator or a service technician intervening. In this case, main computer 50 will constitute the processing unit that controls the adjustment previously described.

That is, main controller 50 performs the mode 1 processing (including the decision making) and calculates the optimal adjustment amount of the adjustment unit under the target exposure condition based on adjustment information on the adjustment unit and information related to the image forming quality of the projection optical system such as wavefront aberration under the reference exposure condition (reference ID), and then controls the adjustment unit based on the calculated adjustment amount. As a result, for similar reasons described earlier in the description, the image forming state of the projected image of a pattern on the wafer under any target exposure condition is substantially automatically optimized.

In this case, the information related to the image forming quality can include various types of information. For example, it may include information on wavefront aberration of the projection optical system that has already been adjusted under the reference ID, or it may include information on the stand-alone wavefront aberration of the projection optical system and the image forming quality of the projection optical system under the reference ID.

In addition, main controller 50 performs the mode 2 processing and calculates the optimal adjustment amount of the adjustment unit under the target exposure condition based on adjustment information on the adjustment unit and actual measurement data of the image forming quality of the projection optical system (wavefront aberration or other types of aberration) under a predetermined target exposure condition, and then controls the adjustment unit based on the calculated adjustment amount. In this case, for similar reasons described earlier in the description, the image forming state of the projected image of a pattern on the wafer under any target exposure condition is substantially automatically optimized. And, in this case, the adjustment unit is controlled based on a more accurate adjustment amount than that of the case in mode 1.

In the above embodiment, when using the actual measurement data of the wavefront aberration as the actual measurement data of the image forming quality of the projection optical system, the wavefront aberration measurement can be performed using, for example, a wavefront aberration measuring unit. As such a wavefront aberration measuring unit, a unit that is shaped so that it can be totally exchanged with the wafer holder may be used. In such a case, the wavefront aberration measuring unit can be automatically carried, using a carriage system (such as a wafer loader) that loads and unloads the wafer or the wafer holder onto wafer stage WST (Z tilt stage 58). The wavefront aberration measuring unit loaded onto the wafer stage, such as wavefront aberration measuring instrument 80 does not have to be completely assembled into the wafer stage, and only a part of it may be arranged within the wafer stage with the remaining arranged outside. Furthermore, in the above embodiment, the aberration of the photodetection optical system of wavefront aberration measuring instrument 80 is ignored, however, the wavefront aberration of the projection optical system can be decided taking such wavefront aberration into consideration.

In addition, on wavefront aberration measurement, when a measurement reticle disclosed in for example, the U.S. Pat. No. 5,978,085 referred to earlier, is used, the positional deviation of the latent image of a measurement pattern transferred and formed on the resist layer on the wafer with respect to the latent image of a reference pattern may be detected, for example, by alignment system ALG in the exposure apparatus. In the case of detecting the latent image of the measurement pattern, a photoresist may be used as the sensitive layer of an object such as the wafer, or a magnet optical material. Furthermore, the exposure apparatus and coater developer may be inline connected so that the resist image obtained by developing an object such as the wafer on which the measurement pattern is transferred, or furthermore, the etched image obtained by the etching process, may be detected by alignment system ALG in the exposure apparatus. In addition, a measurement unit may be provided separately, apart from the exposure apparatus to detect the transferred images (such as the latent image or the resist image) of the measurement pattern, and the results may be sent to the exposure apparatus via LAN or Internet, or by radio communication. And, in addition to the description so far, the mode setting in the optimizing program referred to earlier is to be arranged so that mode 1 is selected by the default setting. Such devised ideas allow the first communications server to perform the automatic adjustment of the image forming quality of projection optical system PL described earlier automatically, without any intervening by an operator or a service technician. Similarly, the exposure apparatus can perform the automatic adjustment of the image forming quality of projection optical system PL previously described by itself also by having the optimizing program installed into storage unit 42 in exposure apparatus 922, without any intervening by an operator or a service technician.

Besides such details, the first communications server 920 and the second communications server 930 may be joined by a radio link.

In the above embodiment and the modified example, the case has been described where optimizing is performed on the 12 types of image forming quality, however, the type (number) of image forming quality is not limited to this, and by changing the type of exposure condition subject to optimizing, the number of image forming quality to be optimized may be increased or decreased. For example, the type of image forming quality included as an evaluation quantity in the Zernike Sensitivity Chart simply has to be changed.

In addition, in the above embodiment and the modified example, the case has been described where all the coefficients of the $1^{st}$ to $n^{th}$ terms in the Zernike polynomial are used, however, the coefficient does not have to be used in at least one term of the $1^{st}$ to $n^{th}$ terms. For example, the corresponding image forming quality may be adjusted as usual, without using the coefficients of the $2^{nd}$ to $4^{th}$ terms. In this case, when the coefficients of the $2^{nd}$ to $4^{th}$ terms are not used, the adjustment of the corresponding image forming quality may be performed by adjusting the position of at least one of movable lenses $13_1$ to $13_5$ described earlier in directions of three degrees of freedom, or it may be performed by adjusting the Z position and the inclination of wafer W (Z tilt stage 58).

In addition, in the above embodiment and the modified example, the case has been described where the wavefront measuring unit performs calculation up to the $81^{st}$ term while the wavefront aberration measuring instrument performs calculation up to the $37^{th}$ term, or the terms of 82 and over are calculated, however, the present invention is not limited to this. Similarly, the wavefront aberration variation table previously described is not limited to the ones on the $1^{st}$ to $37^{th}$ terms.

Furthermore, in the above embodiment and the modified example, the case has been described where optimizing is performed using the Least Squares Method or Damped Least Squares Method, however, the following methods can also be used: (1) gradient methods such as the Steepest Decent Method or the Conjugate Gradient Method, (2) Flexible Method, (3) Variable by Variable Method, (4) Orthonomalization Method, (5) Adaptive Method, (6) Quadratic Differentiation, (7) Global Optimization by Simulated annealing, (8) Global Optimization by Biological evolution, and (9) Genetic Algorithm (refer to U.S. Patent Application No. 2001/0053962).

In each of the above embodiments, the case has been described where a LAN, or a LAN and a public line or other signal cables are used as the communication channel, however, the present invention is not limited to this, and the signal cables and the communication channel may either be wired or wireless.

In addition, in the above embodiment and the modified example, the case has been described where σ value (coherence factor) and annular ratio are used as the information on illumination condition in normal illumination and annular illumination, respectively. In the annular illumination, however, in addition to, or instead of the annular ratio, the inside diameter or the outside diameter may be used. Or, in the modified illumination such as in quadrupole illumination (also called SHRINC or multipole illumination), because the dose of the illumination dose distribution on the pupil plane of the illumination optical system increases in a plurality of partial areas whose dose centroid are set at positions of a substantially equal distance from the optical axis of the illumination optical system, the positional information of the plurality of partial areas (dose centroid) on the pupil plane of the illumination optical system (for example, the coordinate values in a coordinate system whose origin is the optical axis on the pupil plane of the illumination optical system), the distance between the plurality of partial areas (dose centroid) and the optical axis of the illumination optical system, and the size of the partial area (which corresponds to the σ value) may also be used as the information.

Furthermore, in the above embodiment and the modified example, the case has been described where the image forming quality is adjusted by moving the optical elements of projection optical system PL. The image forming quality adjustment mechanism, however, is not limited to the drive mechanism of the optical elements, and in addition to, or instead of the drive mechanism, mechanisms may be used that changes the pressure of gas in between the optical elements of projection optical system PL, moves or inclines reticle R in the optical axis direction of the projection optical system, or changes the optical thickness of the plane-parallel plate disposed in between the reticle and the wafer. However, in such a case, the number of degrees of freedom may be changed in the above embodiment and the modified example.

In addition, in the above embodiment and the modified example, the case has been described where exposure apparatus 922 is provided in plurals and the second communications server 930 shares a link with the plurality of exposure apparatus $922_1$ to $922_3$ via a communication channel. However, the present invention is not limited to this, and as a matter of course, the exposure apparatus may be singular.

In the above embodiment, the case has been described where a stepper is used as the exposure apparatus. The present invention, however, is not limited to this, and a scanning exposure apparatus that transfers a pattern of a mask onto an object while synchronously moving the mask and the object, such as the one disclosed in, for example, U.S. Pat. No. 5,473,410, may also be used.

Furthermore, in the above embodiment and the modified example, the case has been described where the plurality of exposure apparatus used has the same configuration. However, an exposure apparatus whose wavelength of illumination light EL is different may also be used together, or an exposure apparatus that has a different configuration, such as a static type exposure apparatus (such as a stepper) and a scanning type exposure apparatus (such as a scanner) may be combined. In addition, a part of the plurality of exposure apparatus may be an exposure apparatus that uses charged particle beams such as an electron beam or an ion beam. Also, an immersion exposure apparatus that has liquid filled in between projection optical system PL and the wafer whose details are disclosed in, for example, the International Publication WO99/49504, may be used.

The usage of the exposure apparatus in this case is not limited to the exposure apparatus used for manufacturing semiconductors, but it can also be widely applied to an exposure apparatus used for transferring a liquid crystal display device pattern onto a square glass plate when manufacturing liquid crystal displays, or to an exposure apparatus used for manufacturing display devices such as a plasma display or an organic EL, pick-up devices (such as a CCD), thin film magnetic heads, micromachines, and DNA chips. In addition, the present invention can also be applied not only to an exposure apparatus used for manufacturing microdevices such as a semiconductor, but also to an exposure apparatus that transfers a circuit pattern onto a glass substrate or a silicon wafer in order to manufacture a reticle or a mask used in an optical exposure apparatus, an EUV exposure apparatus, and X-ray exposure apparatus, and an electron beam exposure apparatus.

In addition, the light source of the exposure apparatus in the above embodiment is not limited to the ultraviolet pulse light source such as the $F_2$ laser, ArF excimer laser, and KrF excimer laser, and a continuous light source as in, for example, an extra-high pressure mercury lamp that emits an emission line such as a g-line (wavelength 436 nm) or an i-line (wavelength 365 nm) can also be used. Furthermore, as illumination light EL, X-ray may also be used, especially EUV light.

In addition, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Also, the magnification of the projection optical system is not limited to a reduction system, and an equal magnification or a magnifying system may be used. Furthermore, the projection optical system is not limited to a refraction system, and a catadioptric system that has reflection optical elements and refraction optical elements may be used as well as a reflection system that uses only reflection optical elements. When the catadioptric system or the reflection system is used as projection optical system PL, the image forming quality of the projection optical system is adjusted by changing the position or the like of the reflection optical elements (such as a concave mirror or a reflection mirror) that serve as the movable optical elements previously described. In addition, when especially the $Ar_2$ laser beam or the EUV light or the like is used as illumination light EL, projection optical system PL can be a total reflection system that is made up only of reflection optical elements. However, when the $Ar_2$ laser beam, the EUV light, or the like is used, reticle R also needs to be a reflective type reticle.

Incidentally, semiconductor devices are made undergoing the following steps: a device function/performance designing step, a reticle making step where a reticle is made based on the designing step, a wafer making step where a wafer is made from silicon material, a transferring step where the pattern of the reticle is transferred onto the wafer by the exposure apparatus in the embodiment, a device assembly step (including the dicing process, bonding process, and packaging process), and an inspection step. According to the device manufacturing method, because exposure is performed in a lithographic process using the exposure apparatus in the above embodiment, the pattern of reticle R is transferred onto wafer W via projection optical system PL whose image forming quality is adjusted according to the subject pattern, or whose image forming quality is adjusted with high precision based on the measurement results of the wavefront aberration, and therefore it is possible to transfer fine patterns onto wafer W with high overlay accuracy. Accordingly, the yield of the devices as final products is improved, which makes it possible to improve its productivity.

While the above-described embodiment of the present invention is the presently preferred embodiment thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that forms a pattern on an object via a projection optical system, said apparatus comprising:
    a setting device that sets an exposure condition whose a setting value is variable in at least one setting information among a plurality of setting information, related to a projection condition of a pattern subject to projection by said projection optical system;
    an adjustment system that adjusts an imaging state of a pattern by said projection optical system; and
    a calculating device which decides optimal adjustment amounts of said adjustment system under a plurality of exposure conditions that have different setting values in said at least one setting information to optimize said imaging state for each exposure condition, respectively, based on information related to wavefront aberration of said projection optical system and a plurality of Zernike Sensitivity Charts that correspond to said plurality of exposure conditions and are different from each other,
    the calculating device making at least one of said plurality of Zernike Sensitivity Charts by interpolation calculation based on different Zernike Sensitivity Charts from said at least one Zernike Sensitivity Chart.

2. The exposure apparatus in claim 1 wherein
said information related to wavefront aberration is estimated from information on image forming property of said projection optical system.

3. The exposure apparatus in claim 1 wherein
said information related to wavefront aberration is obtained from positional information of a pattern image within an image plane of said projection optical system.

4. The exposure apparatus in claim 1 wherein
a restraint condition with respect to an adjustment amount of said adjustment system is used to decide said optimal adjustment amounts.

5. The exposure apparatus in claim 4 wherein
information related to a permissible error value of said imaging state is used to decide said optimal adjustment amounts.

6. The exposure apparatus in claim 5 wherein
a wavefront aberration variation table, that denotes a relation between an adjustment amount of said adjustment system and a change in coefficients of terms in a Zernike polynomial, is used to decide said optimal adjustment amounts.

7. The exposure apparatus in claim 6 wherein
said Zernike Sensitivity Chart denotes a relation between said forming state and coefficients of terms in said Zernike polynomial.

8. The exposure apparatus in claim 1 wherein
said optimal adjustment amounts are calculated using a weighting function that performs weighting on at least one term of a Zernike polynomial.

9. The exposure apparatus in claim 8 wherein
said projection condition includes an illumination condition of said pattern.

10. An exposure method of forming a pattern on an object via a projection optical system, comprising:
    deciding optimal adjustment amounts of an adjustment system, which adjusts an imaging state of a pattern by said projection optical system, under a plurality of exposure conditions that have different setting values in at least one setting information among a plurality of setting information, related to a projection condition of a pattern subject to projection by said projection optical system to optimize said imaging state for each exposure condition, respectively, based on information related to wavefront aberration of said projection optical system and a plurality of Zernike Sensitivity Charts that correspond to said plurality of exposure conditions and are different from each other,
    wherein exposures under said plurality of exposure conditions are performed based on said decided optimal adjustment amounts, and at least one of said plurality of Zernike Sensitivity Charts is made by interpolation calculation based on different Zernike Sensitivity Charts from said at least one Zernike Sensitivity Chart.

11. A device manufacturing method comprising:
exposing an object by said exposure method according to claim 10; and
processing the exposed object for manufacturing a device.

12. The exposure method in claim 10 wherein
said information related to wavefront aberration is estimated from information on image forming property of said projection optical system.

13. The exposure method in claim 10 wherein
said information related to wavefront aberration is obtained from positional information of a pattern image within an image plane of said projection optical system.

14. The exposure method in claim 10 wherein
a restraint condition with respect to an adjustment amount of said adjustment system is used to decide said optimal adjustment amounts.

15. The exposure method in claim 14 wherein
information related to a permissible error value of said imaging state is used to decide said optimal adjustment amounts.

16. The exposure method in claim 15 wherein
a wavefront aberration variation table, that denotes a relation between an adjustment amount of said adjustment system and a change in coefficients of terms in a Zernike polynomial, is used to decide said optimal adjustment amounts.

17. The exposure method in claim 16 wherein
said Zernike Sensitivity Chart denotes a relation between said forming state and coefficients of terms in said Zernike polynomial.

18. The exposure method in claim 10 wherein
said optimal adjustment amounts are calculated using a weighting function that performs weighting on at least one term of a Zernike polynomial.

19. The exposure method in claim 18 wherein
said projection condition includes an illumination condition of said pattern.

20. An information storage medium that stores a program and can be read by a computer connected to an exposure apparatus that forms a pattern on an object via a projection optical system and includes an adjustment system to adjust an imaging state of the pattern, said program making said computer execute a procedure of:

deciding optimal adjustment amounts of an adjustment system, which adjusts an imaging state of a pattern by said projection optical system, under a plurality of exposure conditions that have different setting values, in at least one setting information among a plurality of setting information, related to a projection condition of a pattern subject to projection by said projection optical system to optimize said imaging state for each exposure condition, respectively, in response to input of information related to wavefront aberration of said projection optical system and a plurality of Zernike Sensitivity Charts that correspond to said plurality of exposure conditions and are different from each other, wherein exposures under said plurality of exposure conditions are performed based on said decided optimal adjustment amounts, and at least one of said plurality of Zernike Sensitivity Charts is made by interpolation calculation based on different Zernike Sensitivity Charts from said at least one Zernike Sensitivity Chart.

21. The information storage medium of claim 20 wherein
said information related to wavefront aberration is estimated from information on image forming property of said projection optical system.

22. The information storage medium of claim 20 wherein
said information related to wavefront aberration is obtained from positional information of a pattern image within an image plane of said projection optical system.

23. The information storage medium in claim 20 wherein
a restraint condition with respect to an adjustment amount of said adjustment system is used to decide said optimal adjustment amounts.

24. The information storage medium in claim 23 wherein
information related to a permissible error value of said imaging state is used to decide said optimal adjustment amounts.

25. The information storage medium in claim 24 wherein
a wavefront aberration variation table, that denotes a relation between an adjustment amount of said adjustment system and a change in coefficients of terms in a Zernike polynomial, is used to decide said optimal adjustment amounts.

26. The information storage medium in claim 25 wherein
said Zernike Sensitivity Chart denotes a relation between said forming state and coefficients of terms in said Zernike polynomial.

27. The information storage medium in claim 20 wherein
said optimal adjustment amounts are calculated using a weighting function that performs weighting on at least one term of a Zernike polynomial.

28. The information storage medium in claim 27 wherein
said projection condition includes a illumination condition of said pattern.

* * * * *